United States Patent [19]

Esposito

[11] 4,066,882
[45] Jan. 3, 1978

[54] DIGITAL STIMULUS GENERATING AND RESPONSE MEASURING MEANS

[75] Inventor: Charles M. Esposito, St. James, N.Y.

[73] Assignee: Grumman Aerospace Corporation, Bethpage, N.Y.

[21] Appl. No.: 714,561

[22] Filed: Aug. 16, 1976

[51] Int. Cl.² .................. G06F 11/00; G01R 31/28
[52] U.S. Cl. ............................. 235/302; 324/73 R
[58] Field of Search .............. 235/153 AC, 153 AK; 324/73 R

[56] References Cited

U.S. PATENT DOCUMENTS

| | | | |
|---|---|---|---|
| 3,764,995 | 10/1973 | Helf, Jr. .................. | 235/153 AC |
| 3,872,441 | 3/1975 | Cailow .................... | 235/153 AC |
| 3,927,371 | 12/1975 | Pomeranz et al. ........ | 235/153 AC |
| 3,931,506 | 1/1976 | Borrelli et al. .......... | 235/153 AC |
| 3,961,250 | 6/1976 | Snethen .................. | 324/73 R |
| 4,000,460 | 12/1976 | Kadakia et al. .......... | 324/73 R |

Primary Examiner—Charles E. Atkinson
Attorney, Agent, or Firm—Richard G. Geib; Mellor A. Gill

[57] ABSTRACT

A high-speed, real-time automatic test system element that is compatible with most contemporary computers and will interface with units under test via a front-mounted coaxial patch panel and rear exiting cables to mate with common automatic test system interconnection schemes whereby a language driver callable with programming statements enables dynamic digital testing of modern integrated circuit cards and chassis at their normal clock rates and provides a digital reading of GO/NO-GO test evaluations.

36 Claims, 94 Drawing Figures (FIG.10a)
INPUT/OUTPUT
INTERFACE (FIG.10b)
DECODING & INSTRUCTING (FIG.10c)
TIMING SEQUENCER
LOGIC (FIG.10e)
INPUT
DATA
BUFFER (FIG.10f)
OUTPUT
BUFFER (FIG.10g)
TIMING PULSE
MATCHING
NETWORK (FIG.10d)
"X" COUNTER
& CONTROL LOGIC (FIG.10h)
DATA
OUTPUT LAYOUT OF MULTISHEET FIGURE 10
(ALIGN ARROWS ▷ ON SHEETS
WITH CORRESPONDING NOTATION)

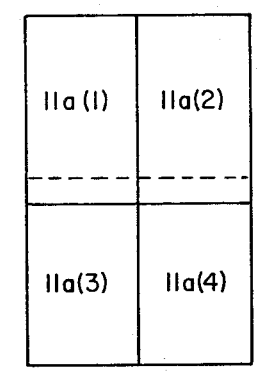
(FIG.11a)
INPUT LOGIC
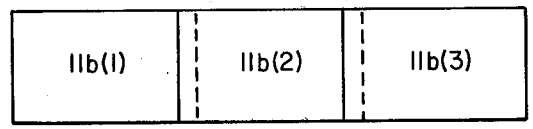
(FIG.11b)
CLOCK GENERATOR
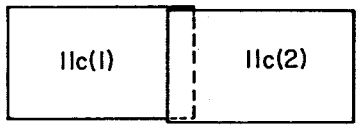
(FIG.11c)
TEST LENGTH COUNTER
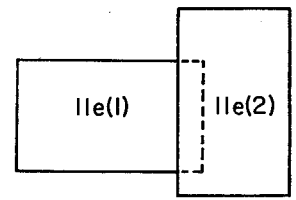
(FIG.11e)
INCREMENT/LOAD PATTERN COUNTER
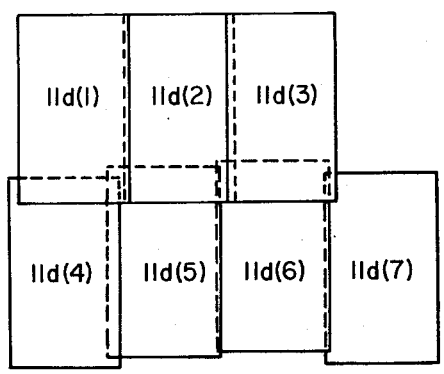
(FIG.11d)
EXECUTE
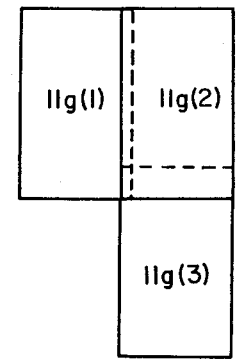
(FIG.11g)
STROBE GENERATOR
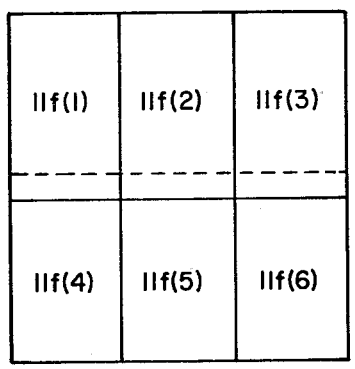
(FIG.11f)
OUTPUT GATES
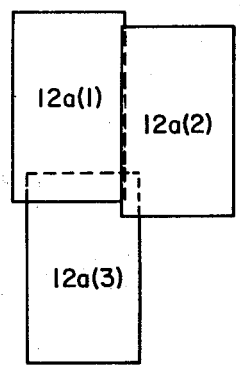
(FIG.12a)
INPUT/OUTPUT
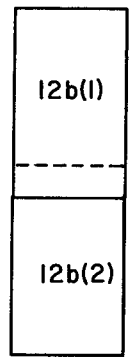
(FIG.12b)
INSTRUCTIONS
FIG.9A
LAYOUT OF MULTISHEET FIGURES 11 AND 12
(ALIGN ARROWS ▷ ON SHEETS WITH CORRESPONDING NOTATION)
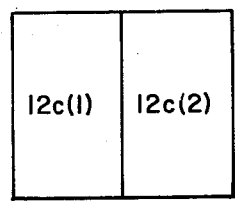
(FIG.12c)
TYPICAL MEMORY CIRCUIT

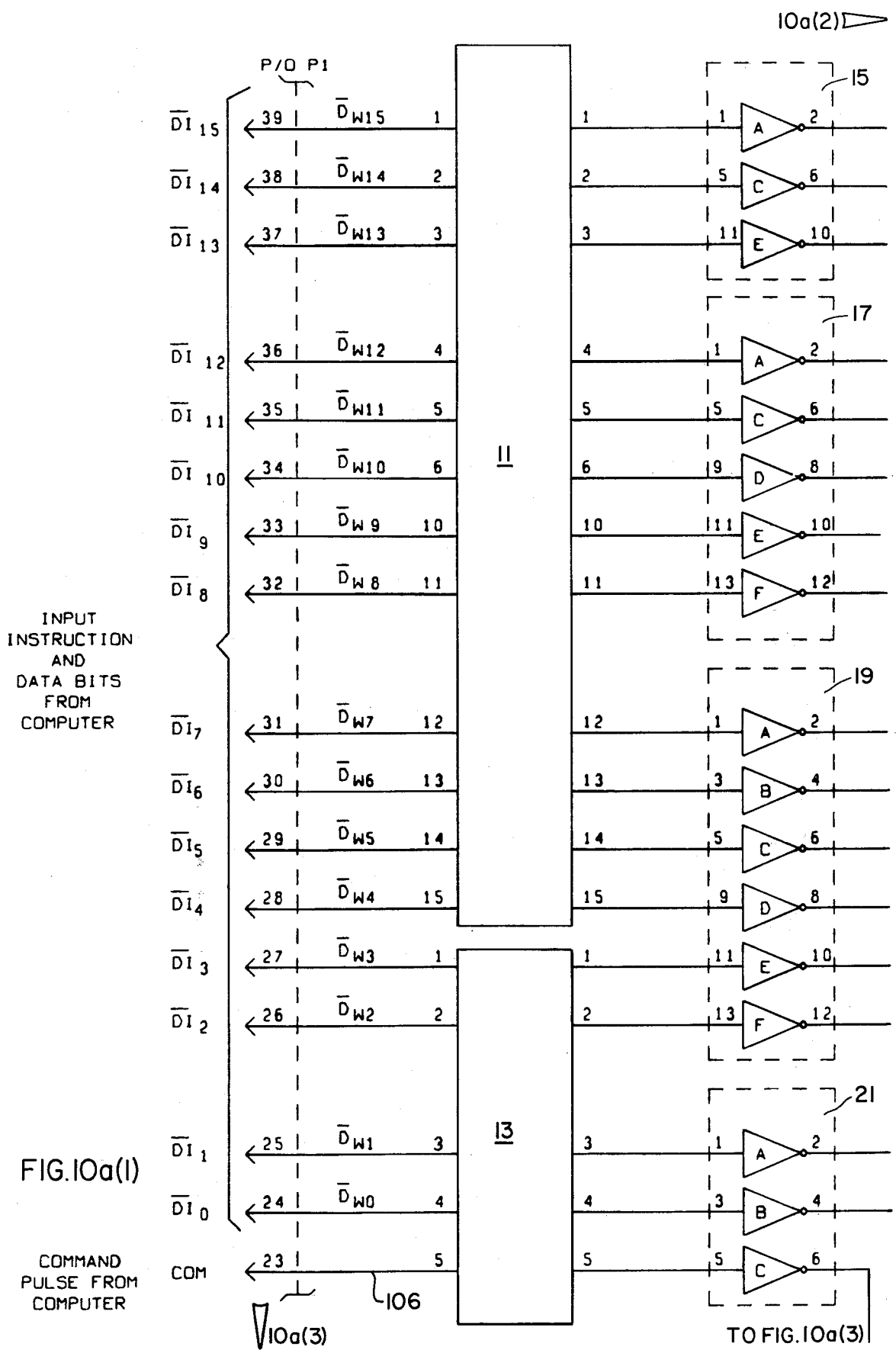
FIG.10a(1)

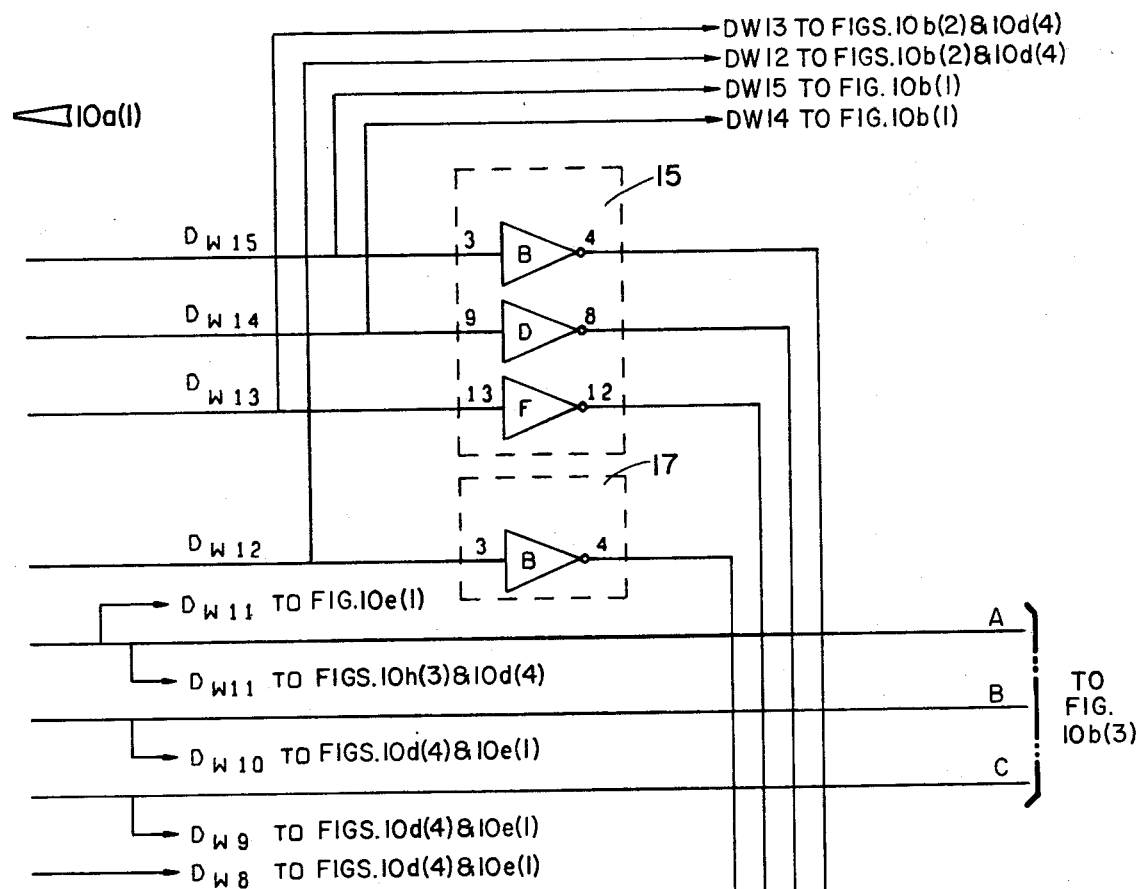
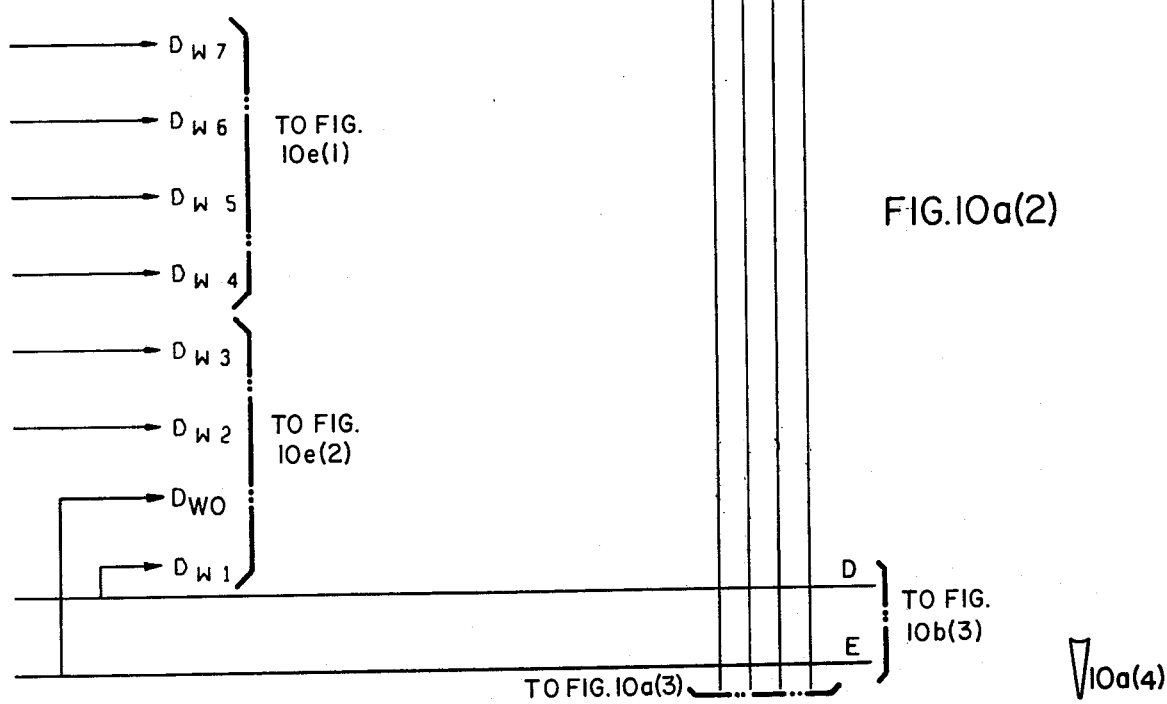
FIG.10a(2)

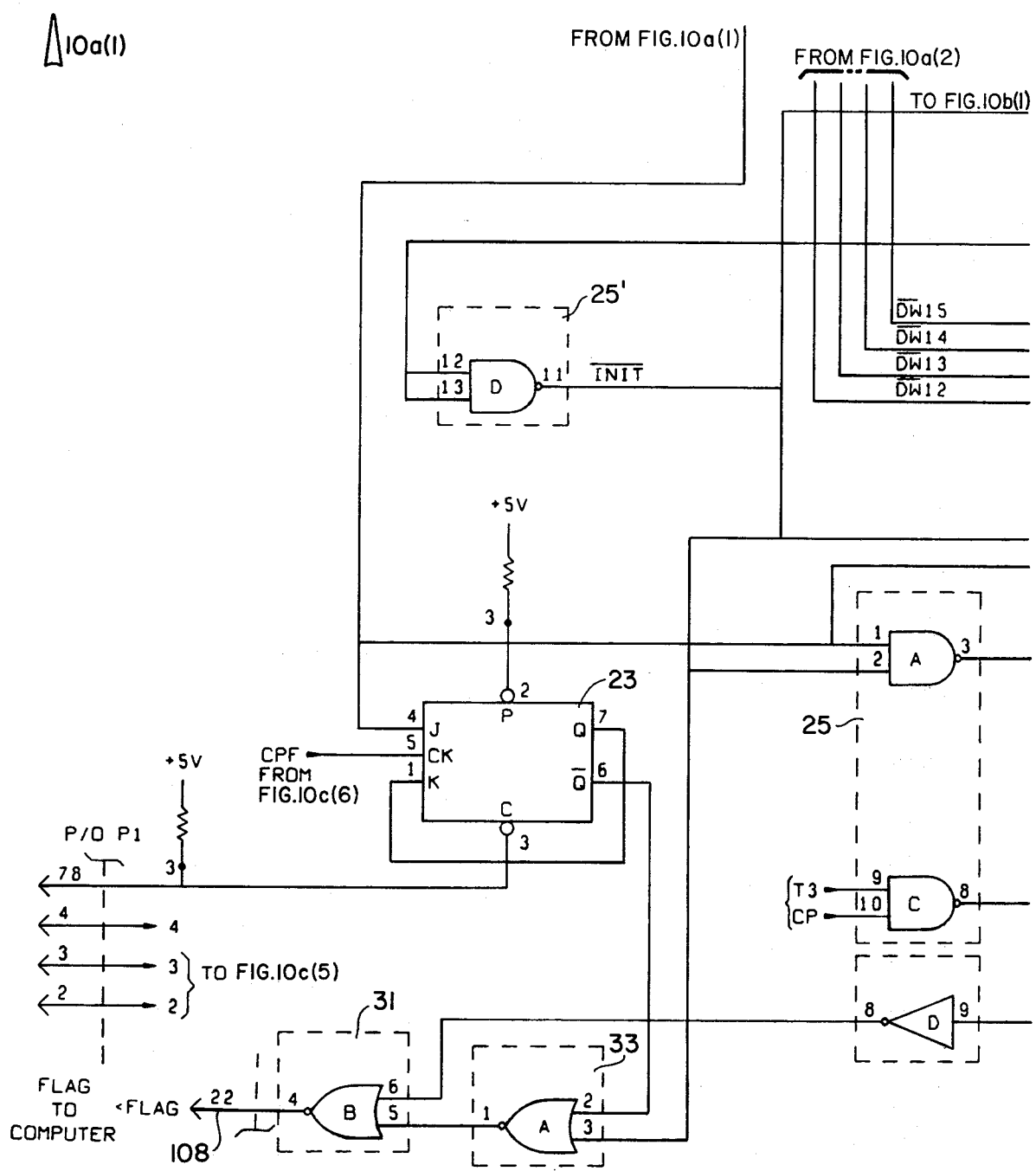
FIG.10a(3)

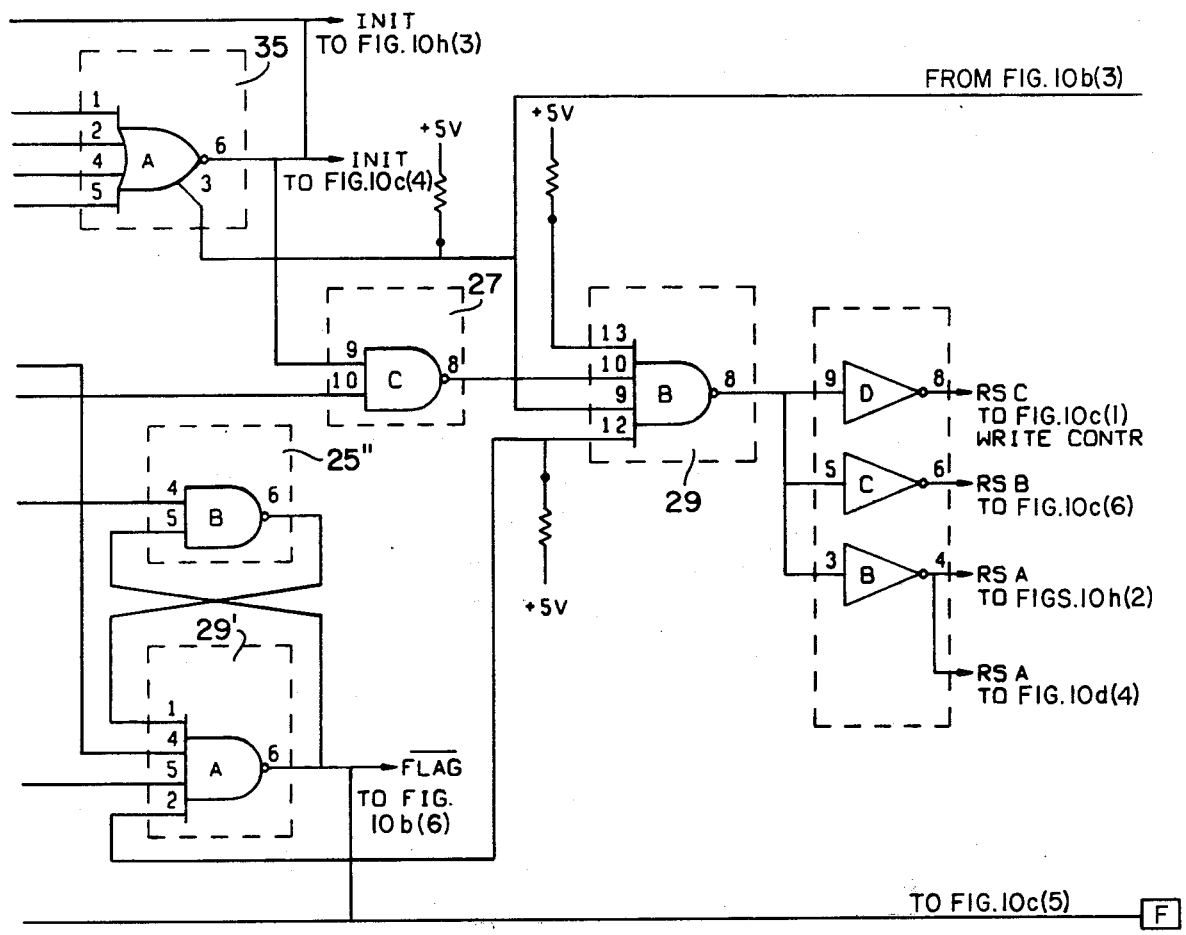
FIG.10a(4)

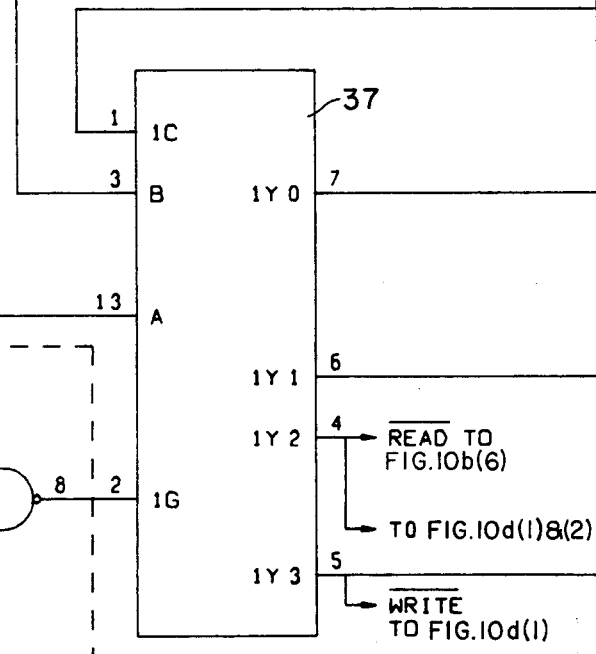
FIG.10b(1)

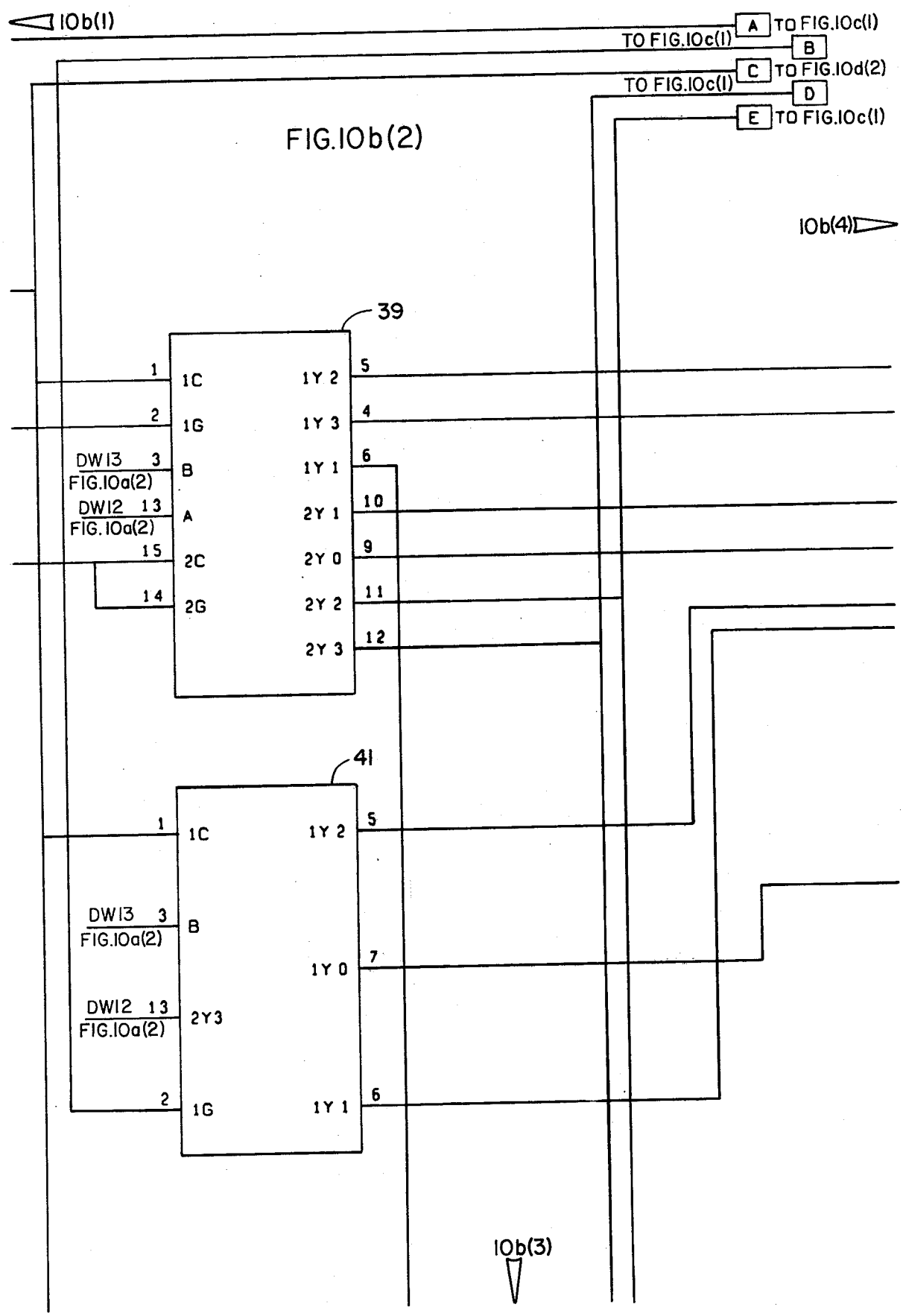

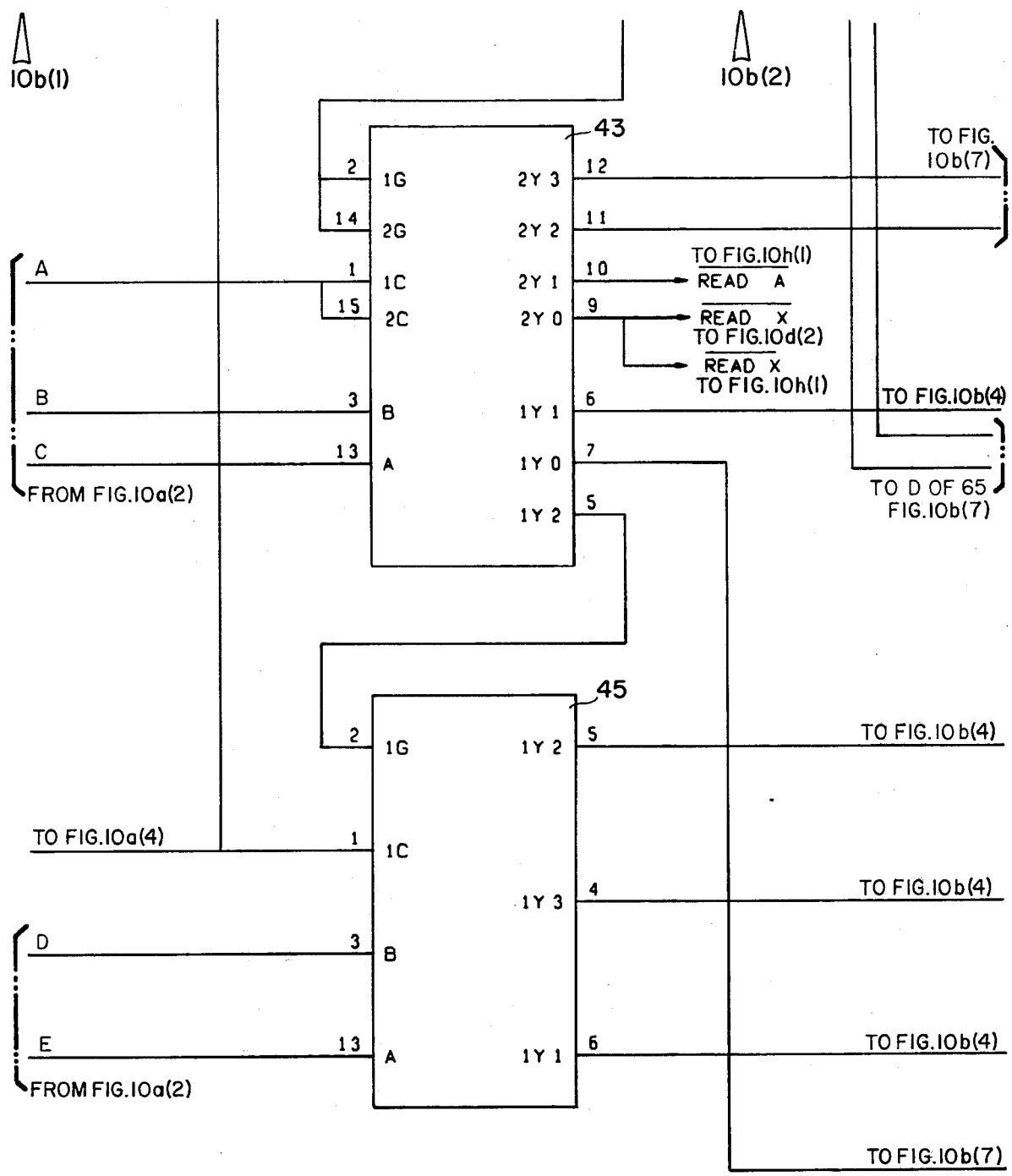
FIG.10b(3)

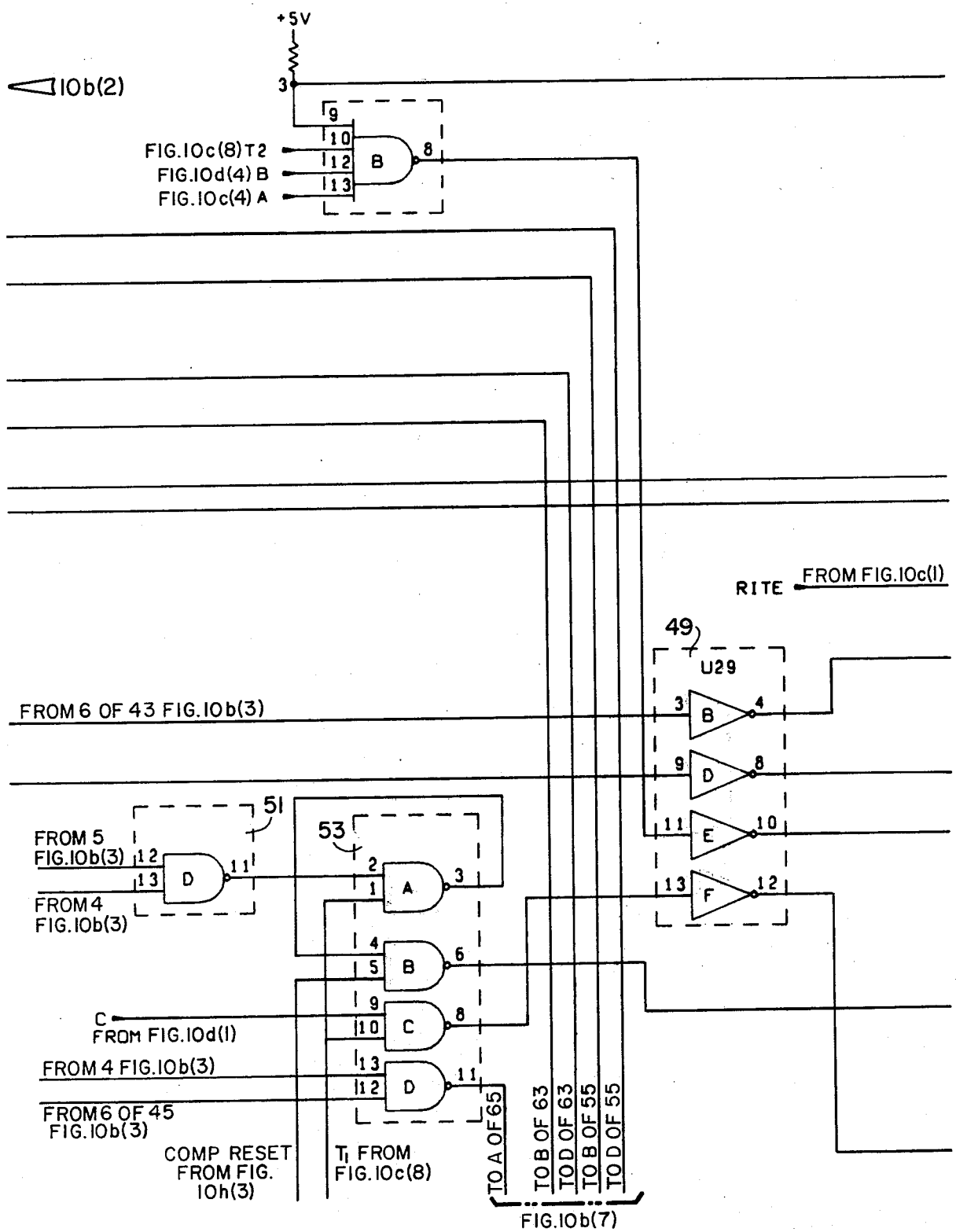

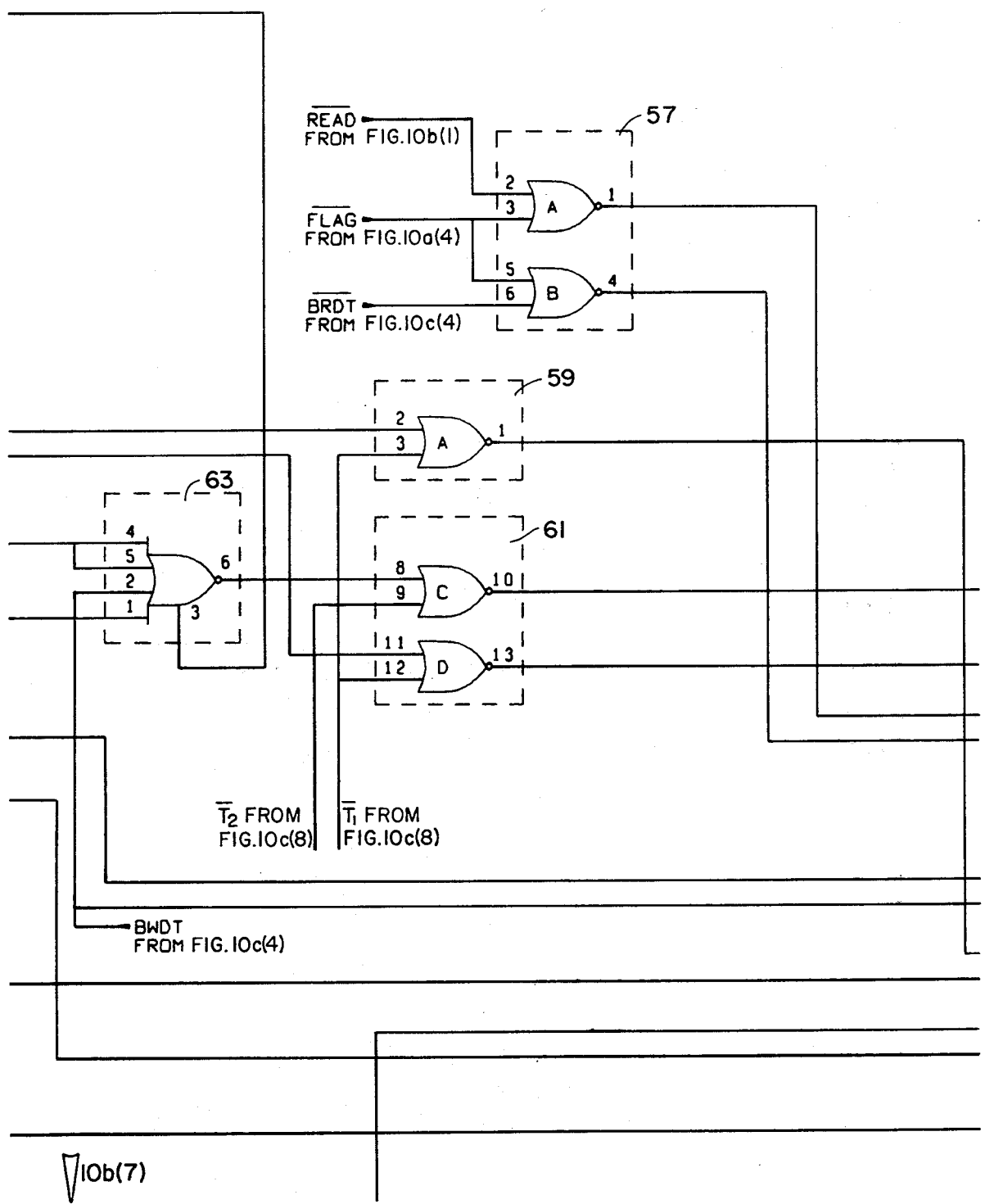
FIG.10b(6)

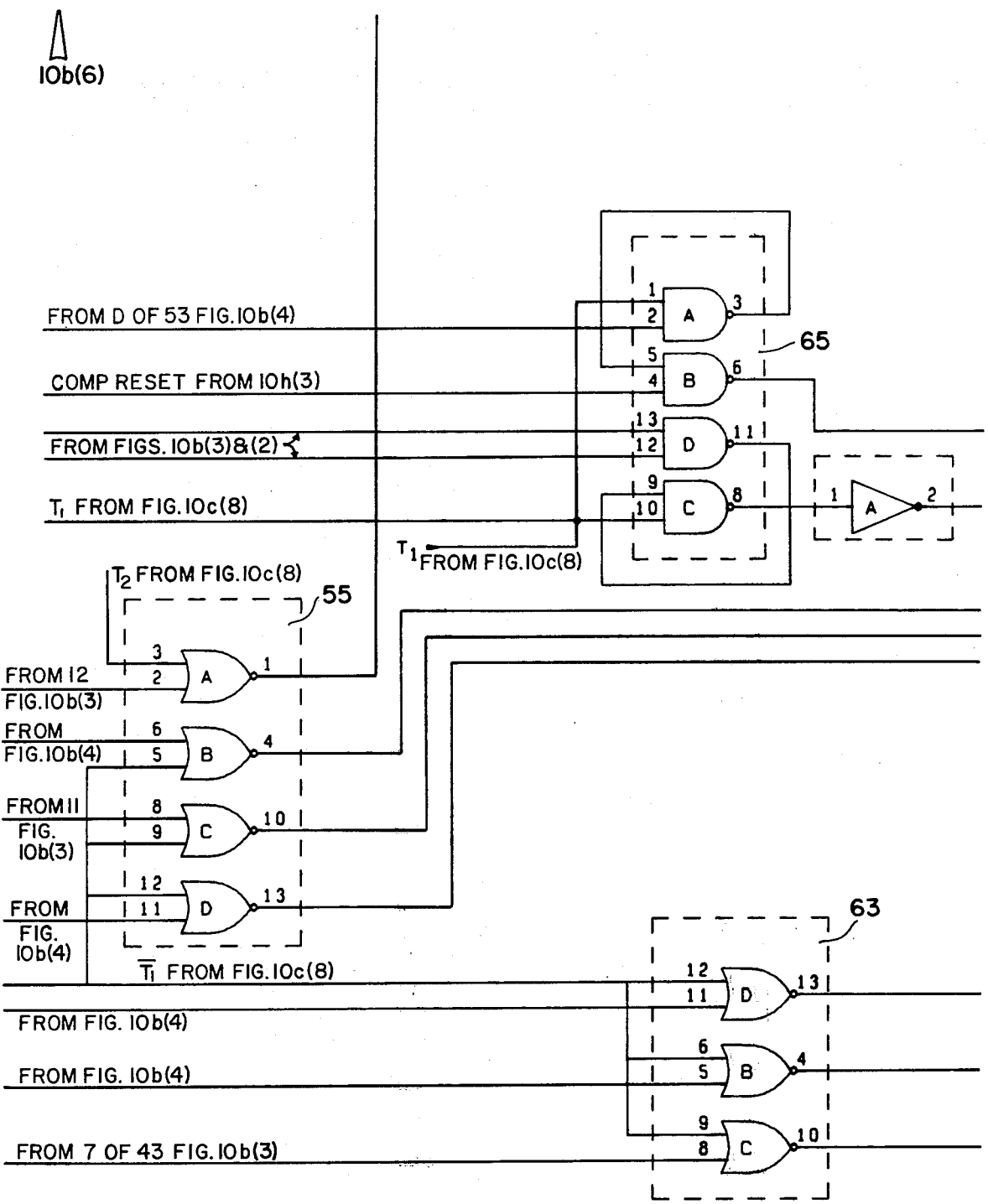

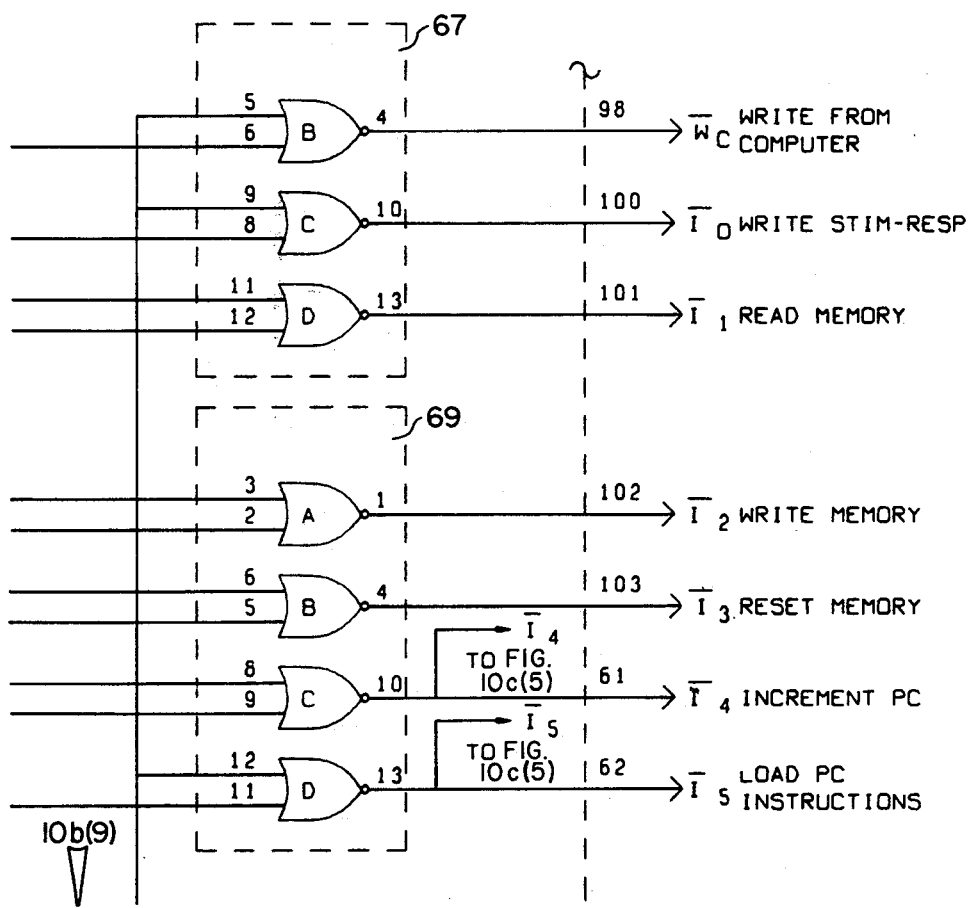
FIG.10b(8)

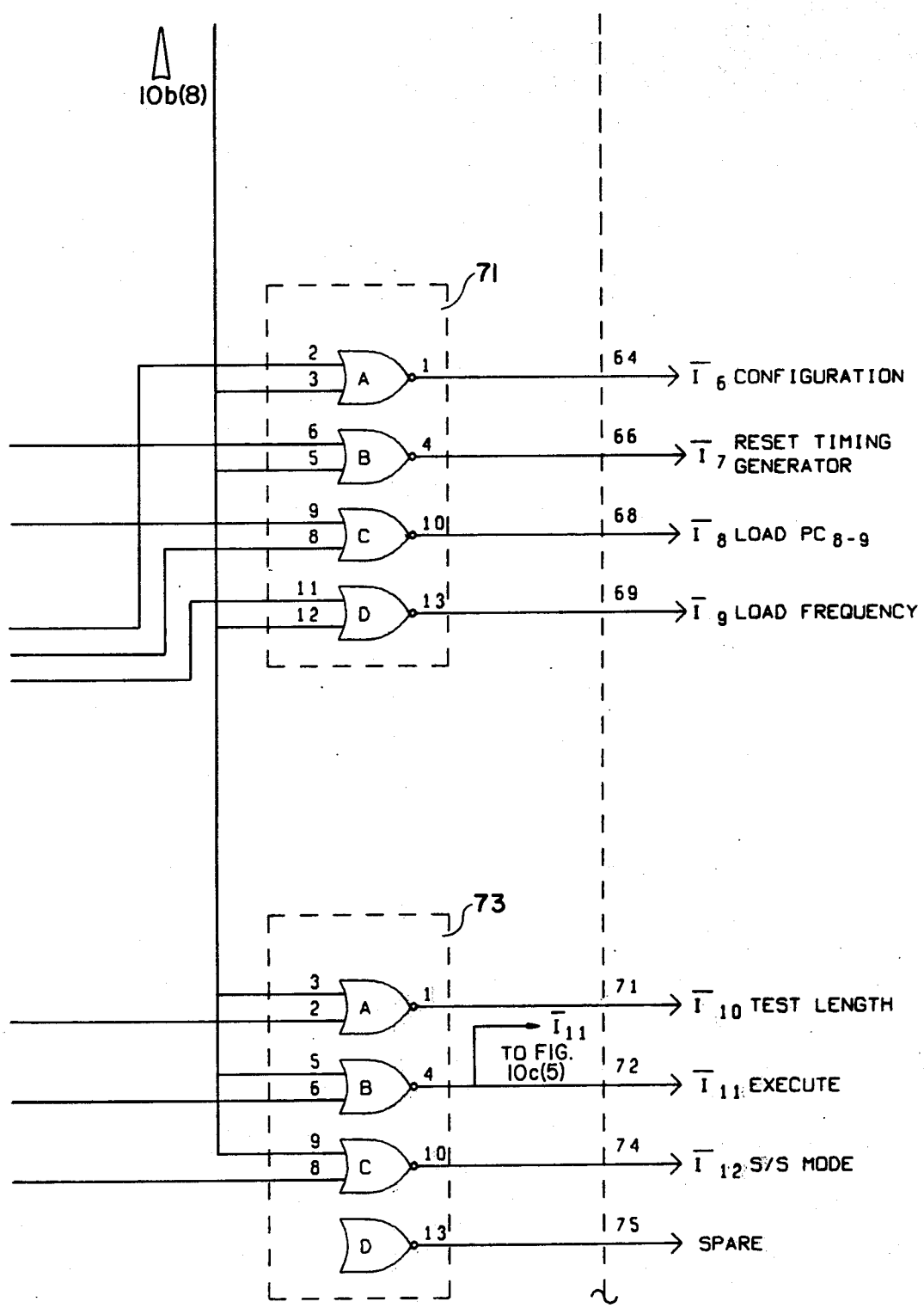
FIG.10b(9)

FIG.10c(1)
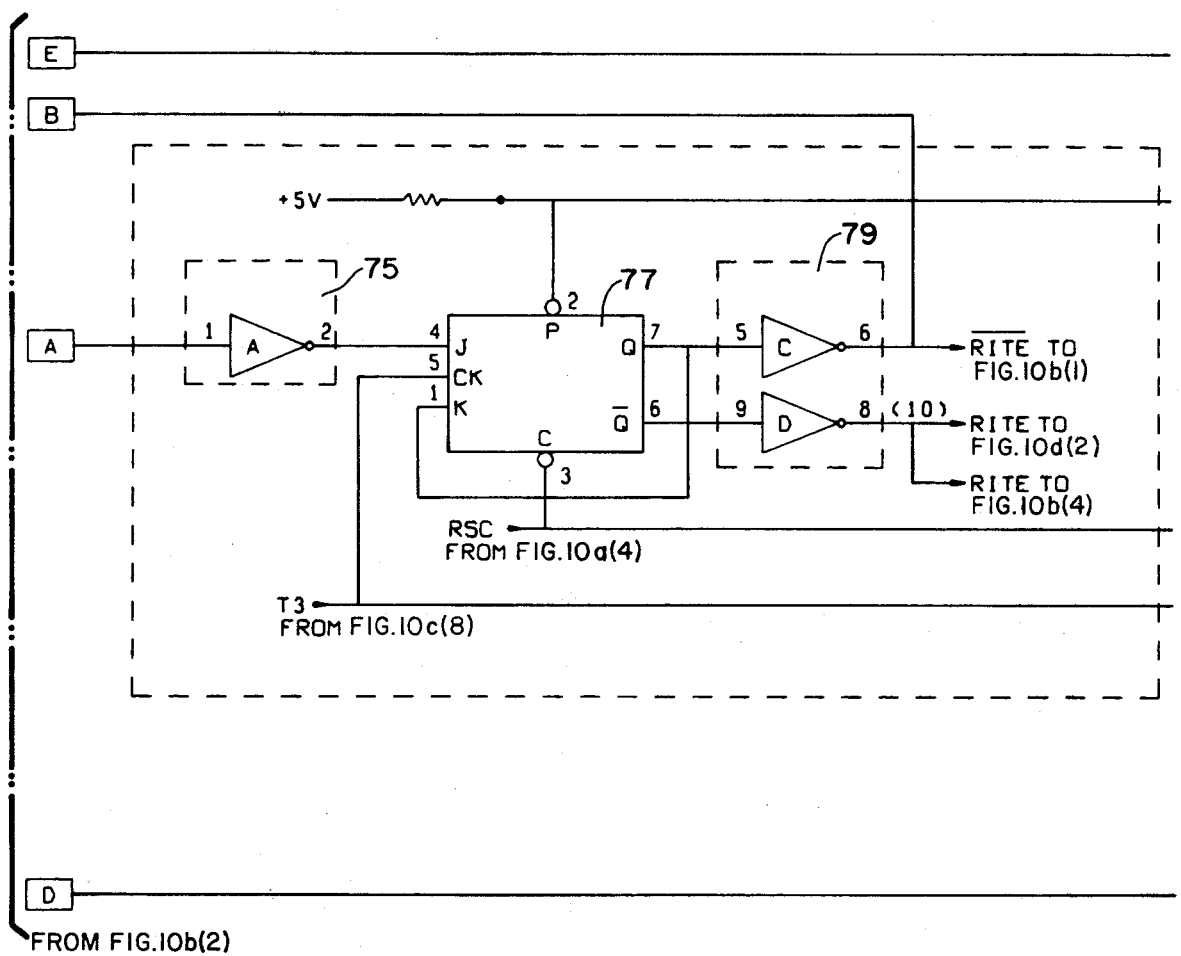

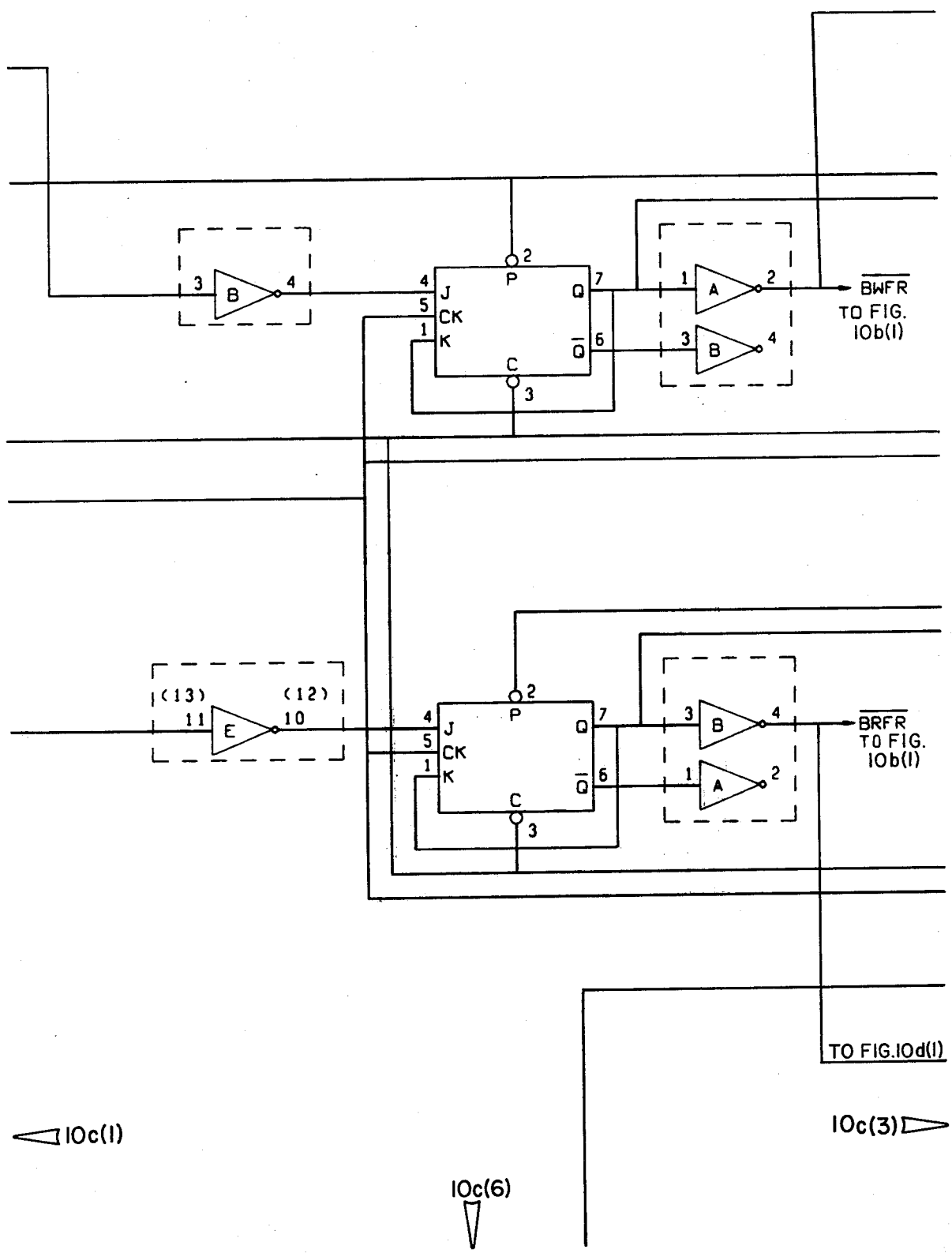
FIG.10c(2)

FIG. 10c(3)
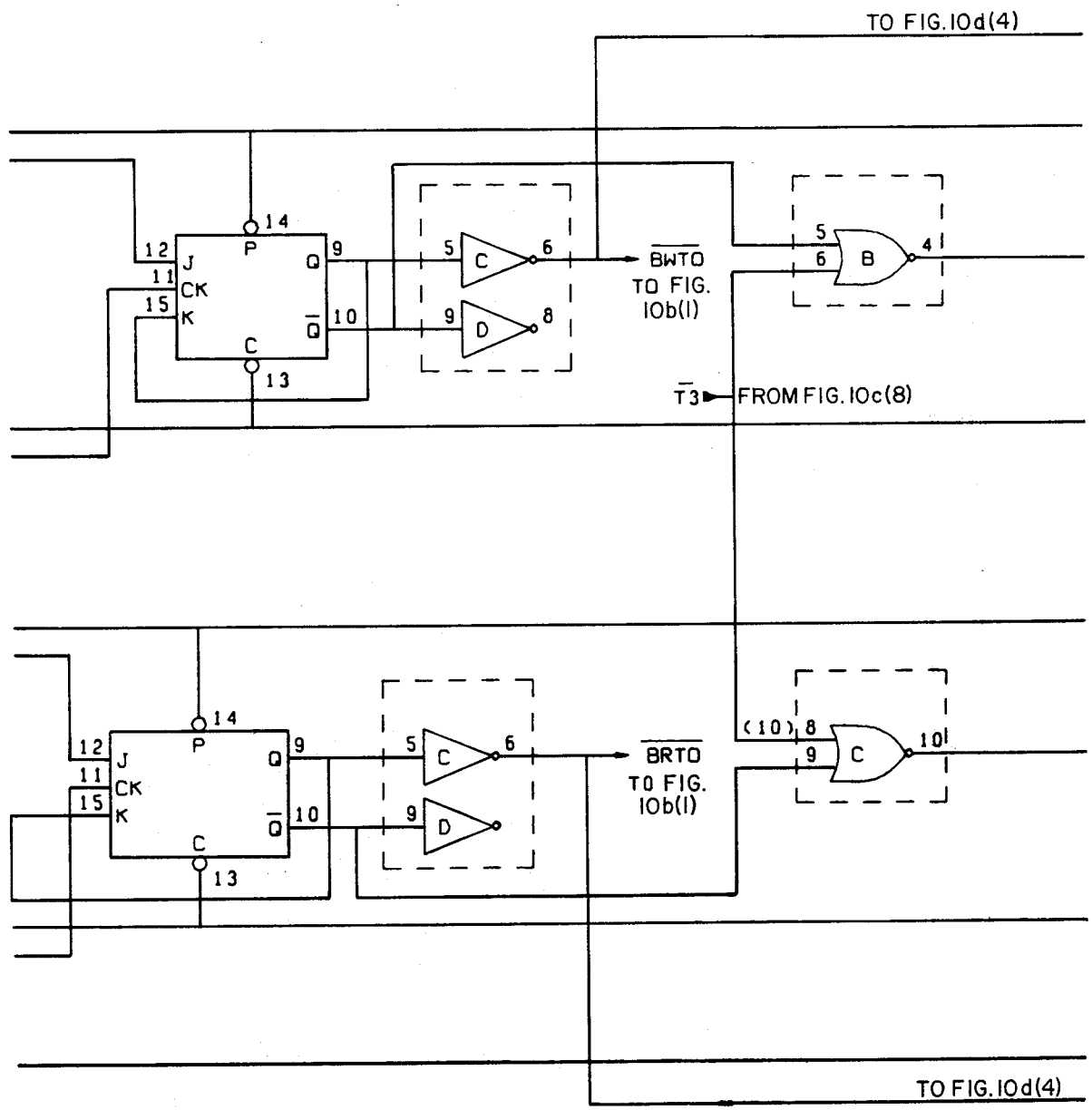

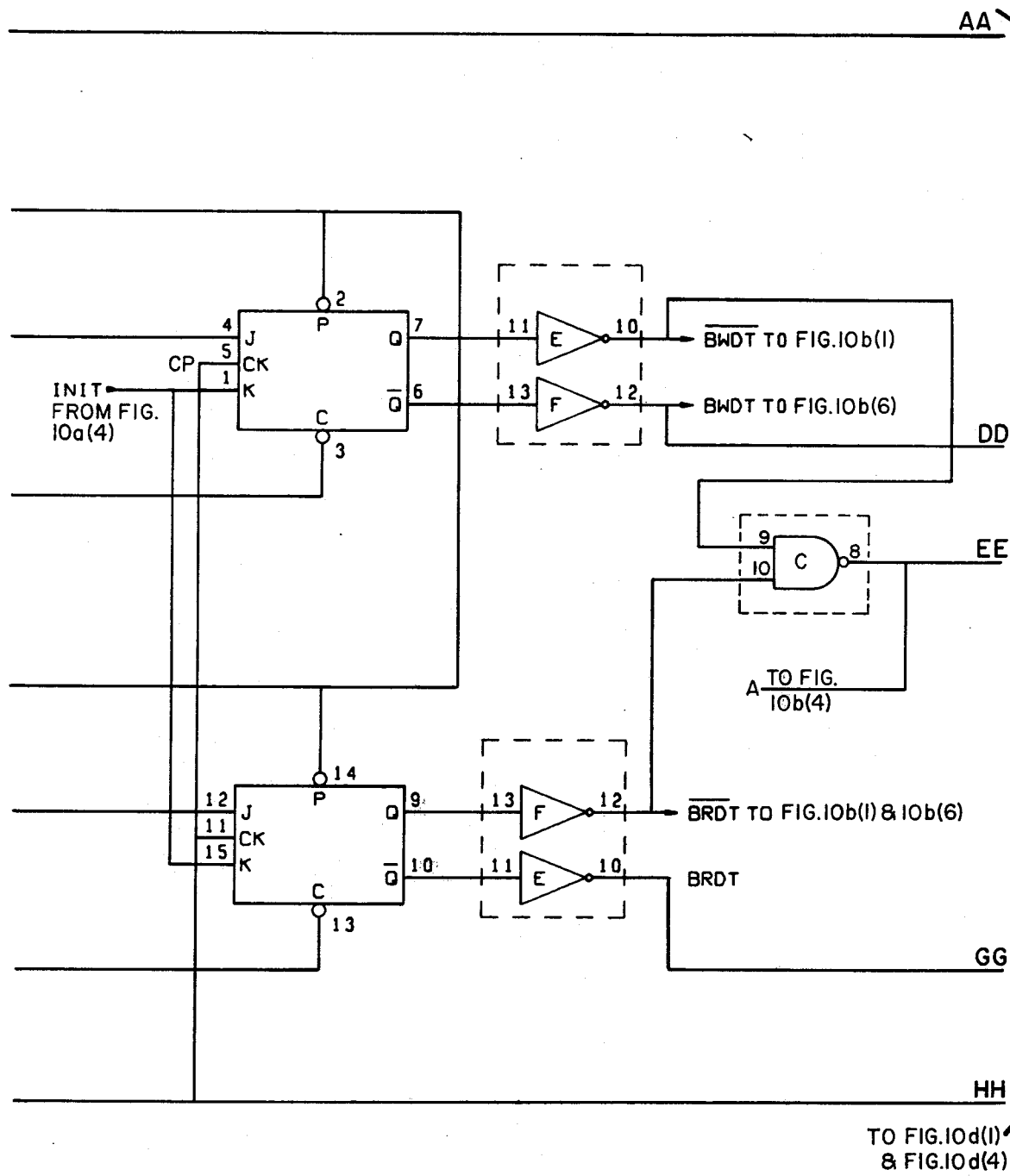
FIG.10c(4)

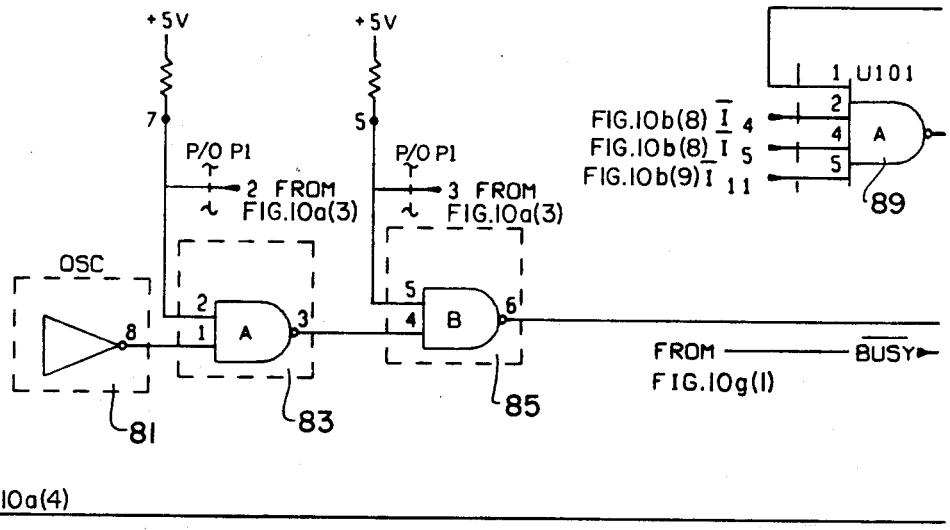
FIG.10c(5)

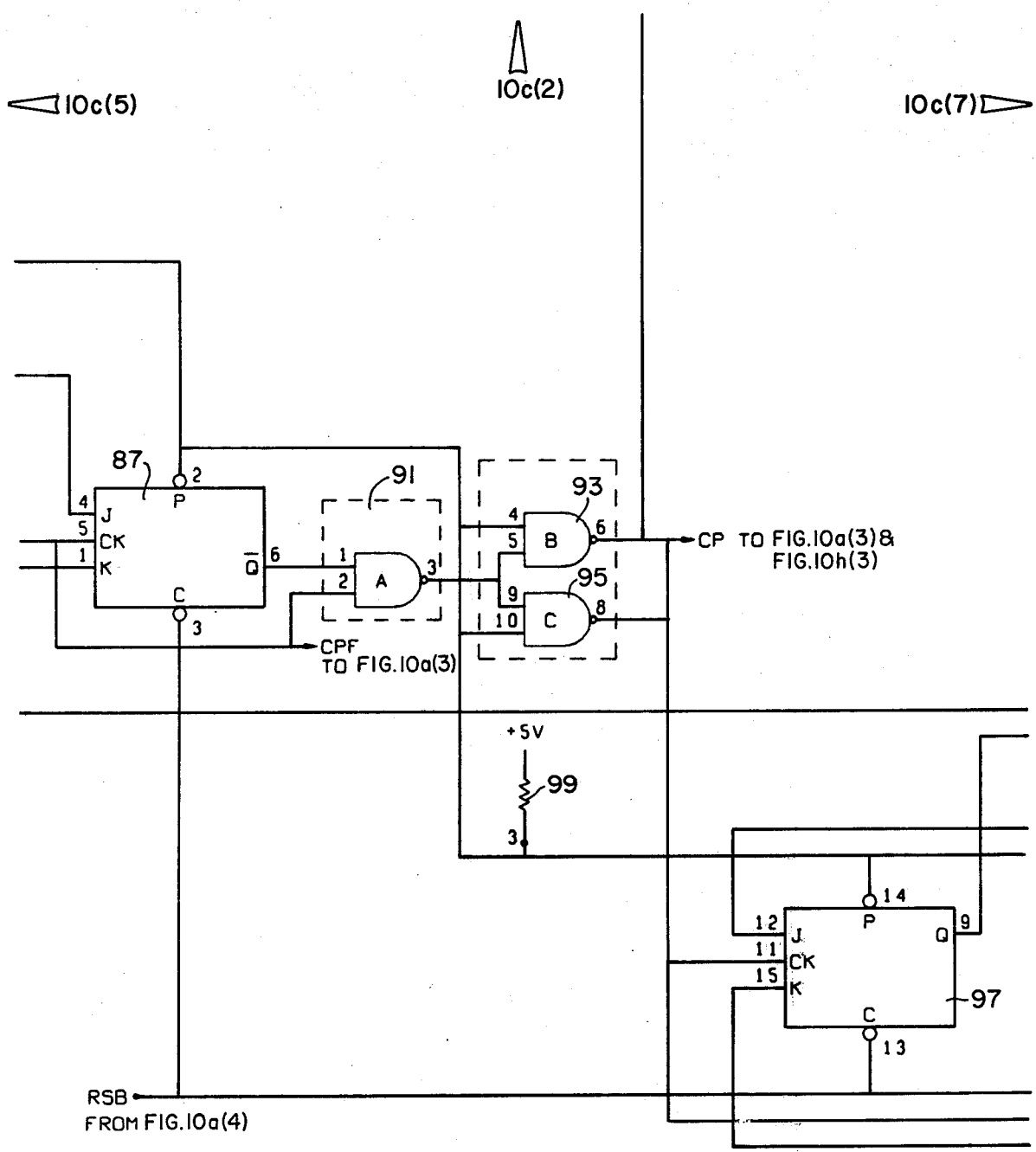
FIG.10c(6)

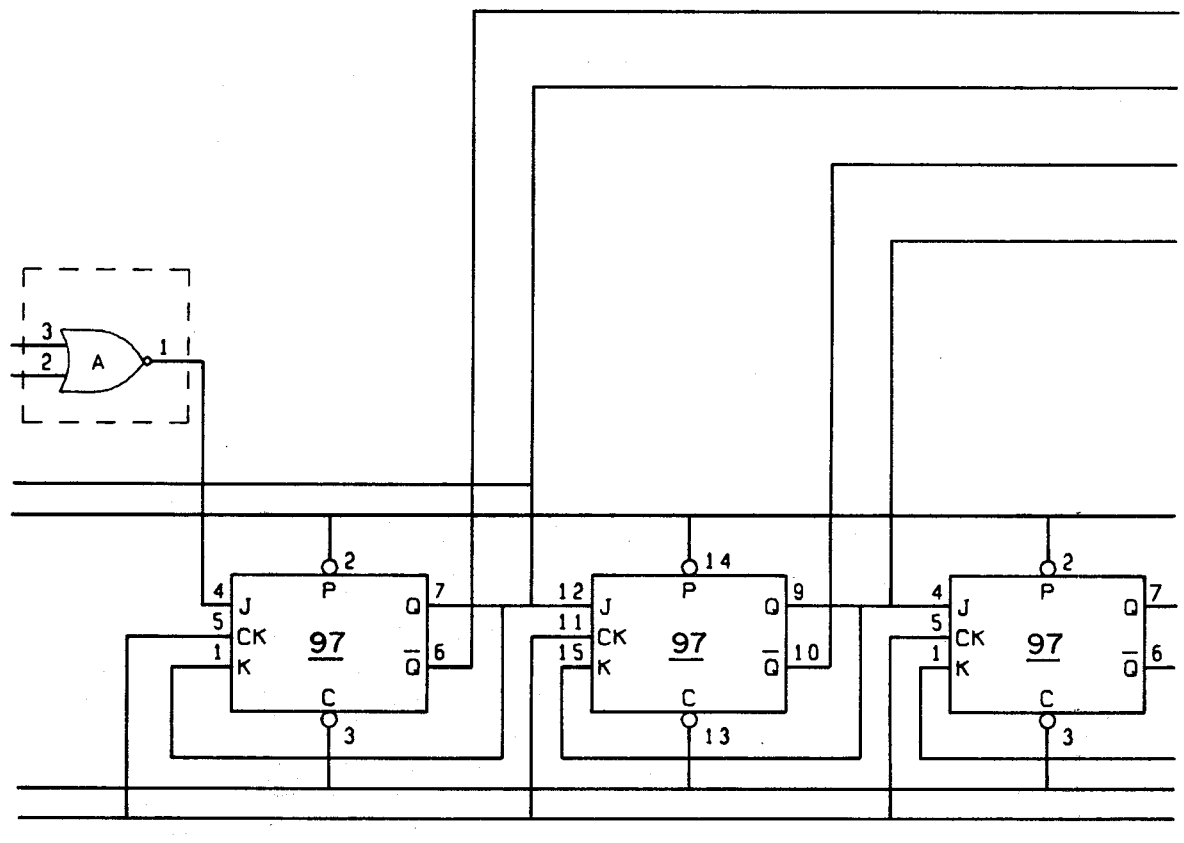
FIG.10c(7)

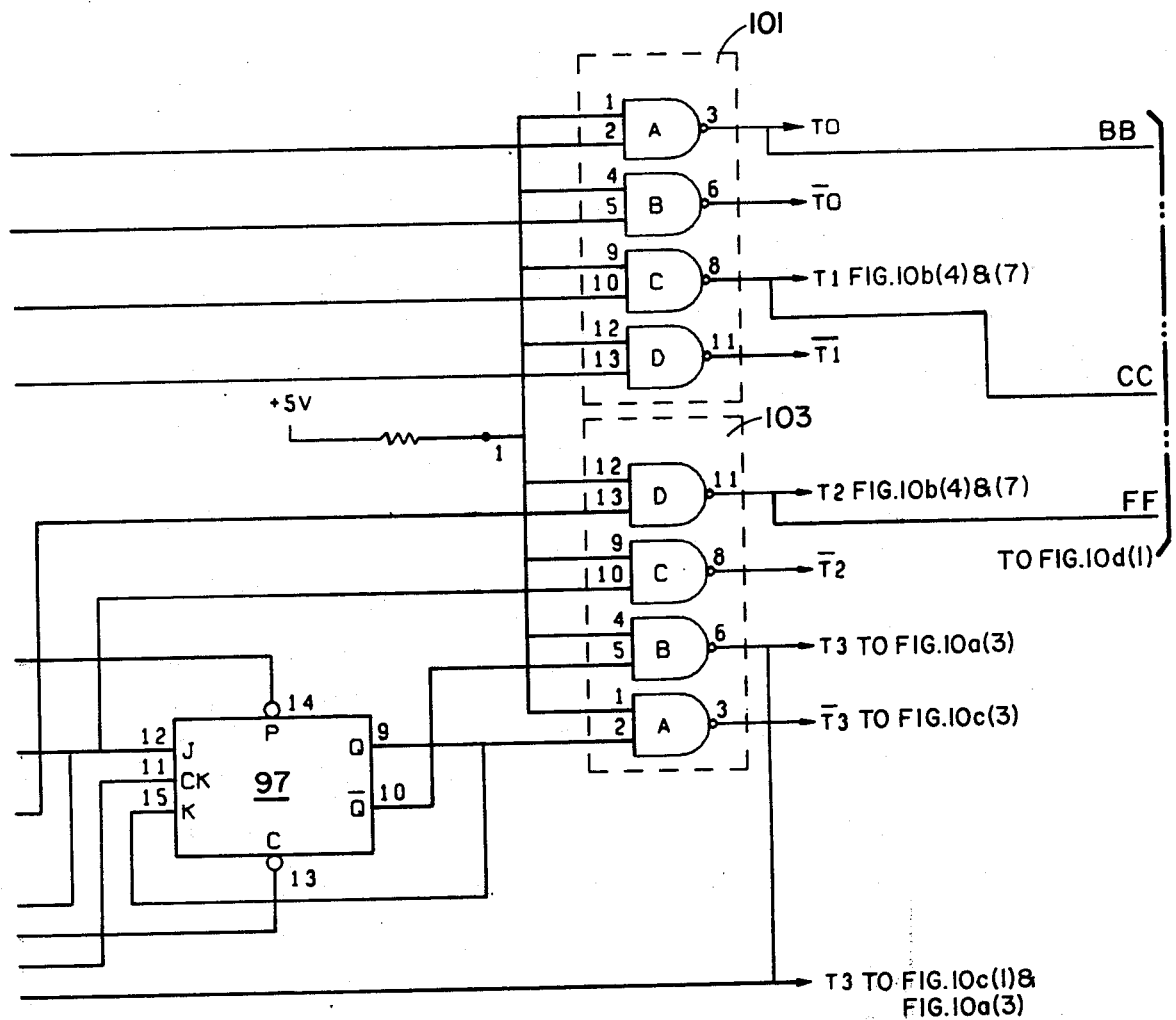
FIG.10c(8)

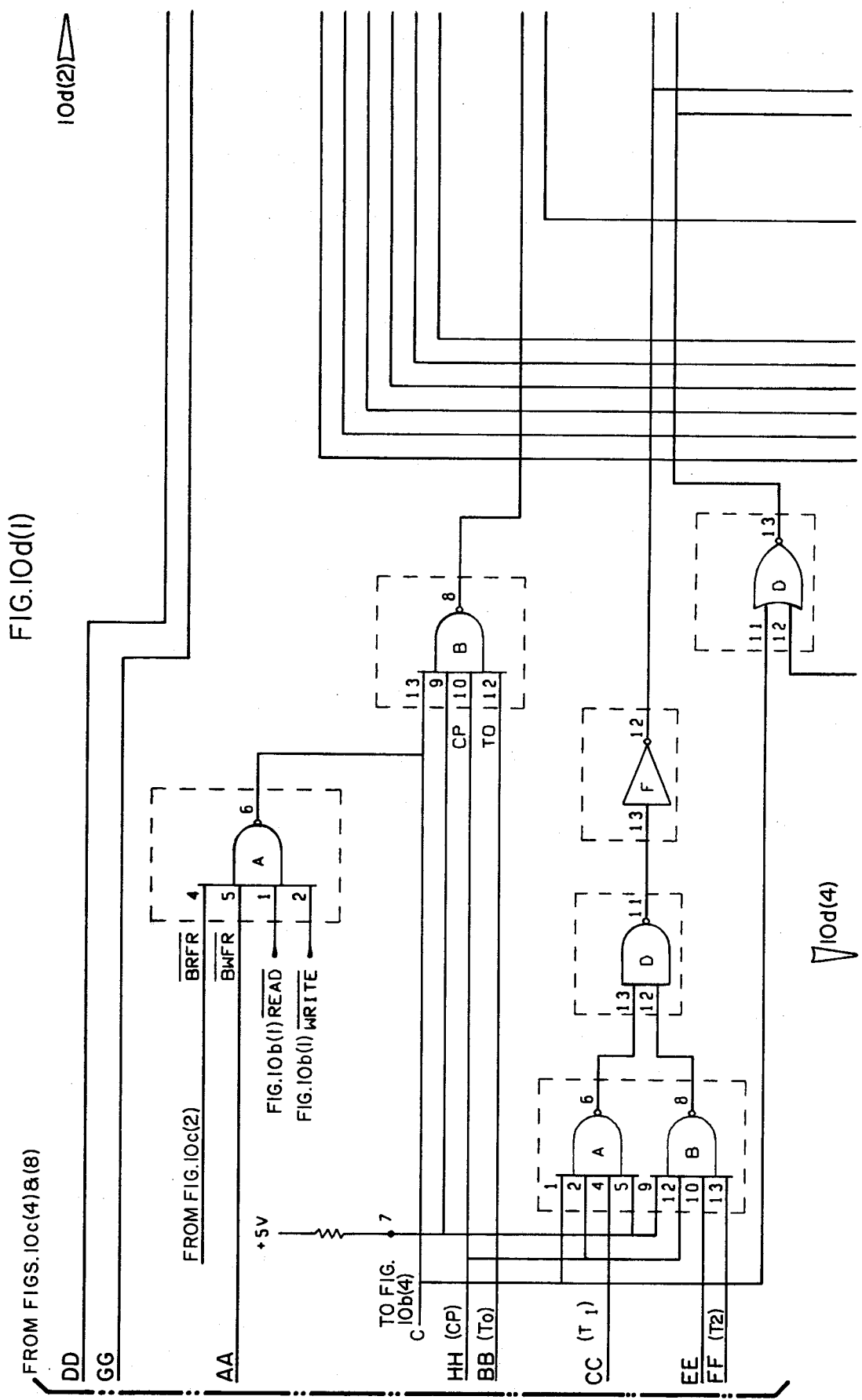

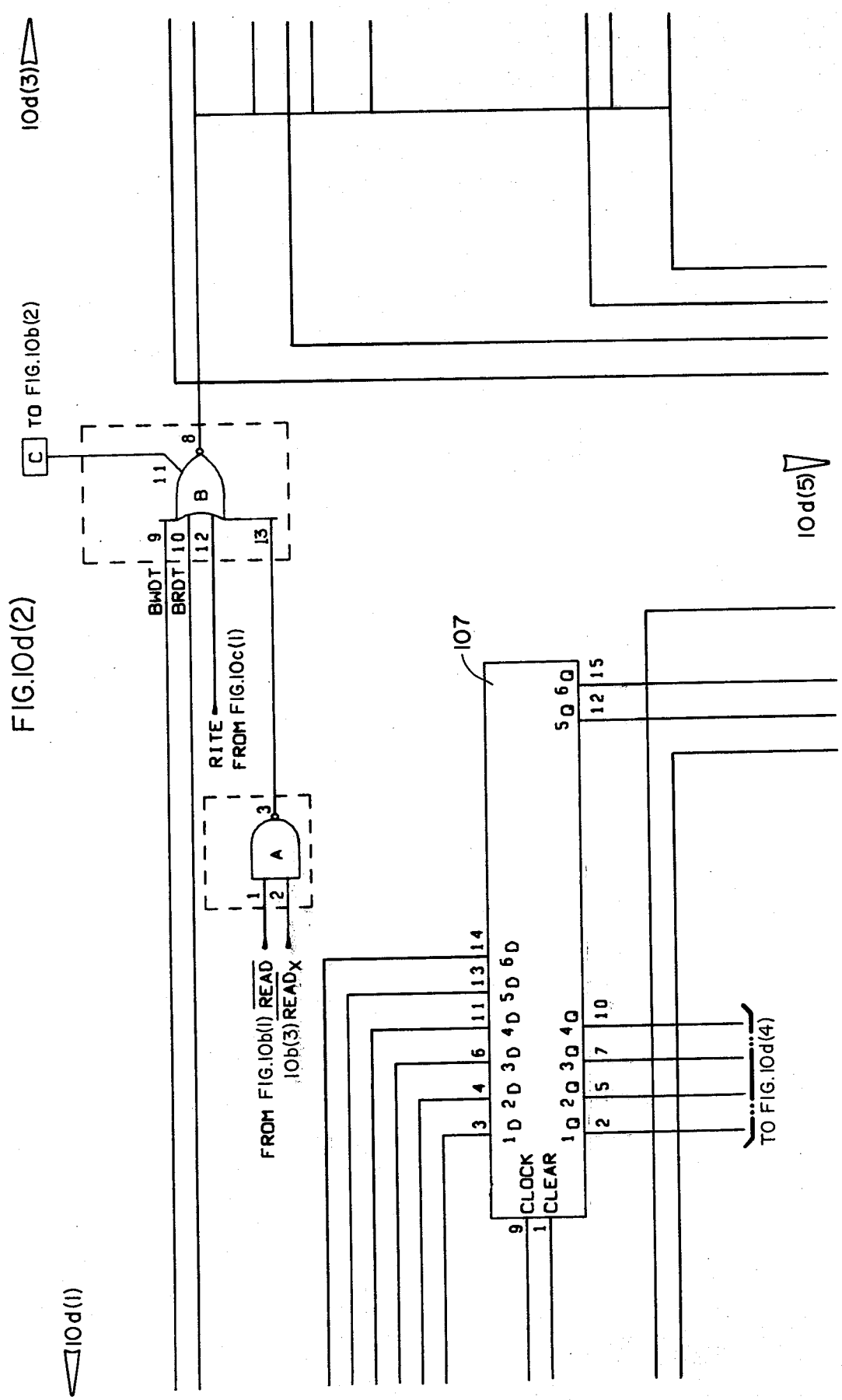
FIG.10d(2)

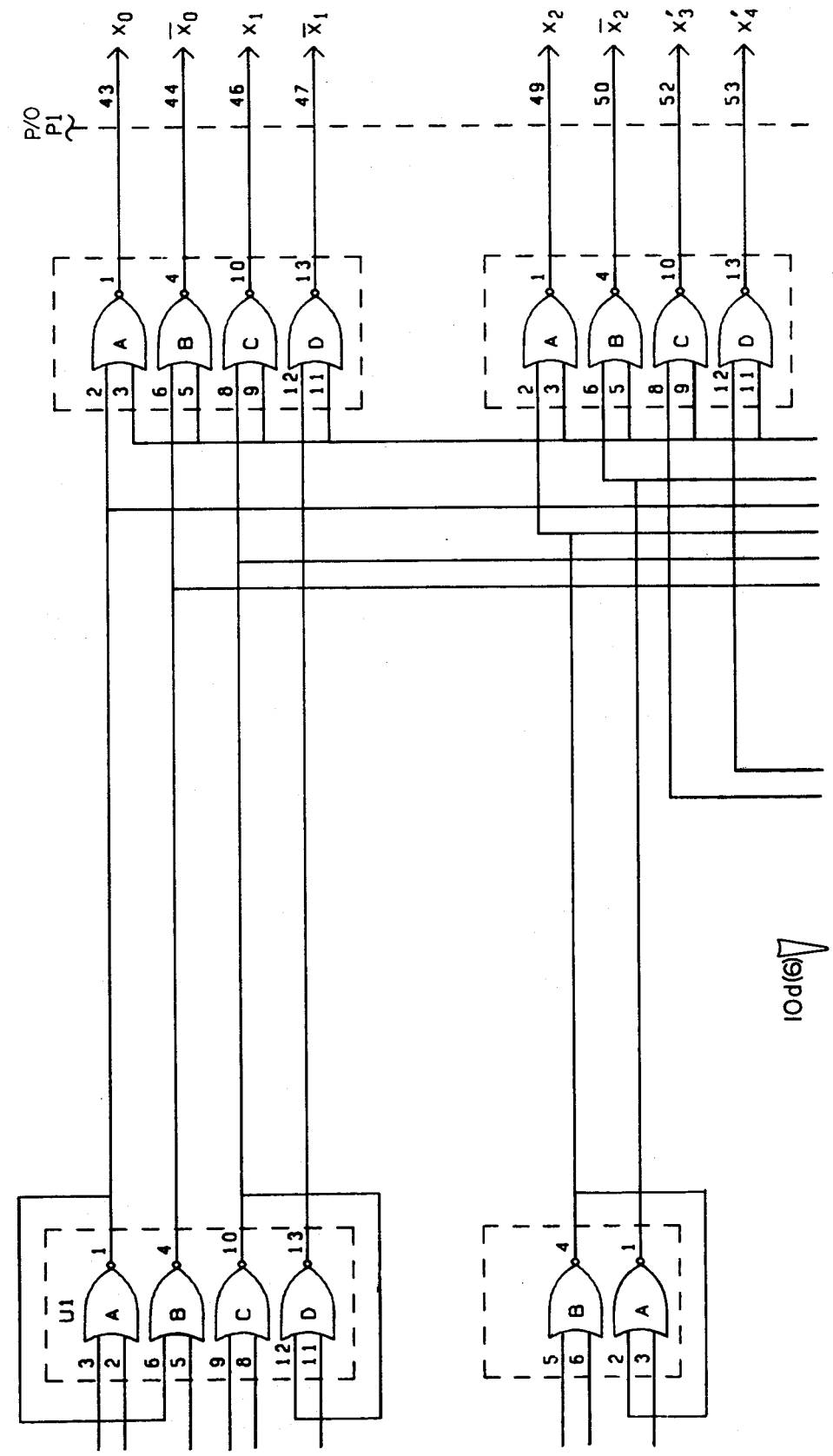
FIG.IOd(3)

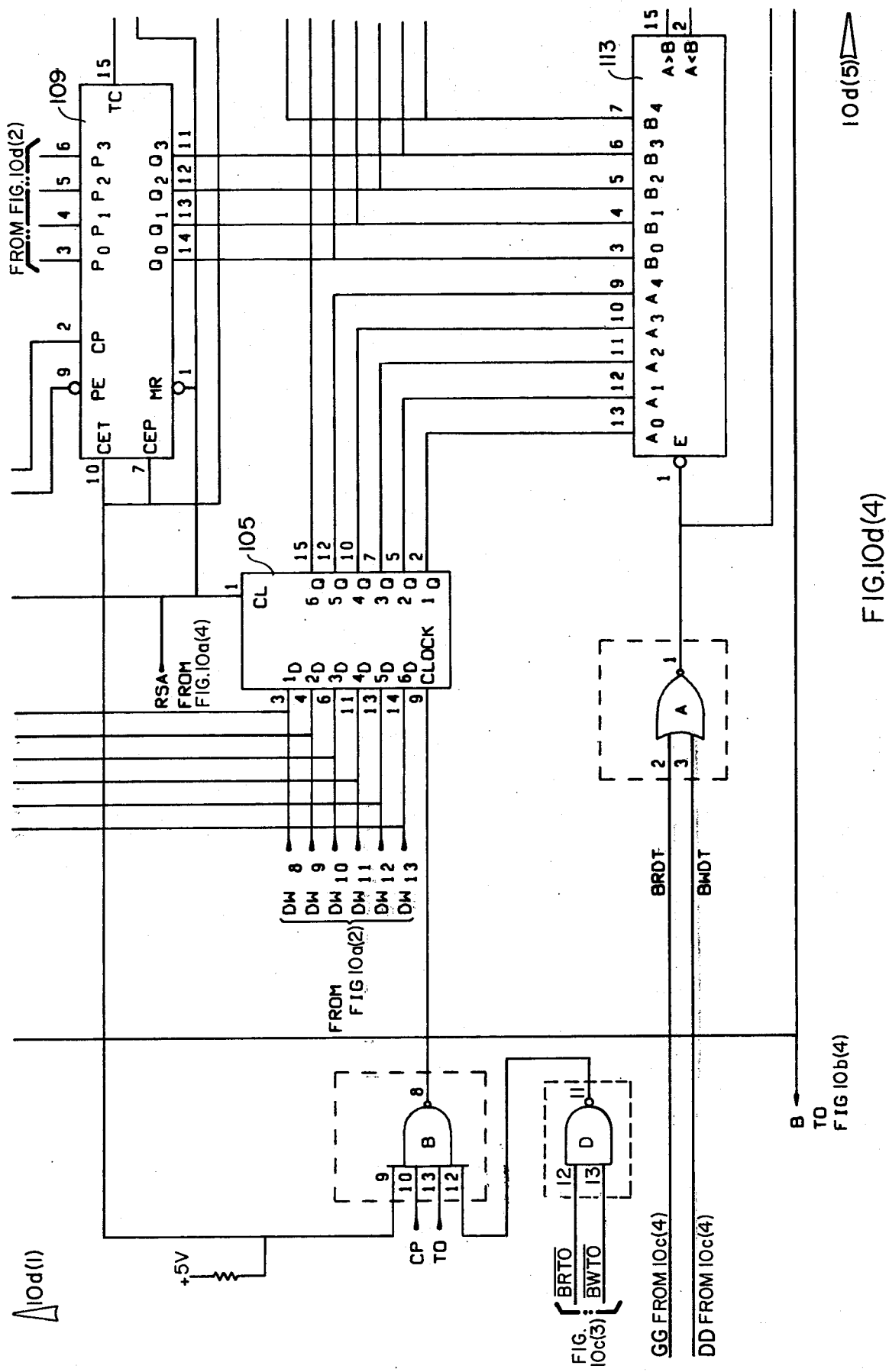
FIG.10d(4)

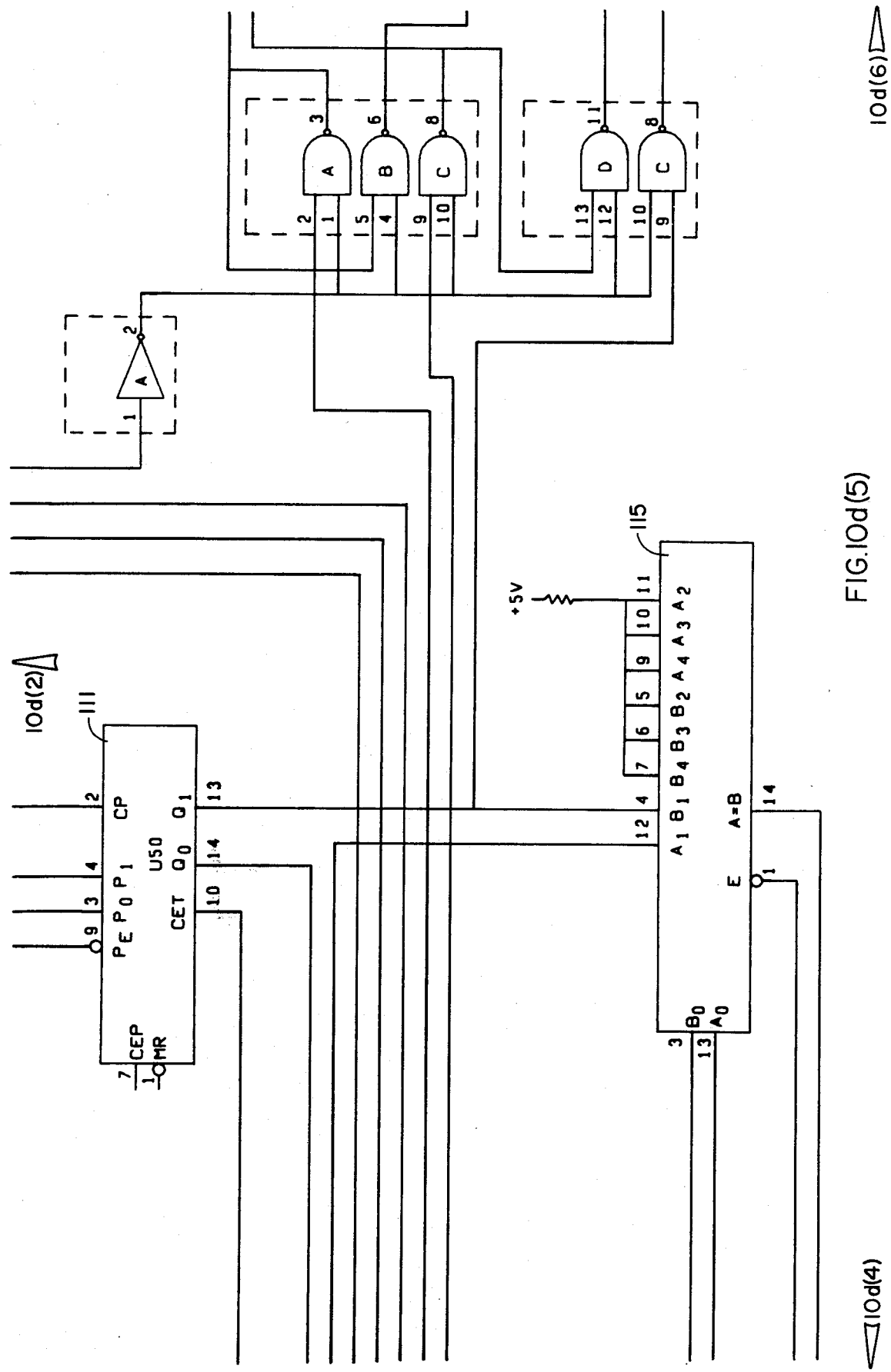
FIG.IOd(5)

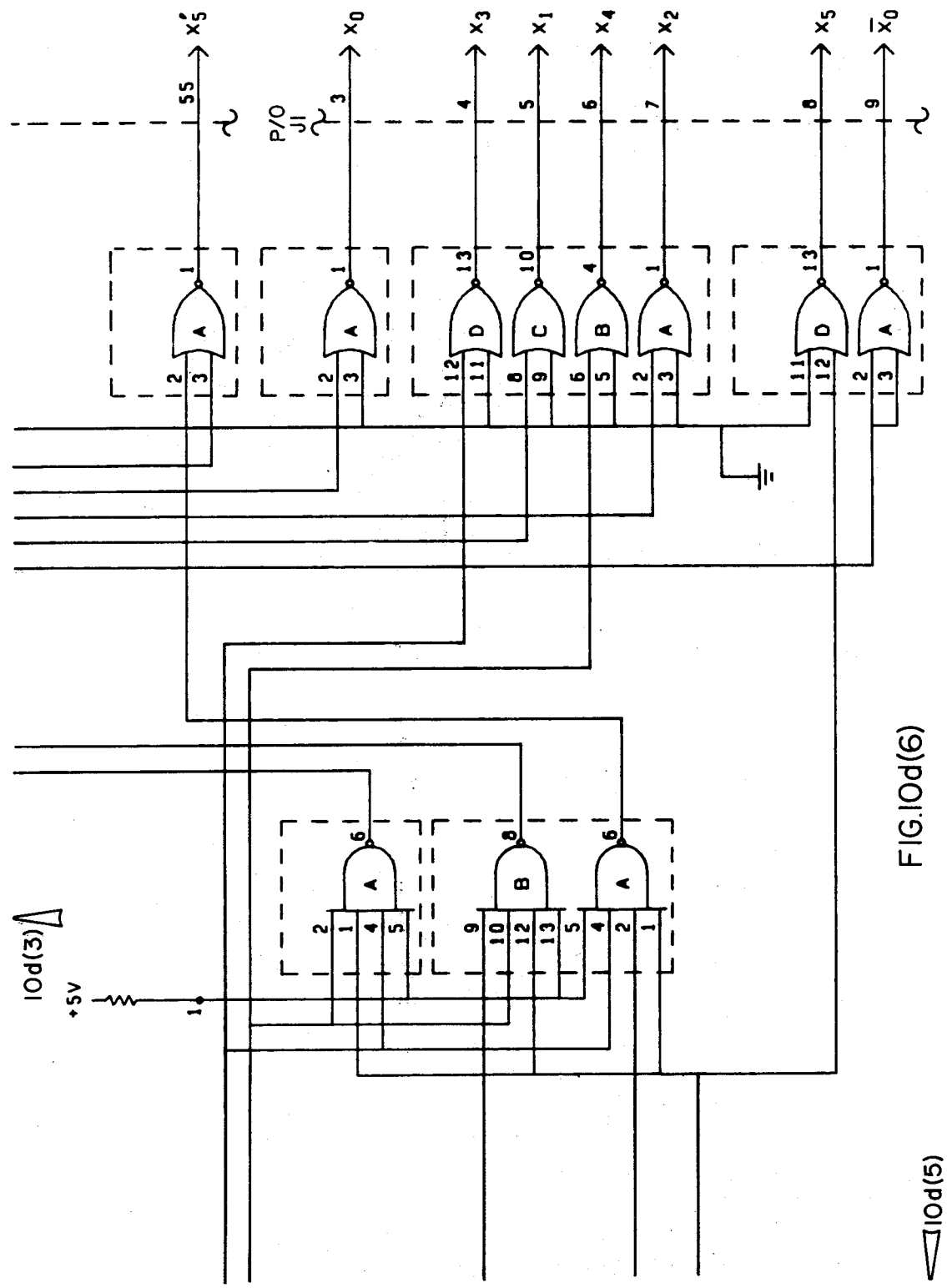
FIG.10d(6)

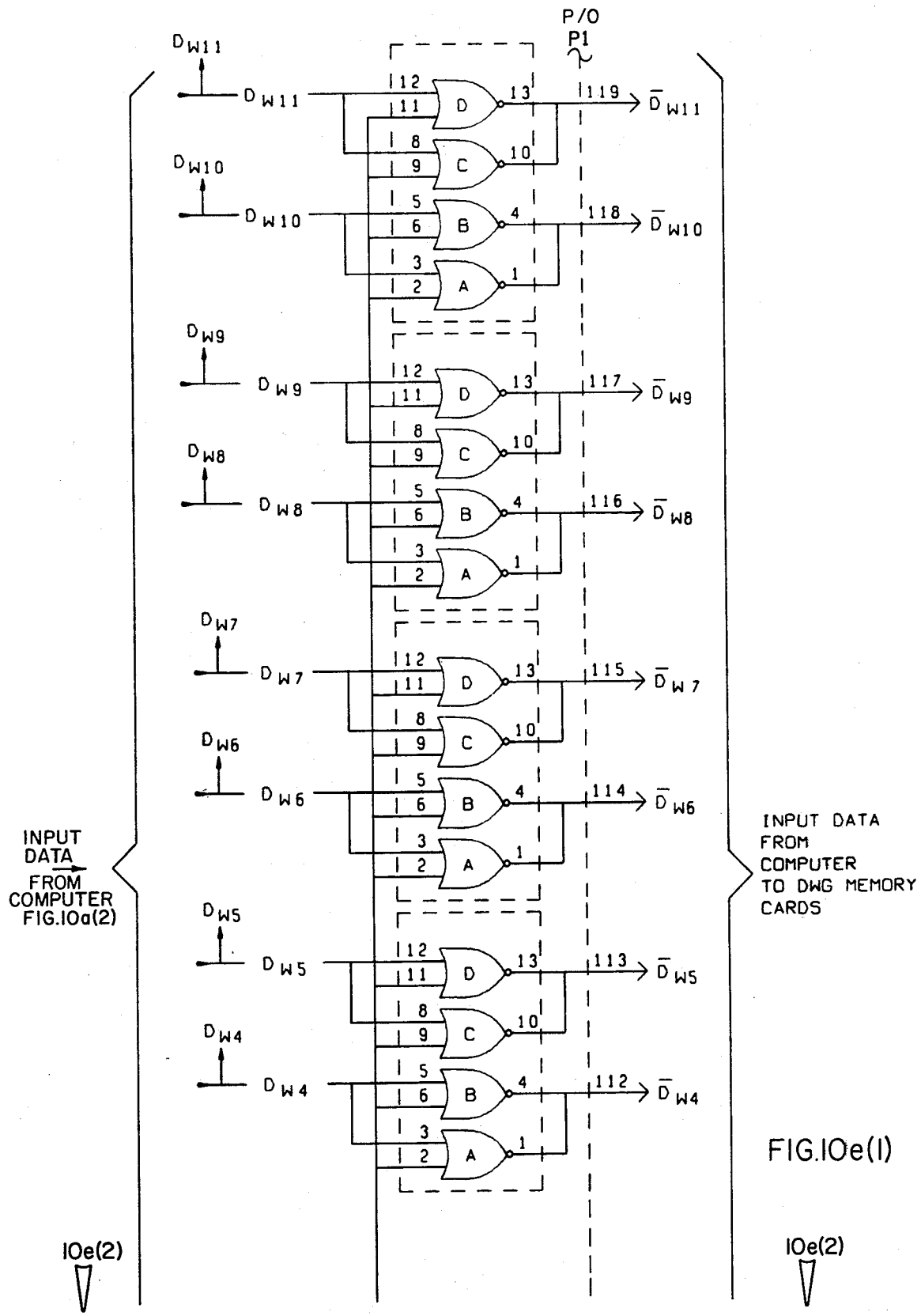
FIG.10e(1)

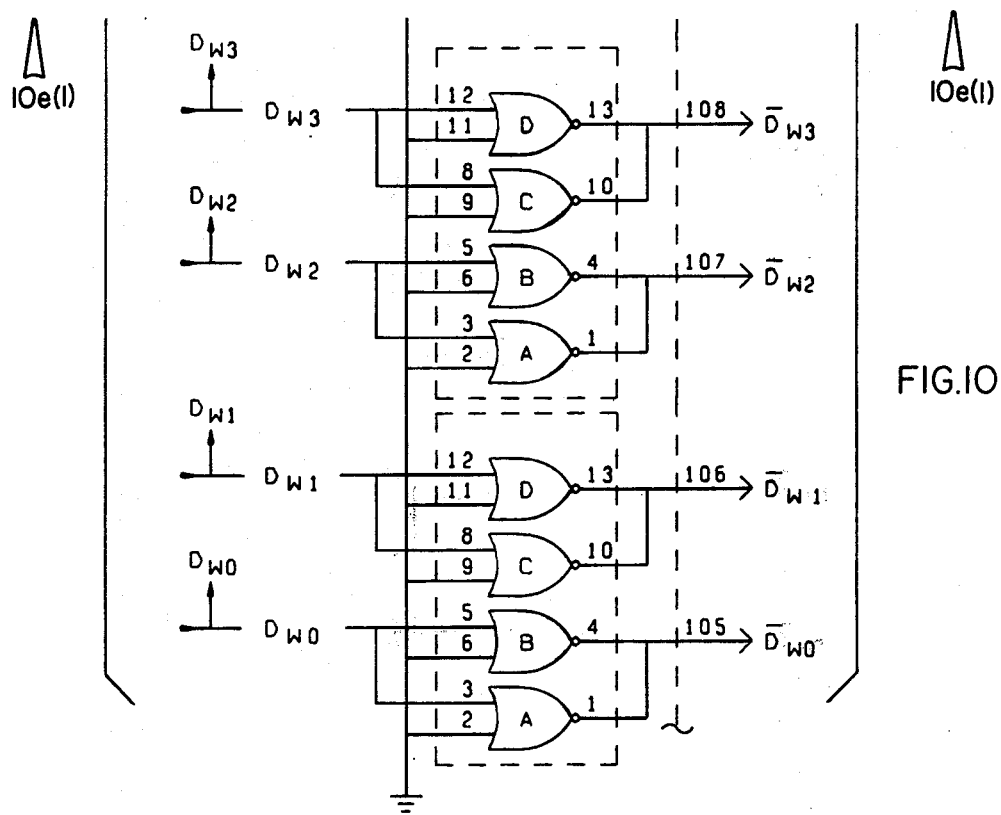
FIG.10e(2)

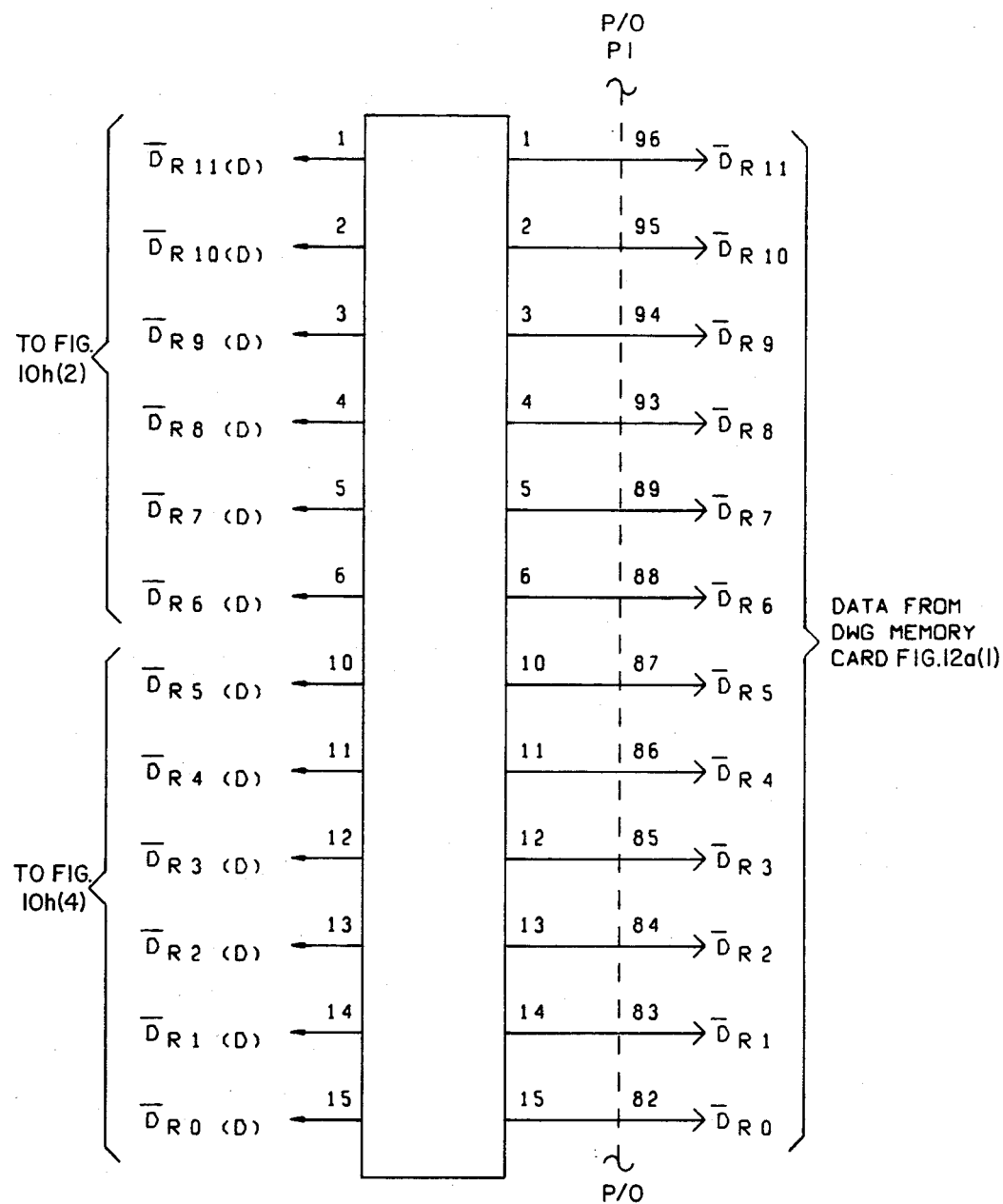
FIG.10f(1)

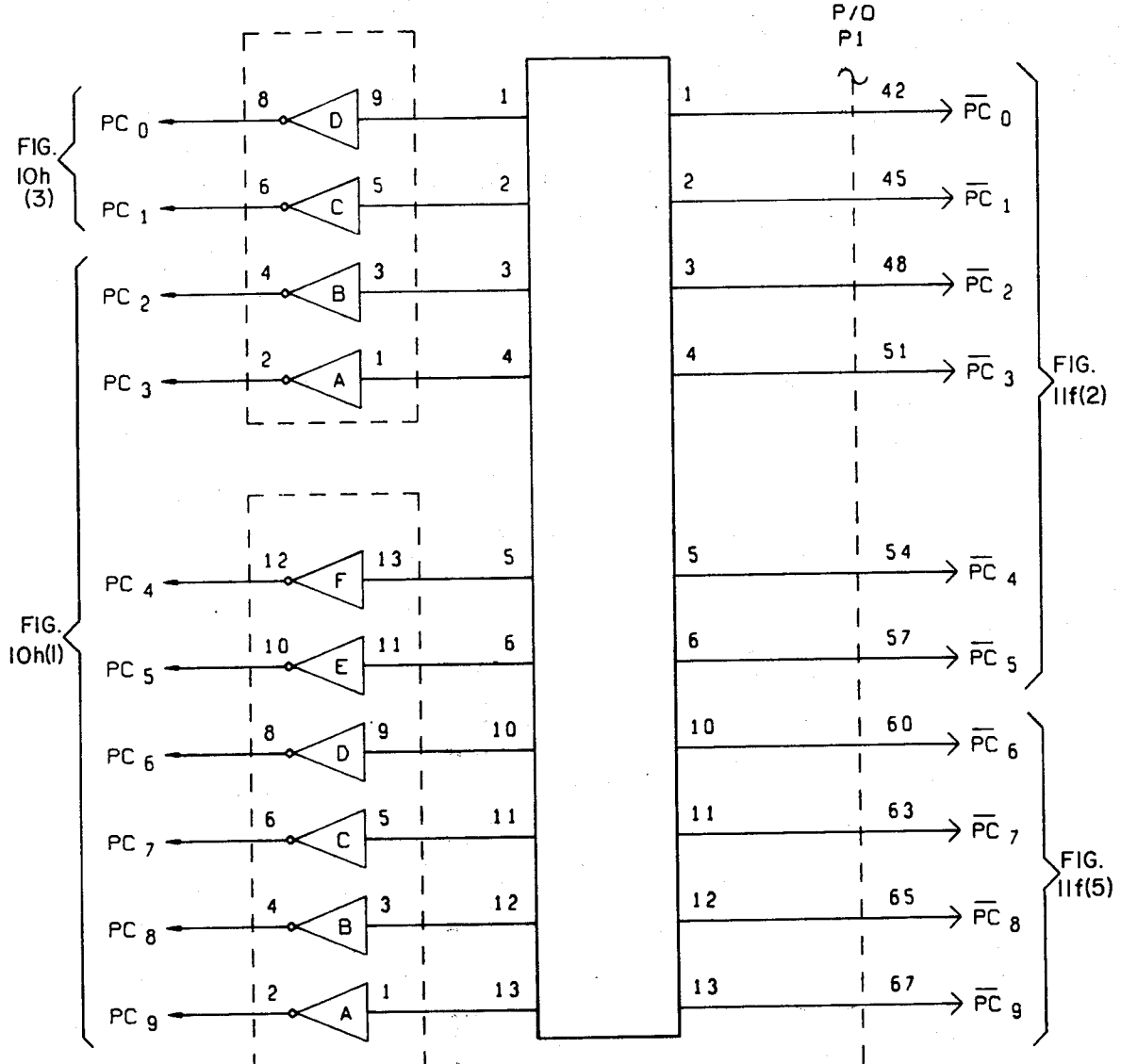
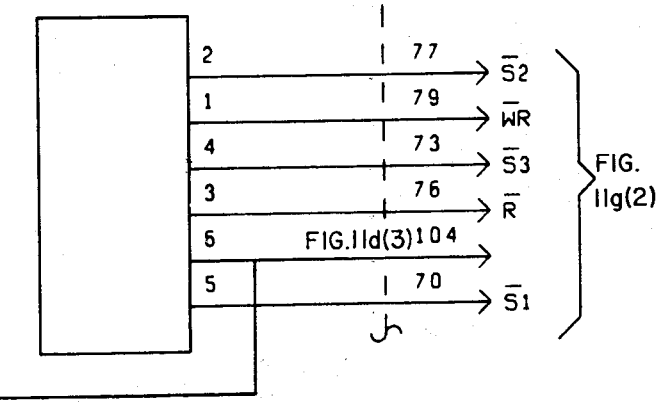

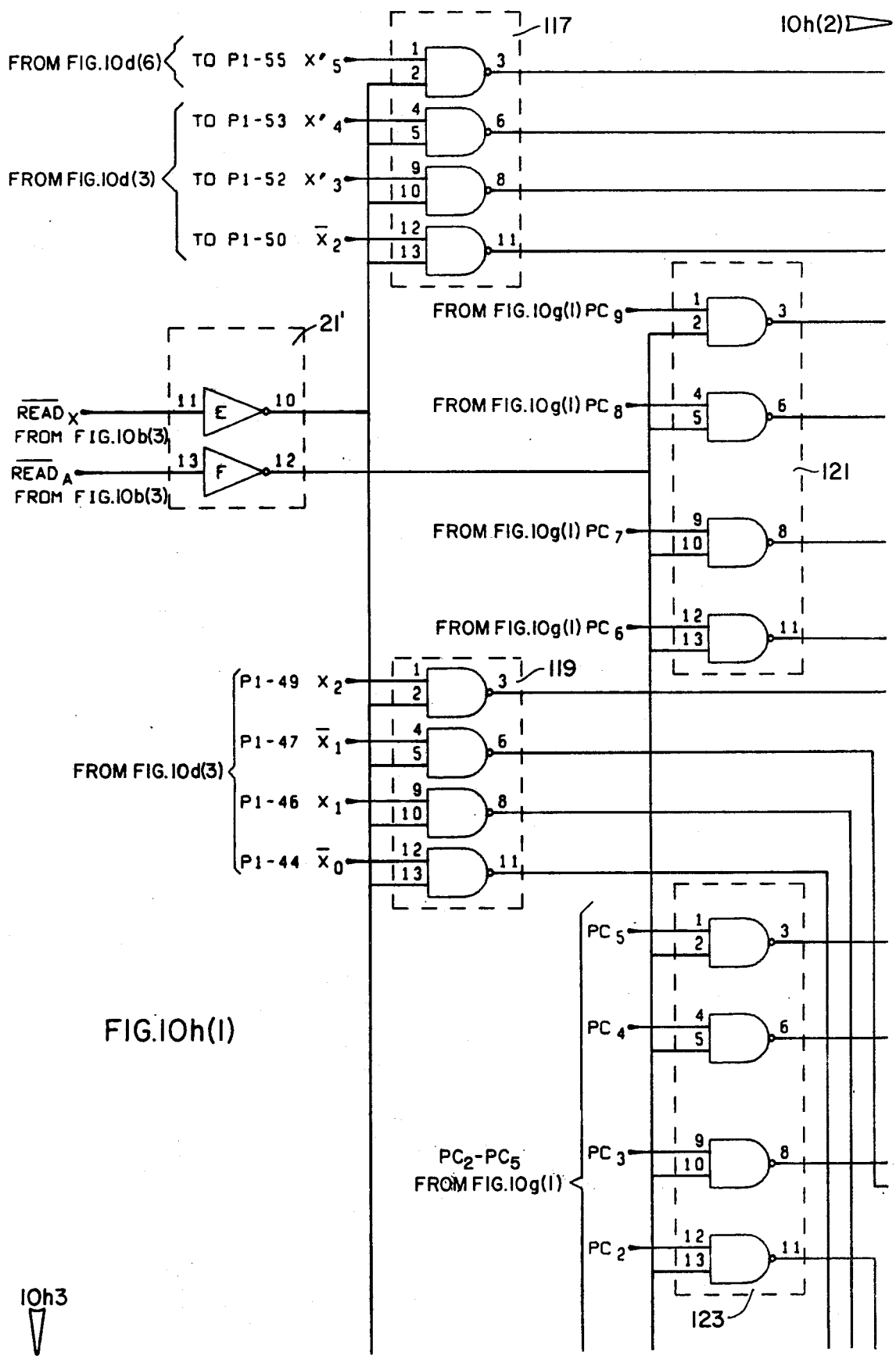
FIG.10h(1)

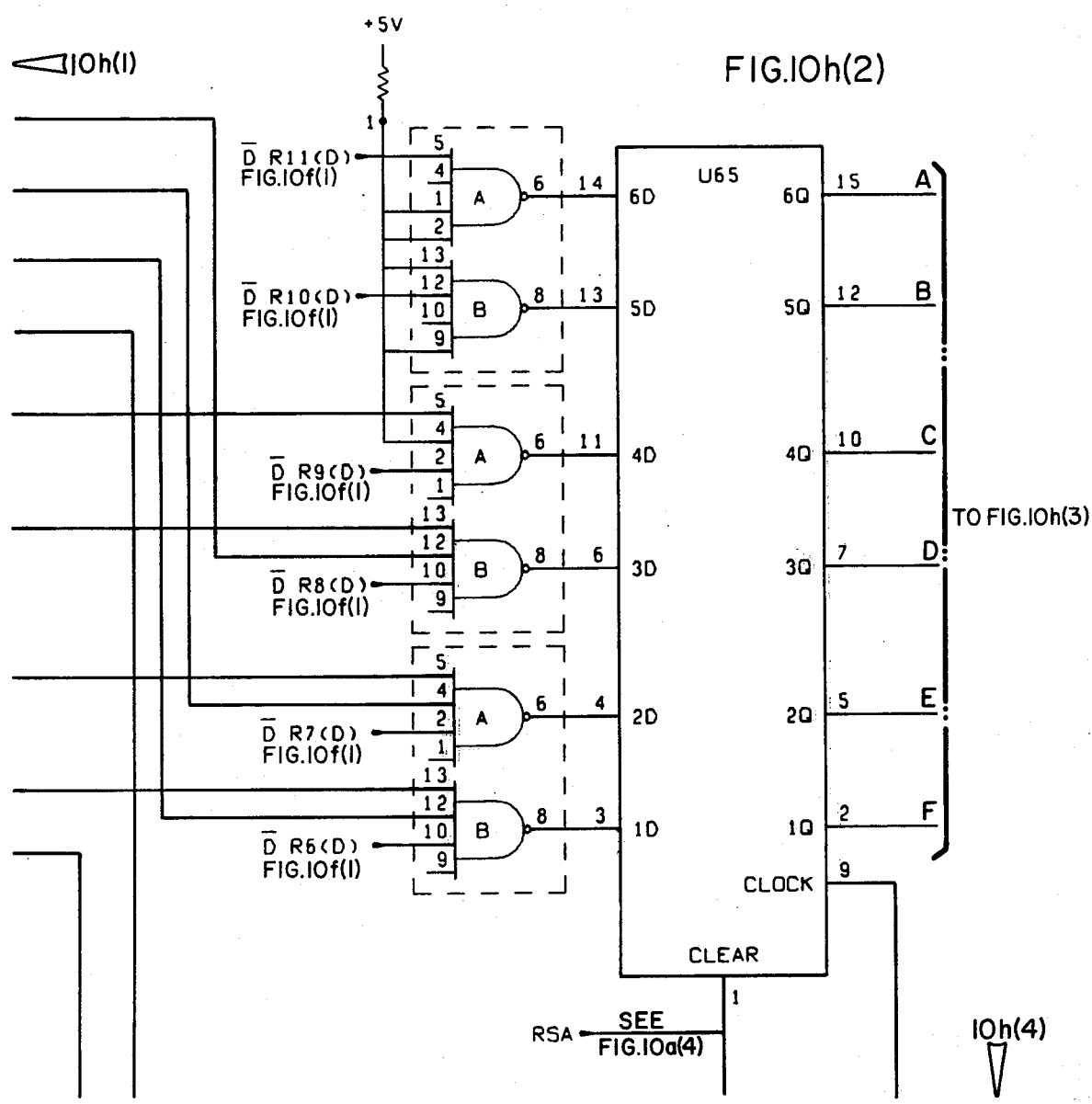

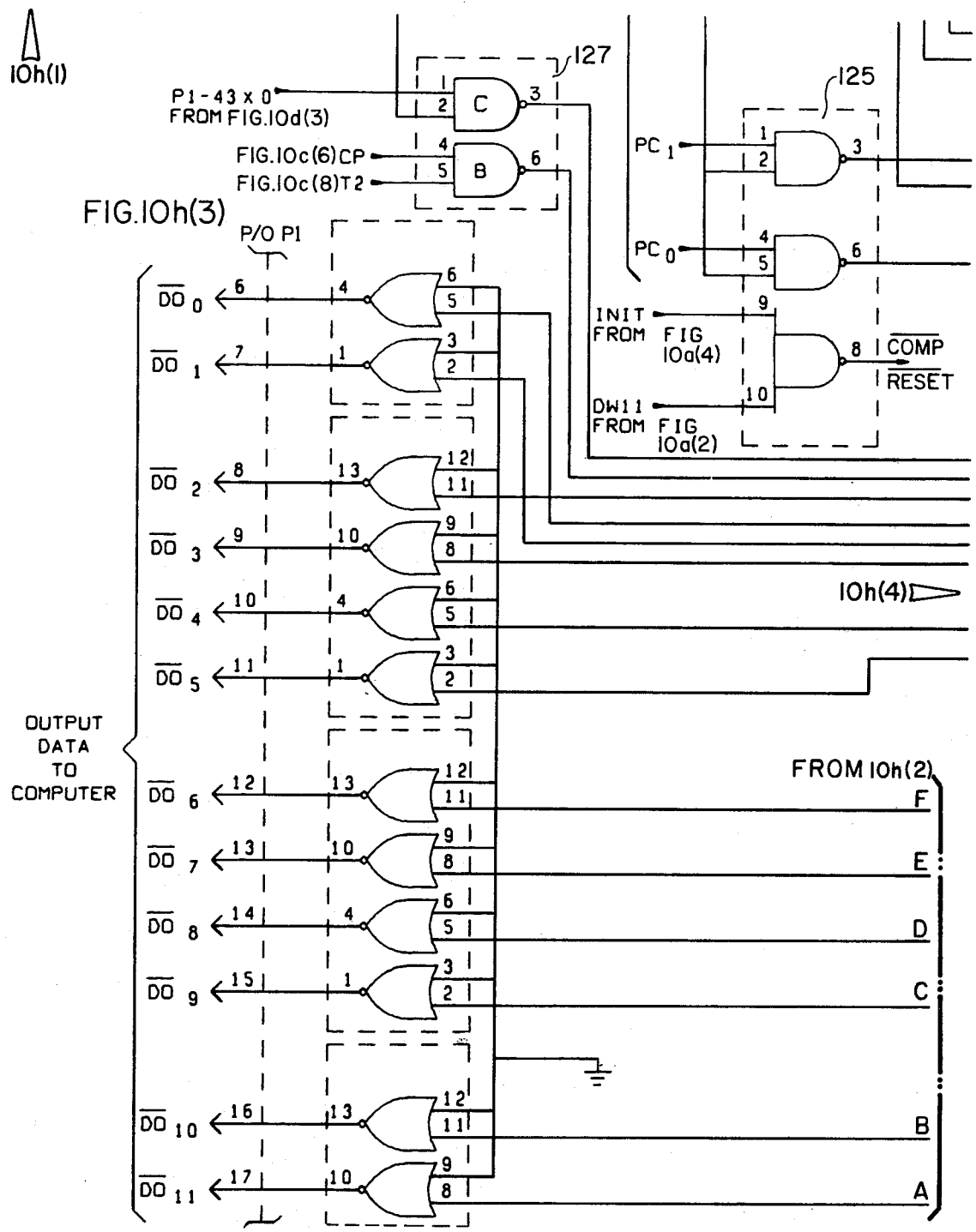

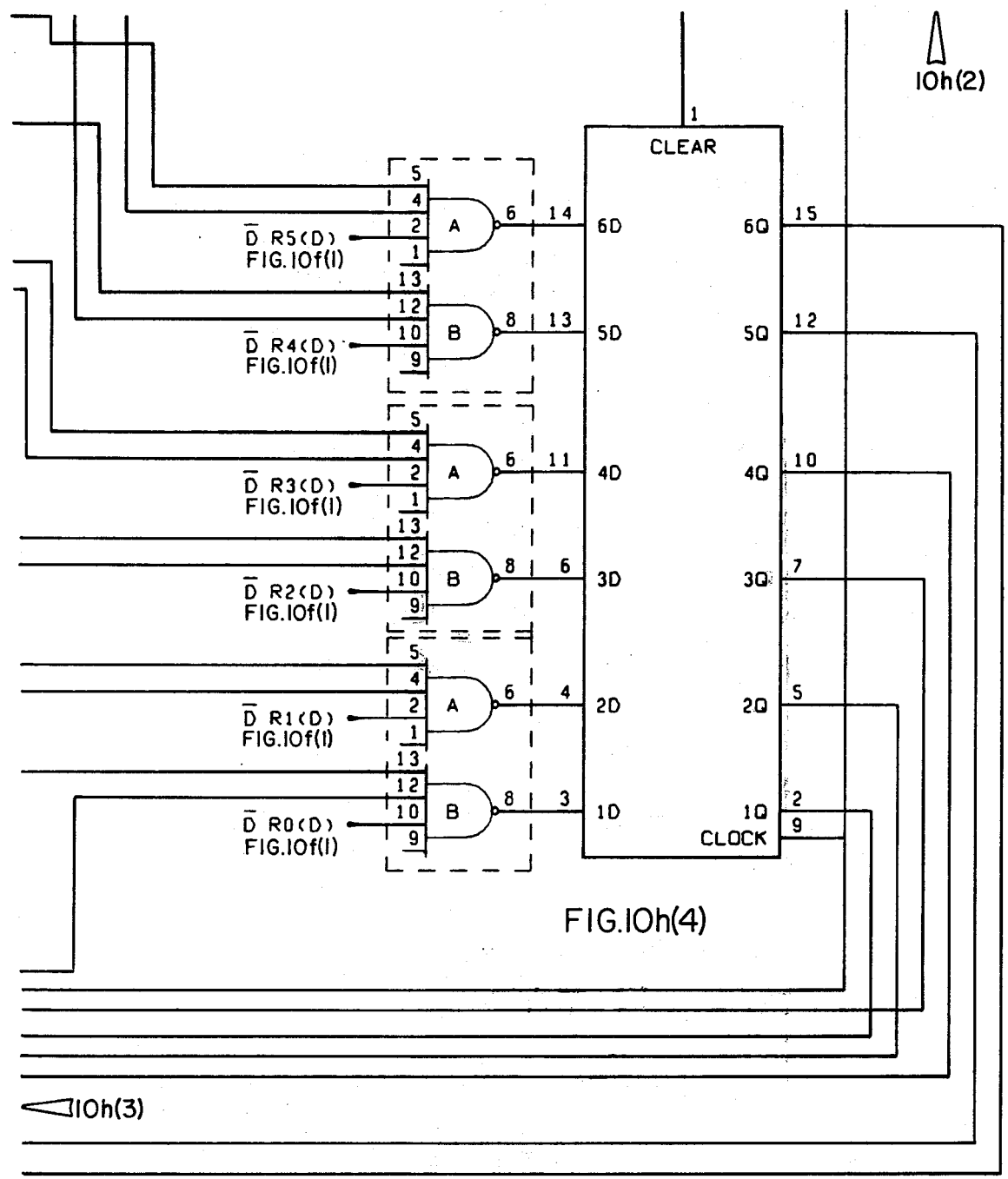

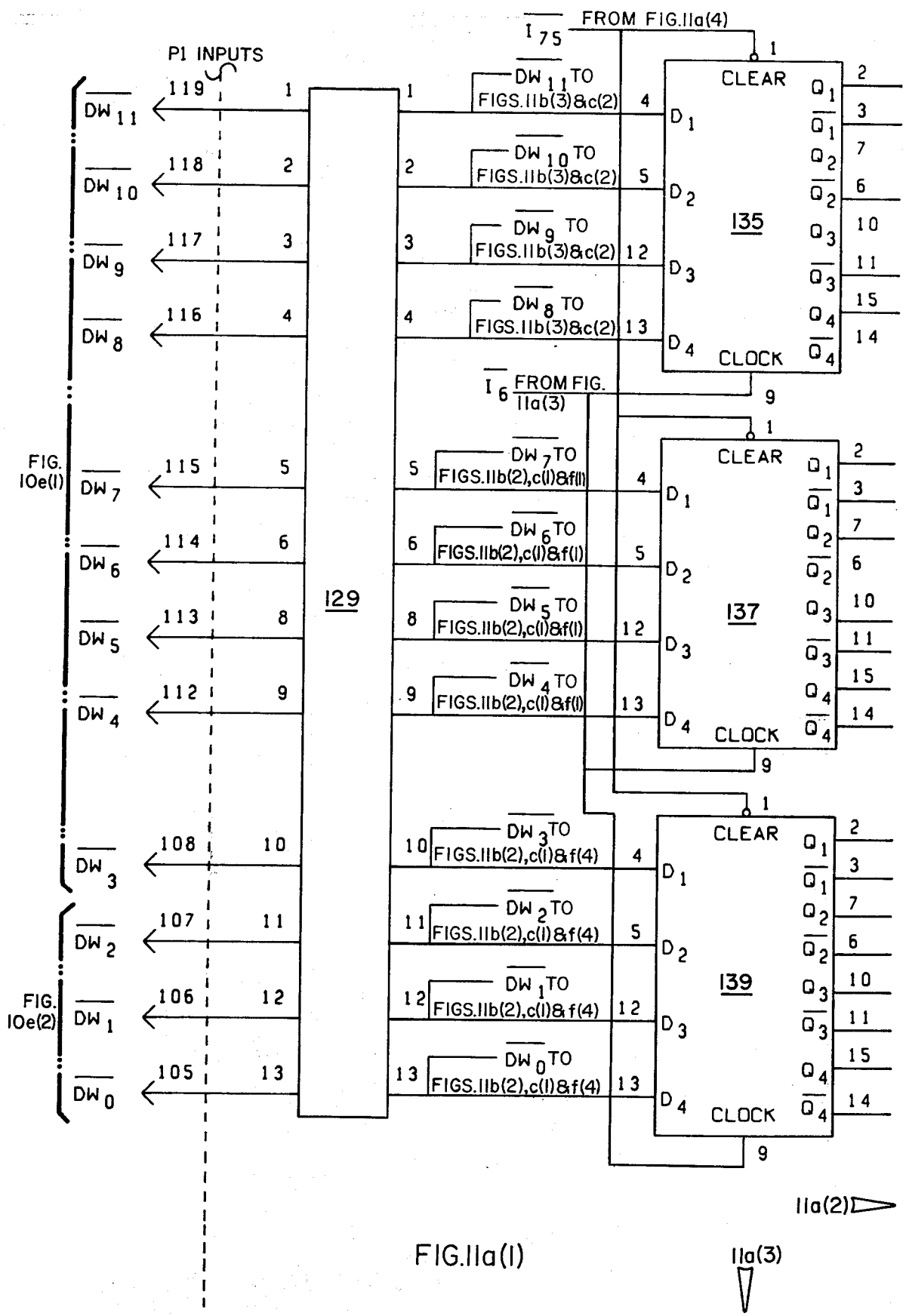
FIG.11a(1)

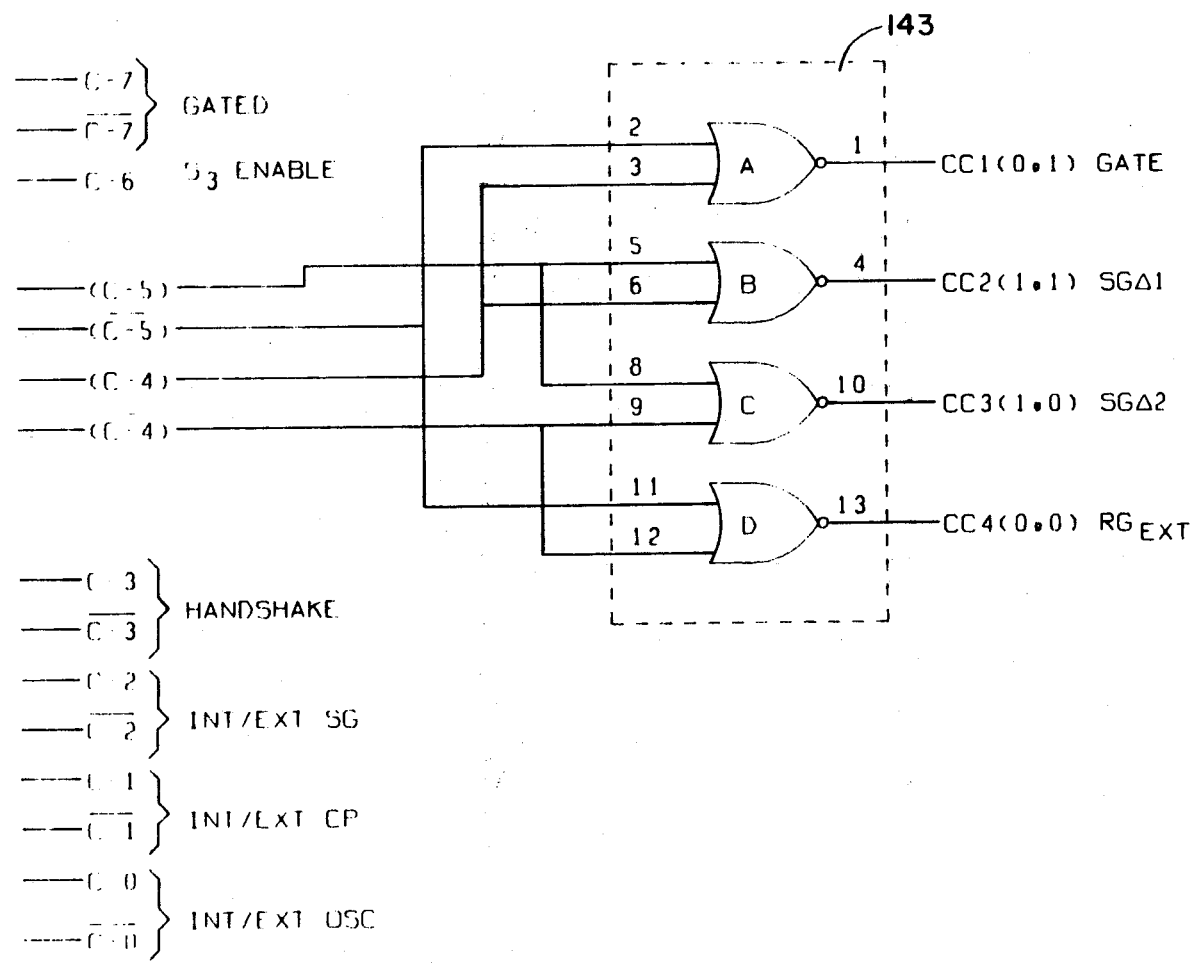
FIG.11a(2)

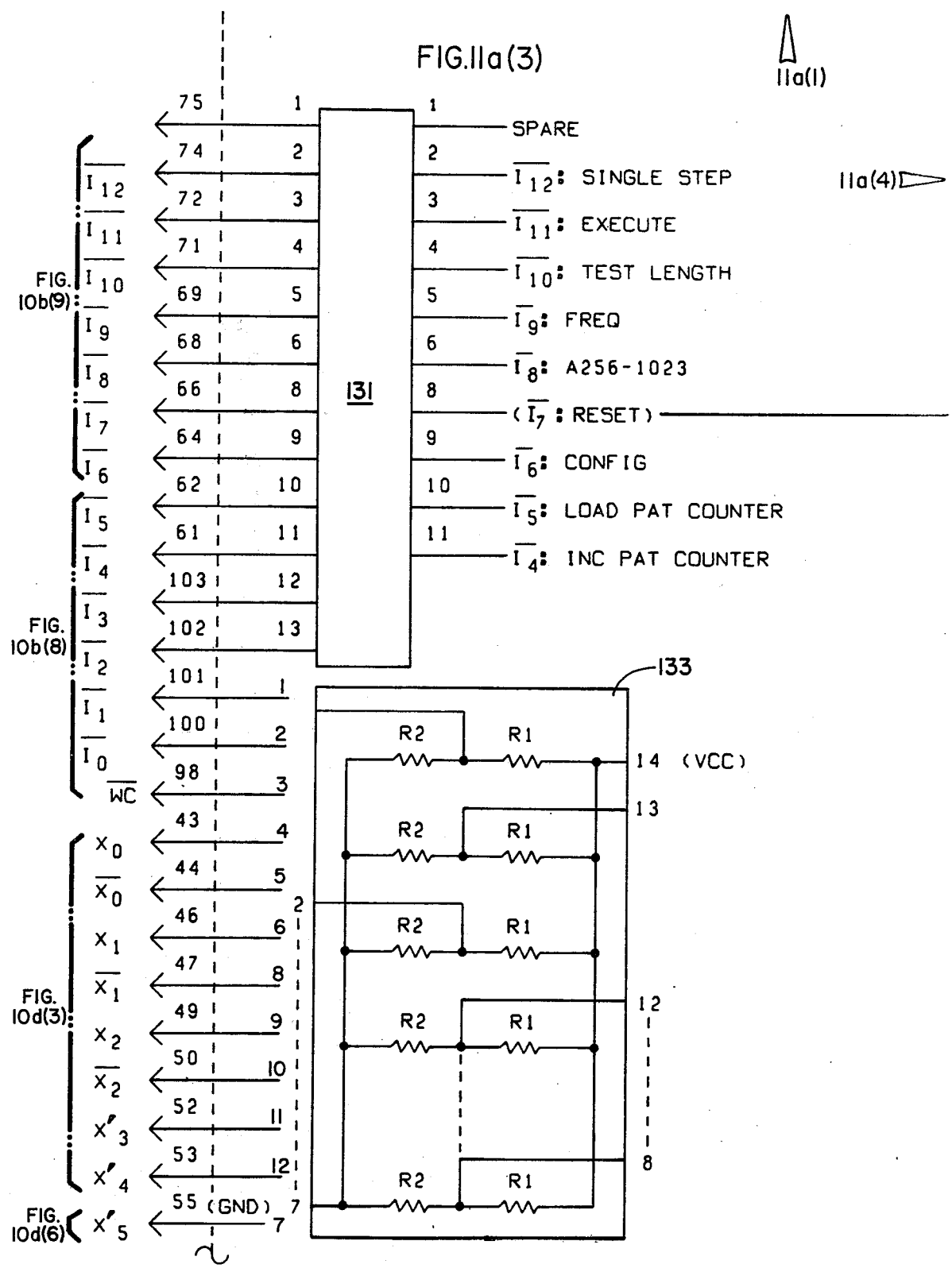

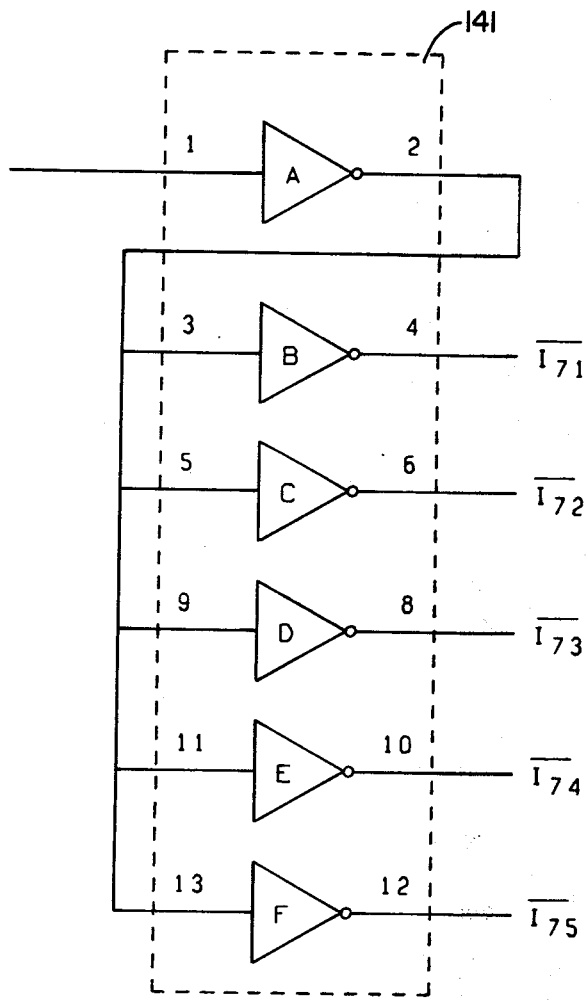
FIG.11a(4)

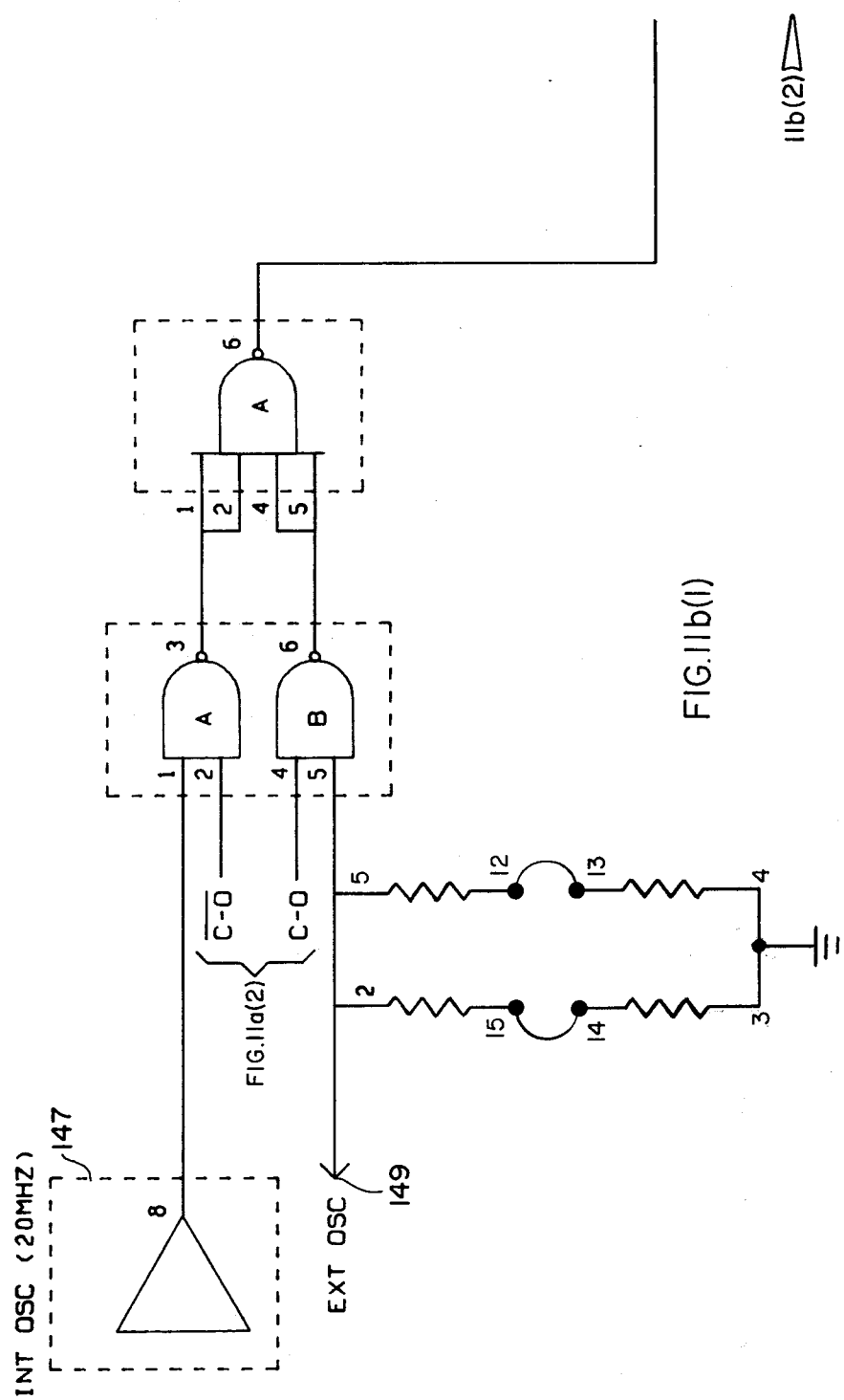
FIG.IIb(I)

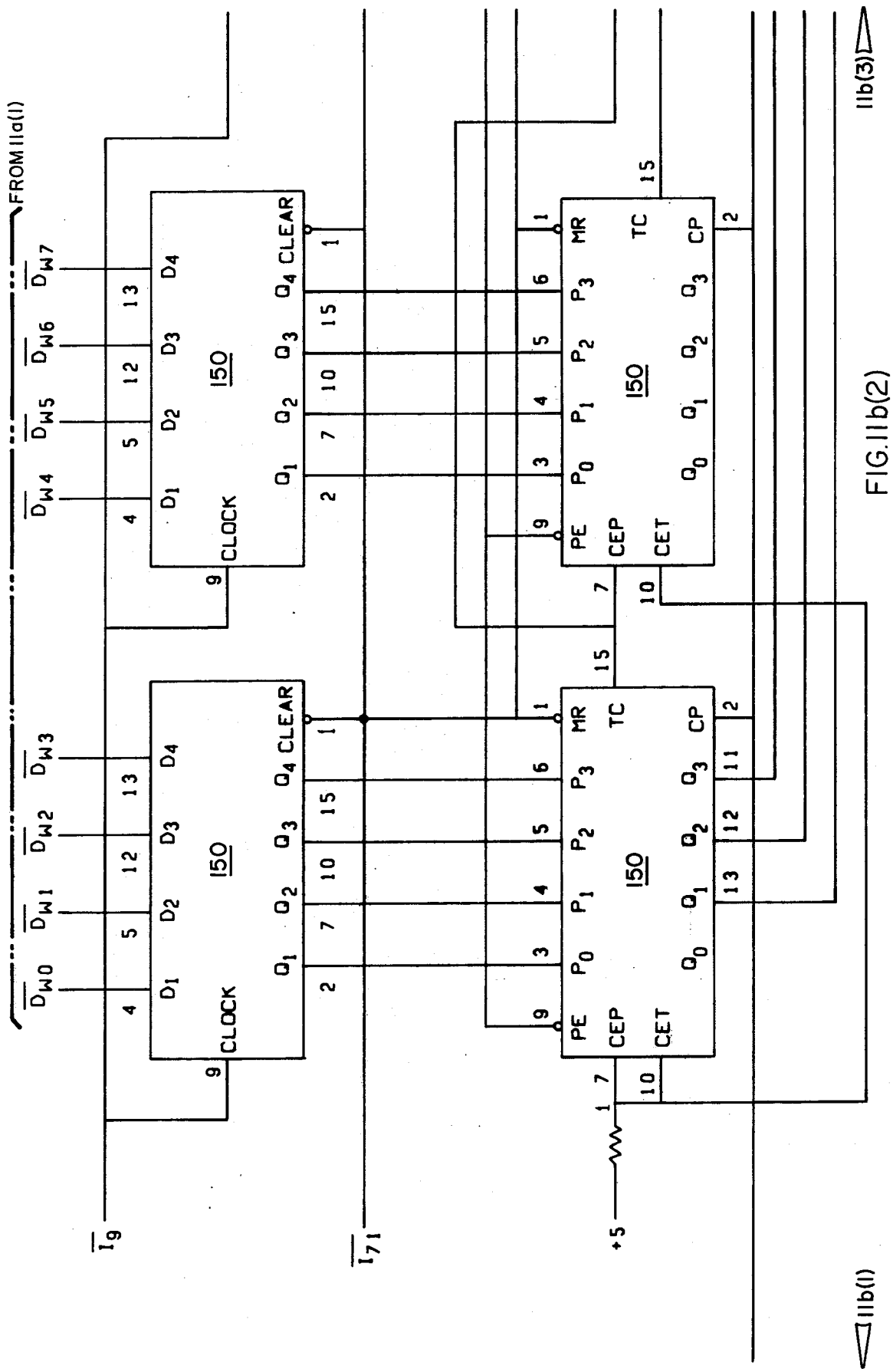
FIG.11b(2)

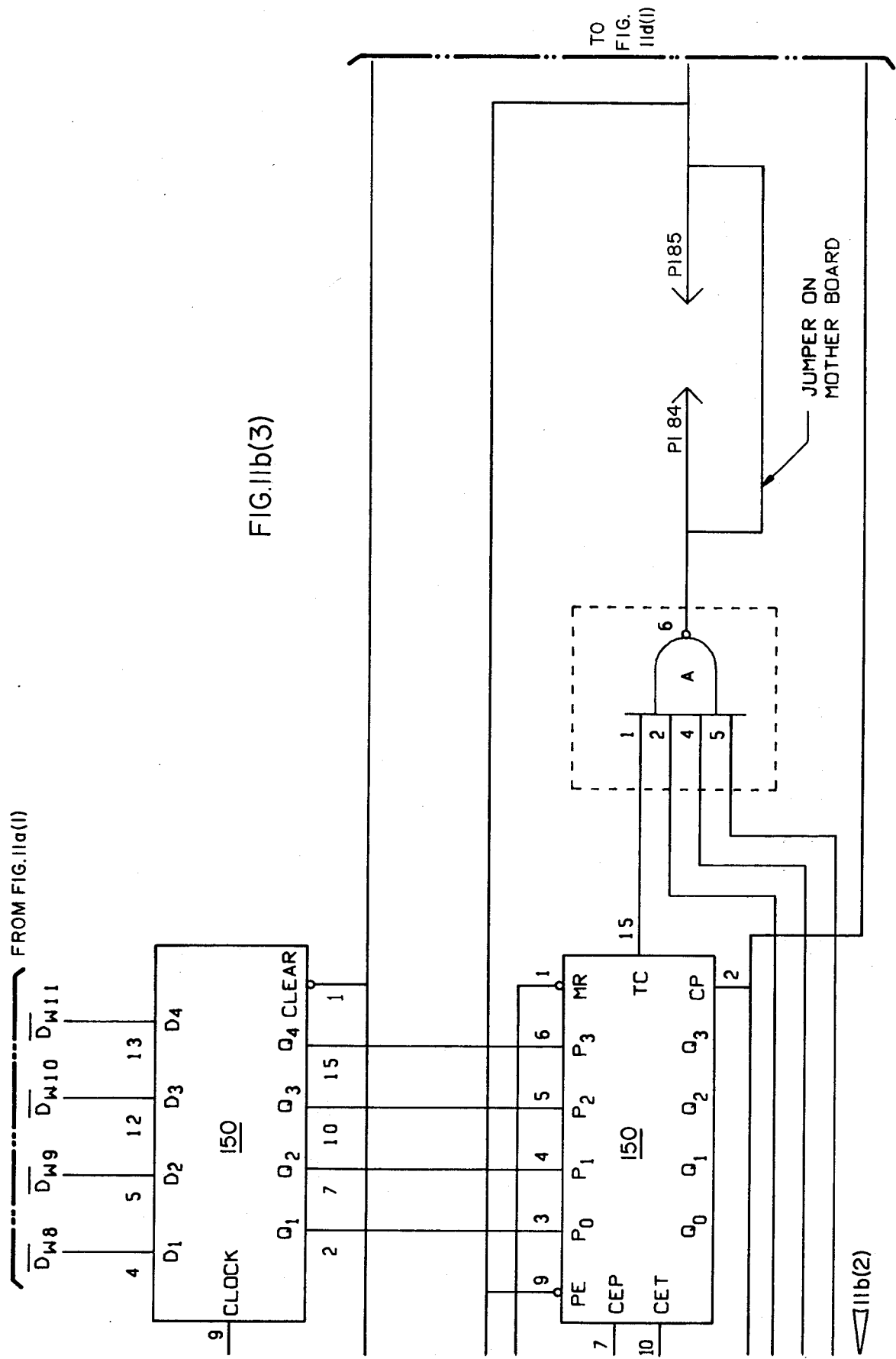

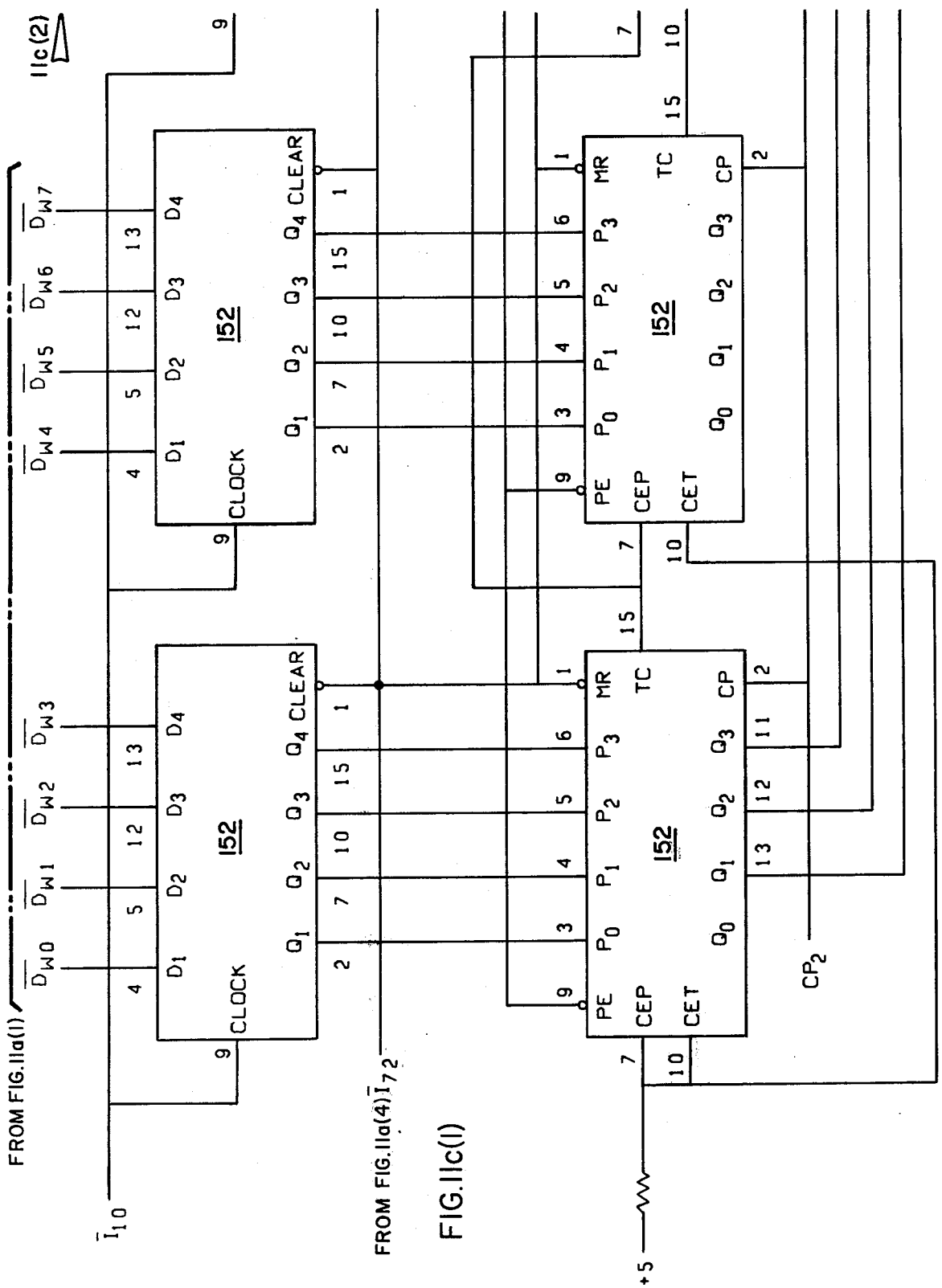

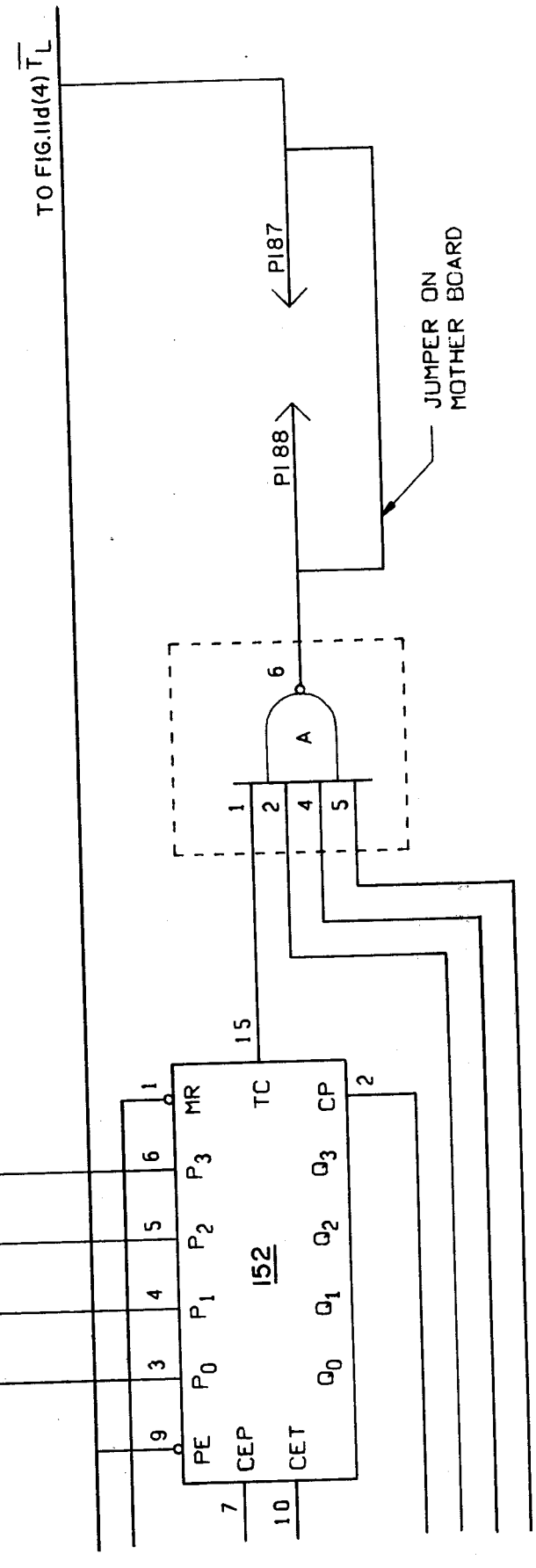
FIG.IIc(2)

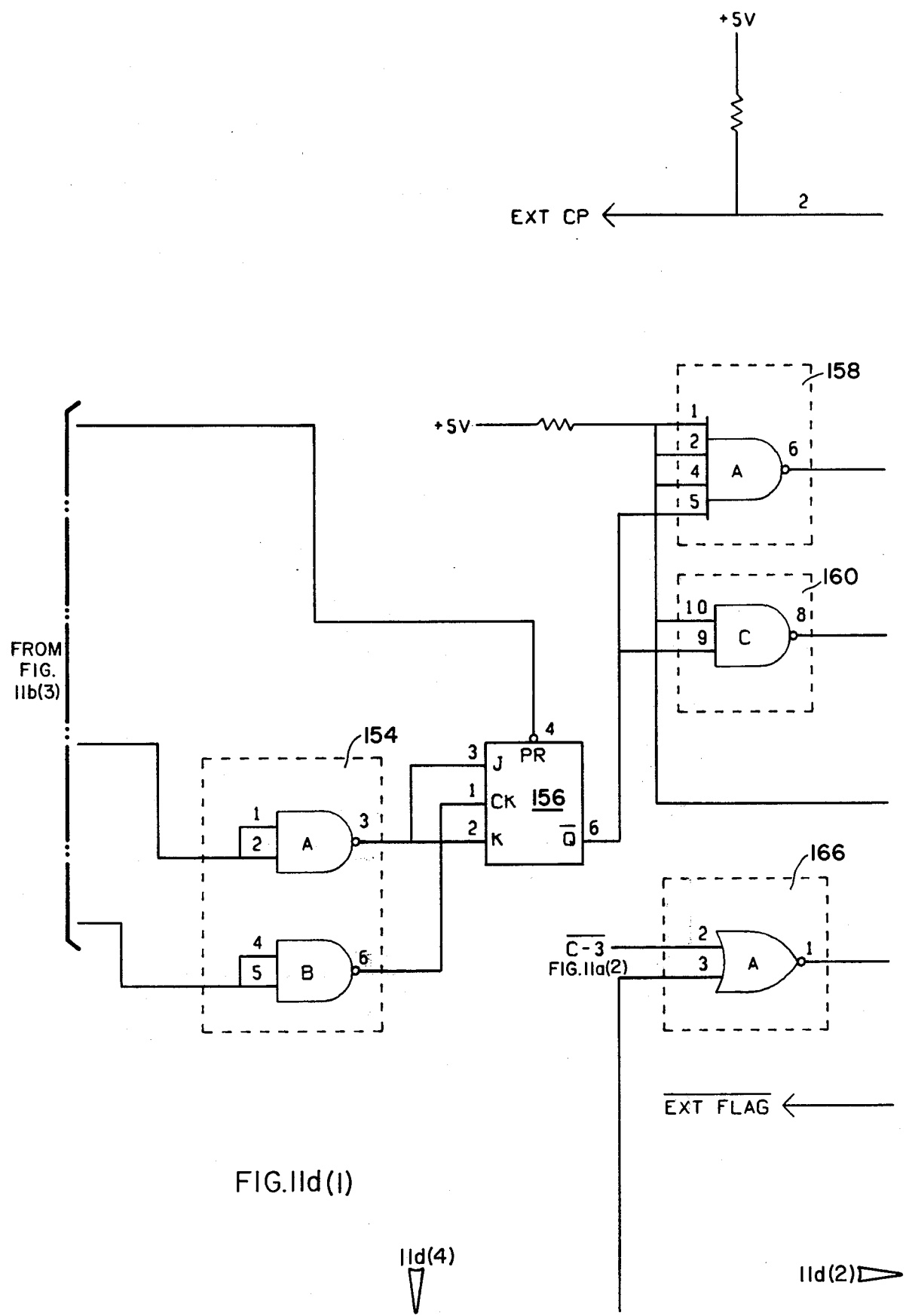
FIG.IId(1)

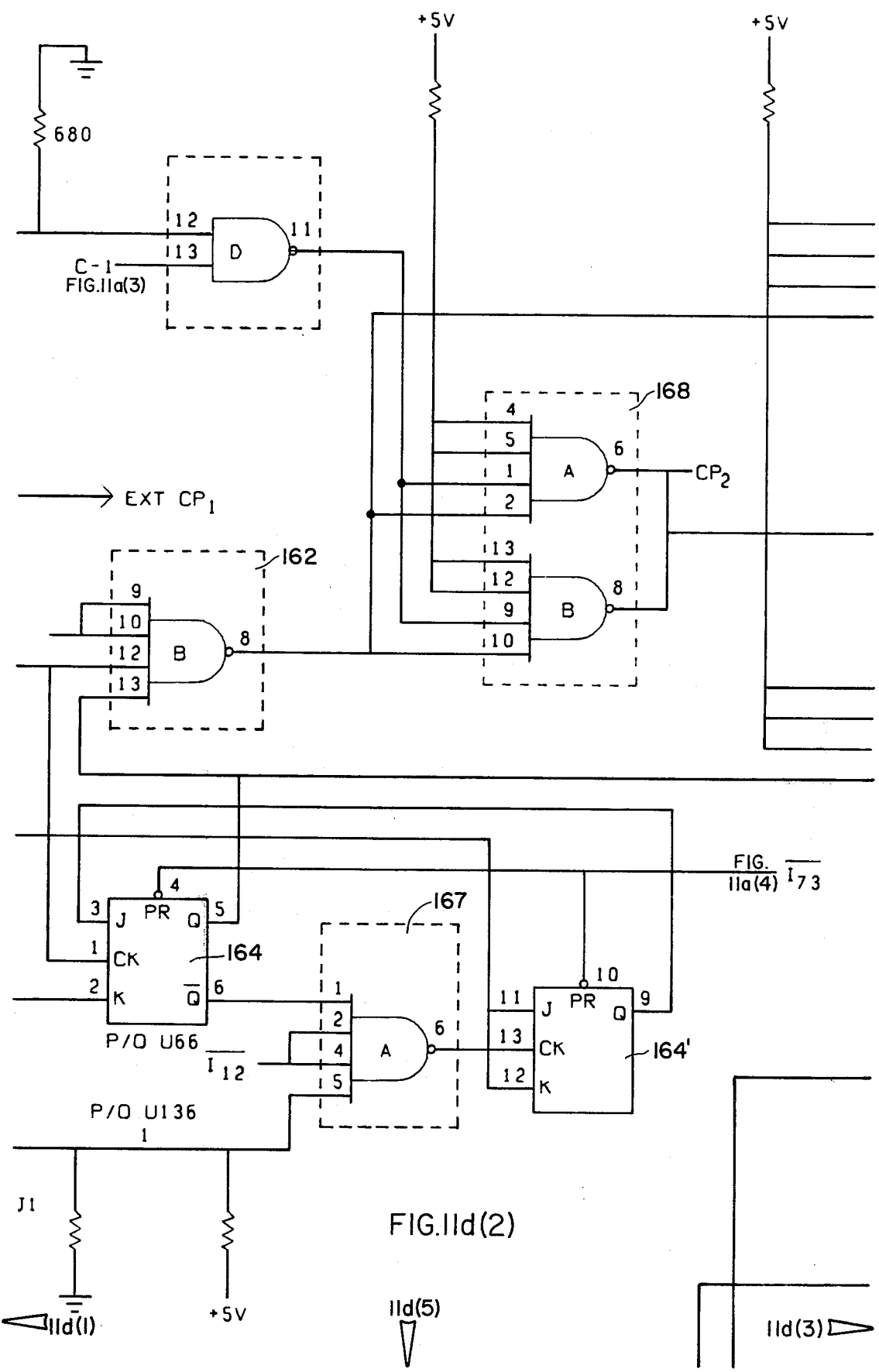
FIG.11d(2)

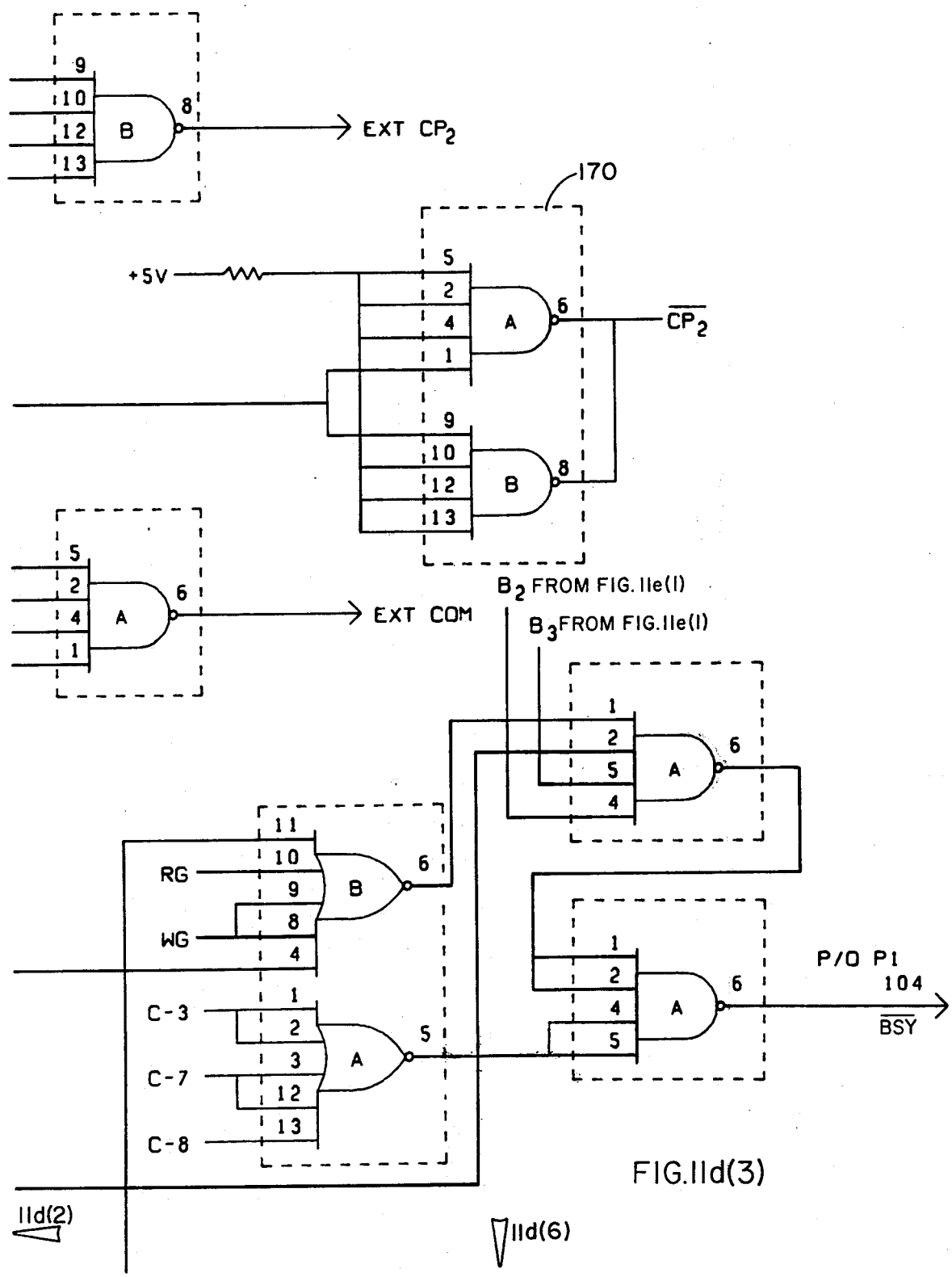
FIG.11d(3)

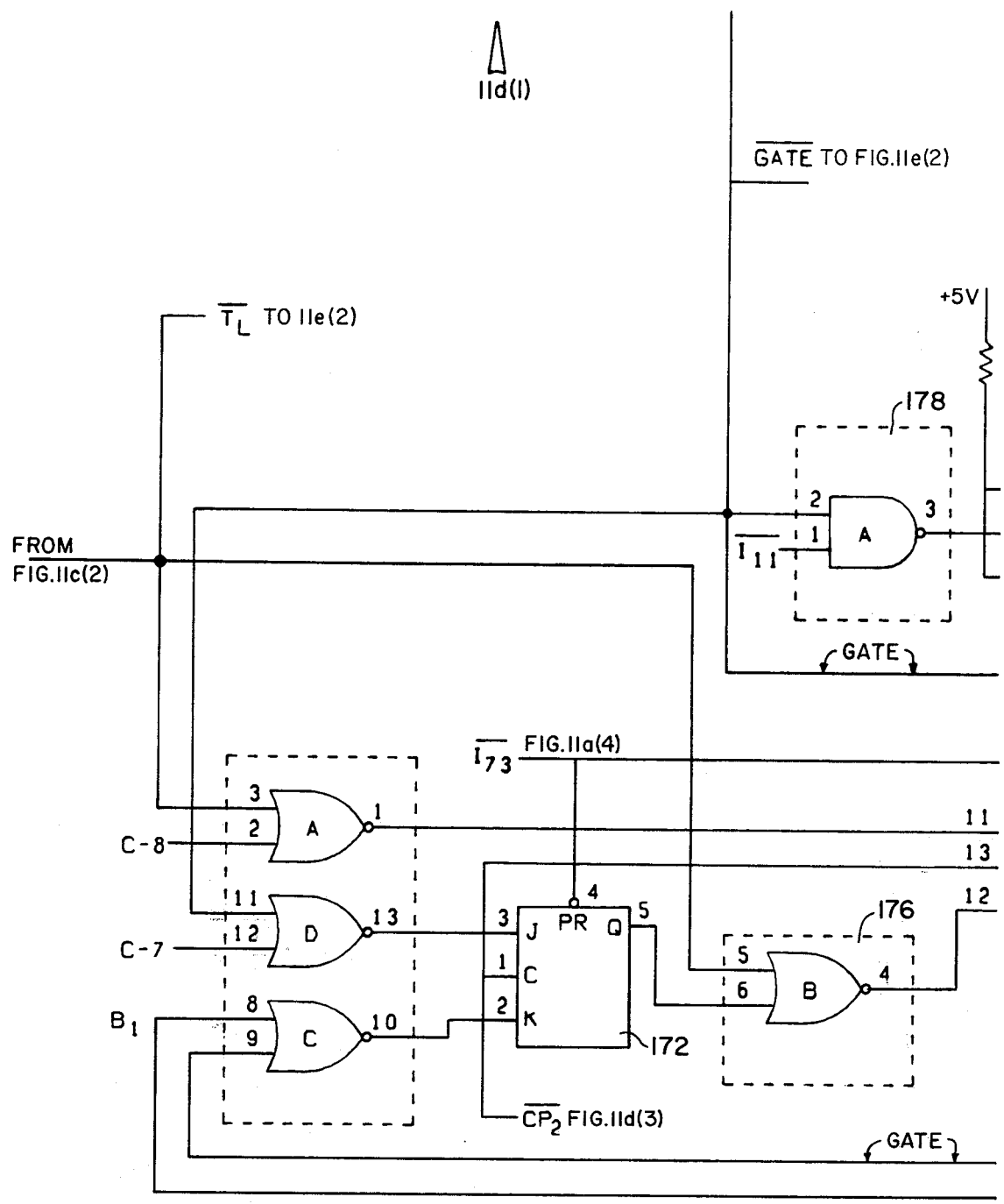
FIG.11d(4)

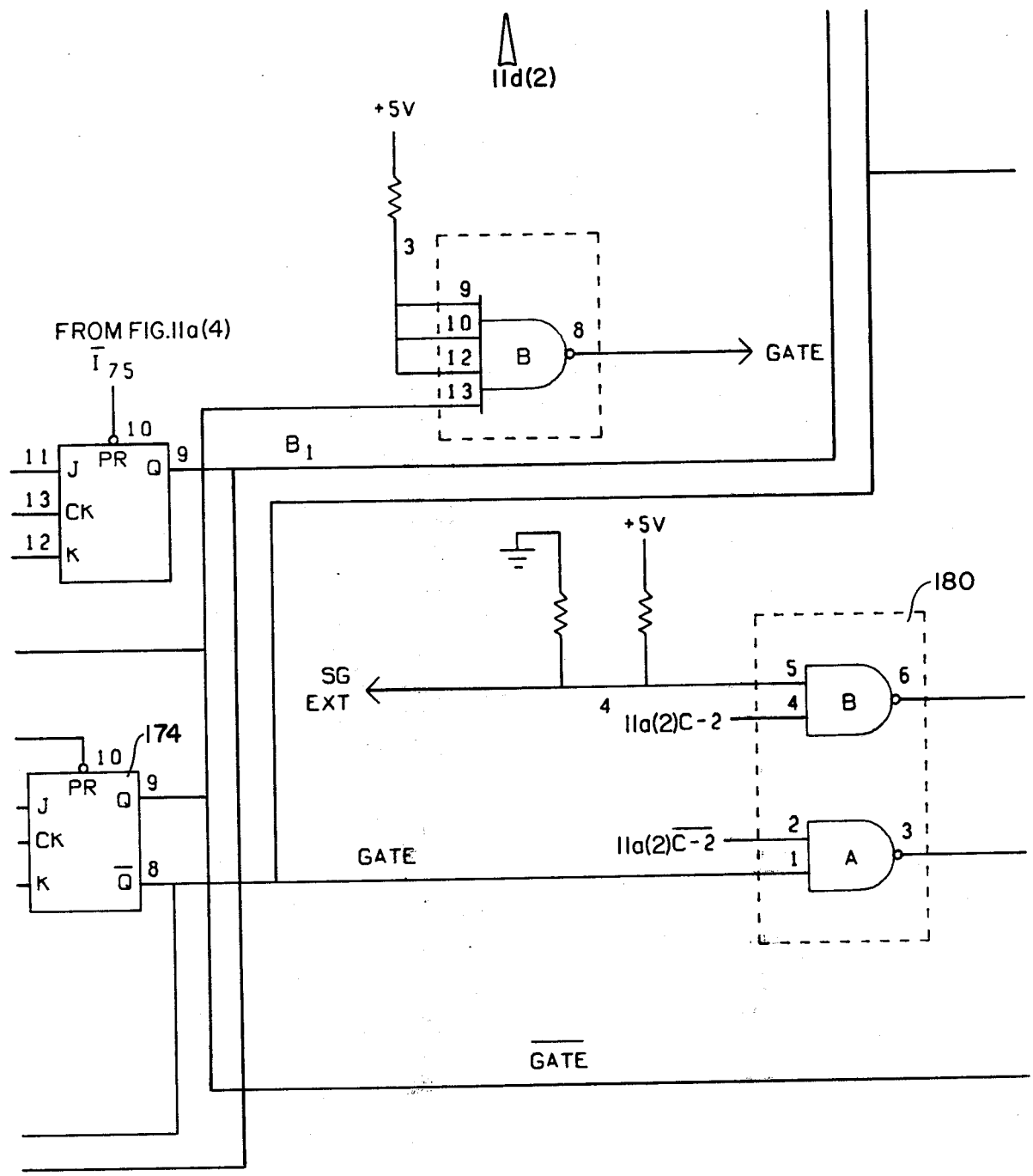
FIG.11d(5)

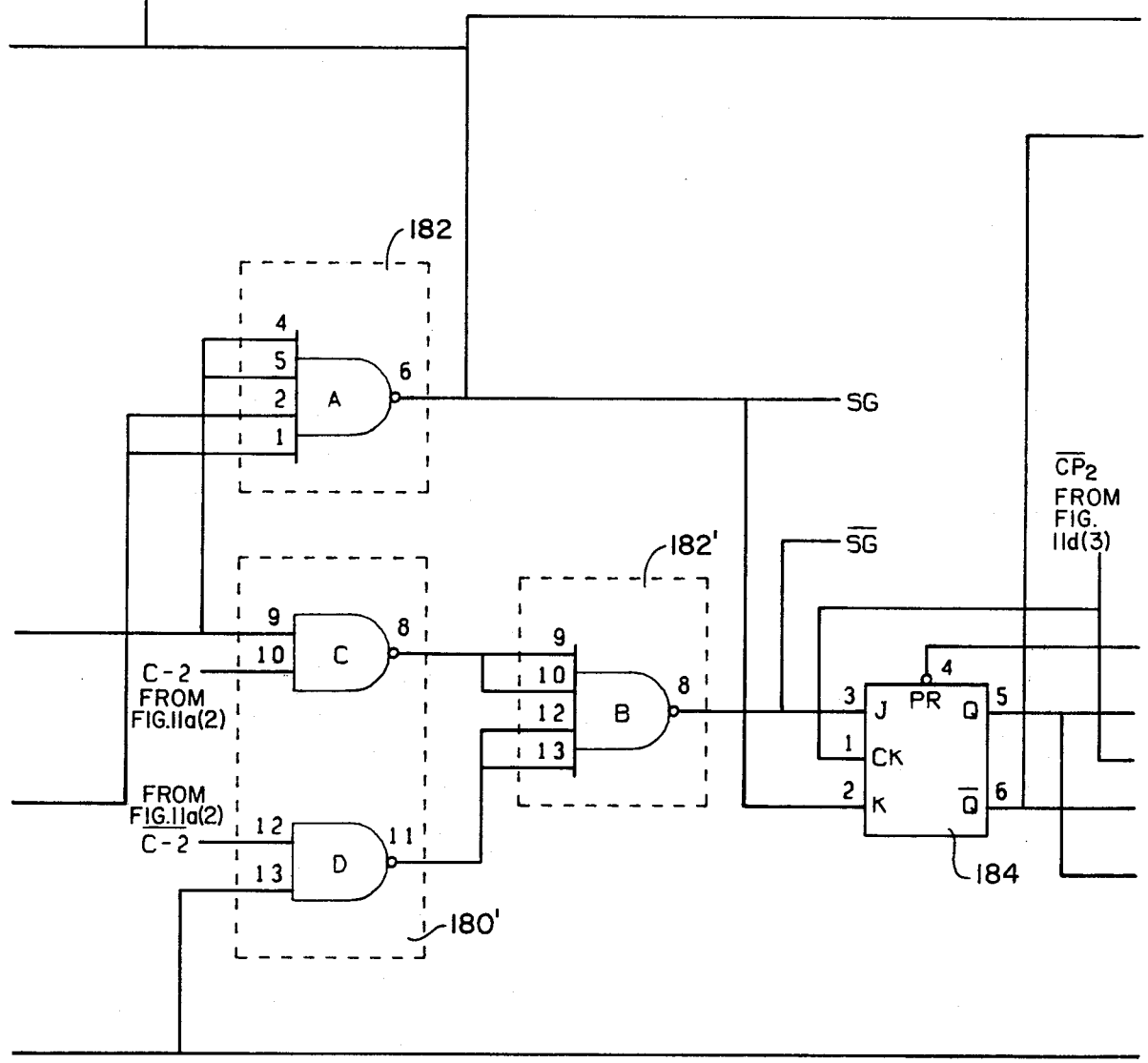
FIG.11d(6)

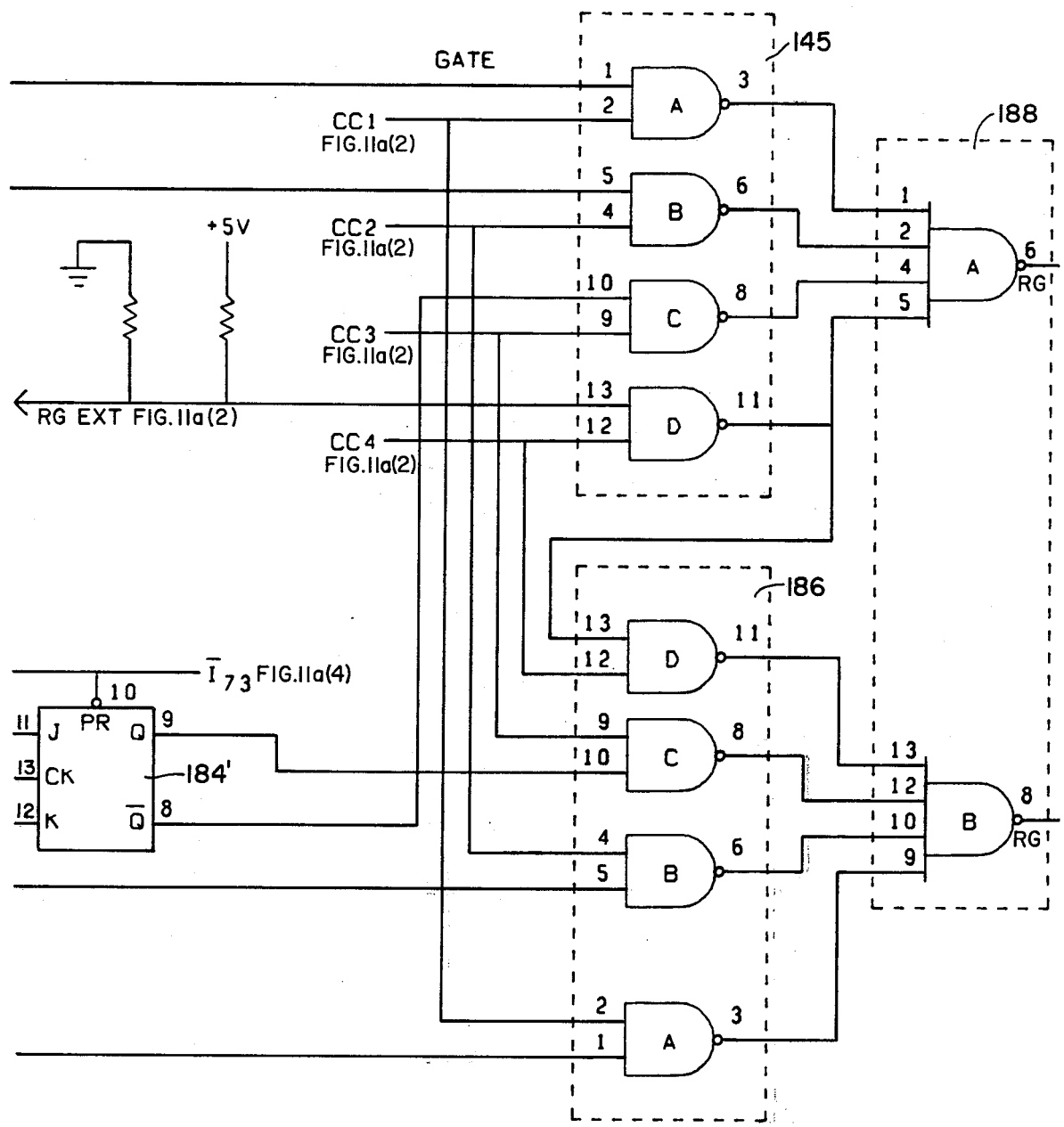
FIG.IId(7)

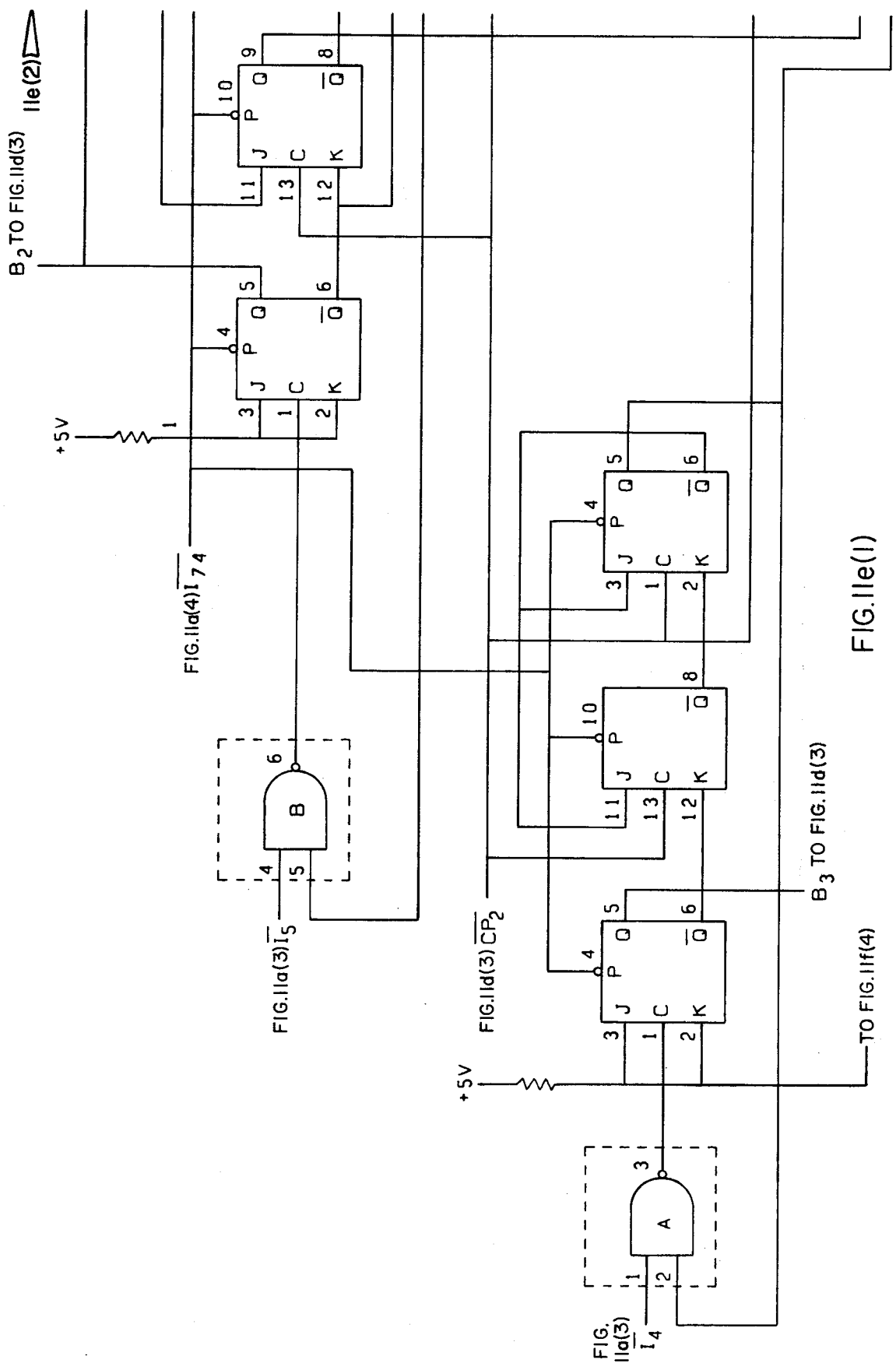

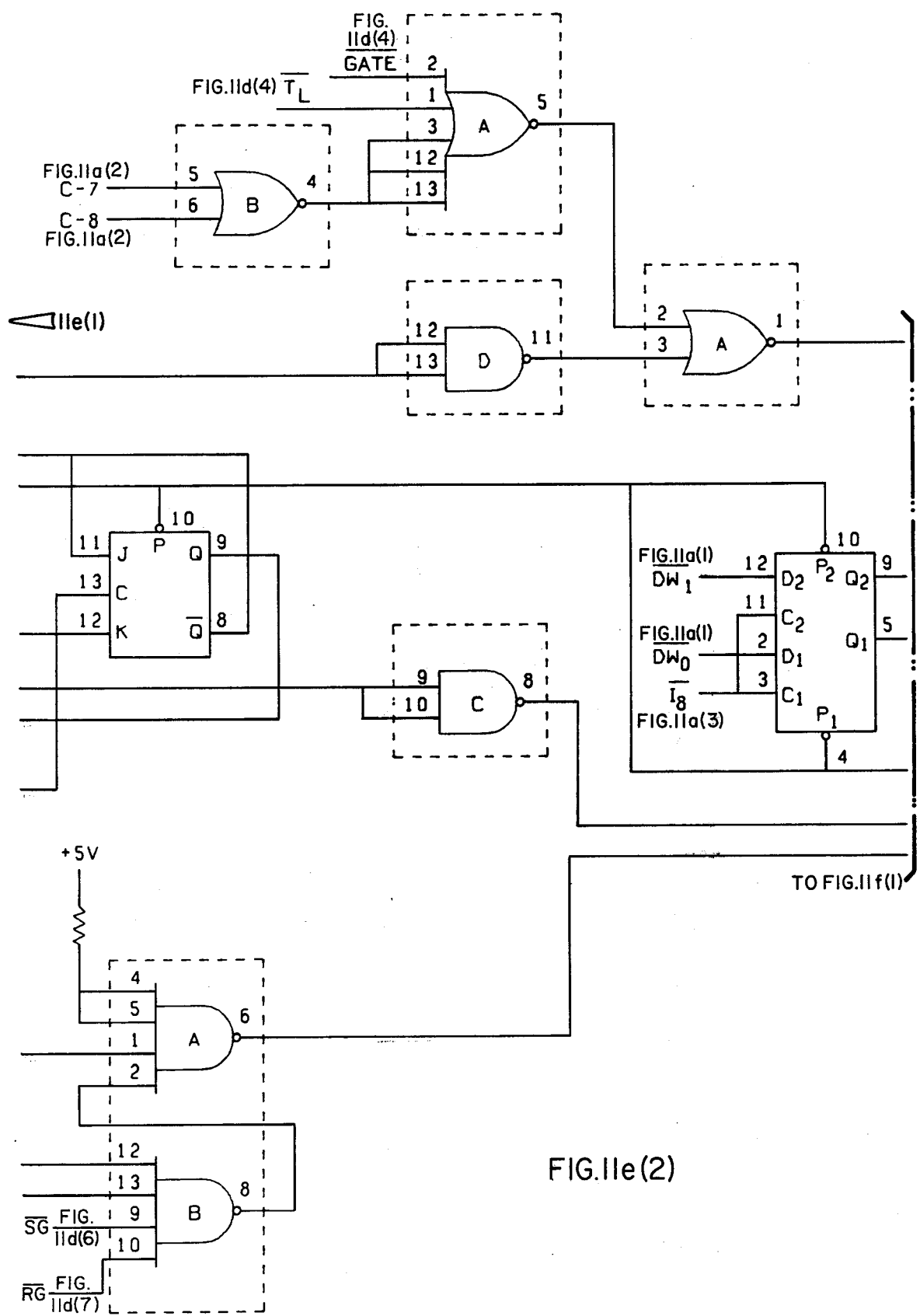
FIG.11e(2)

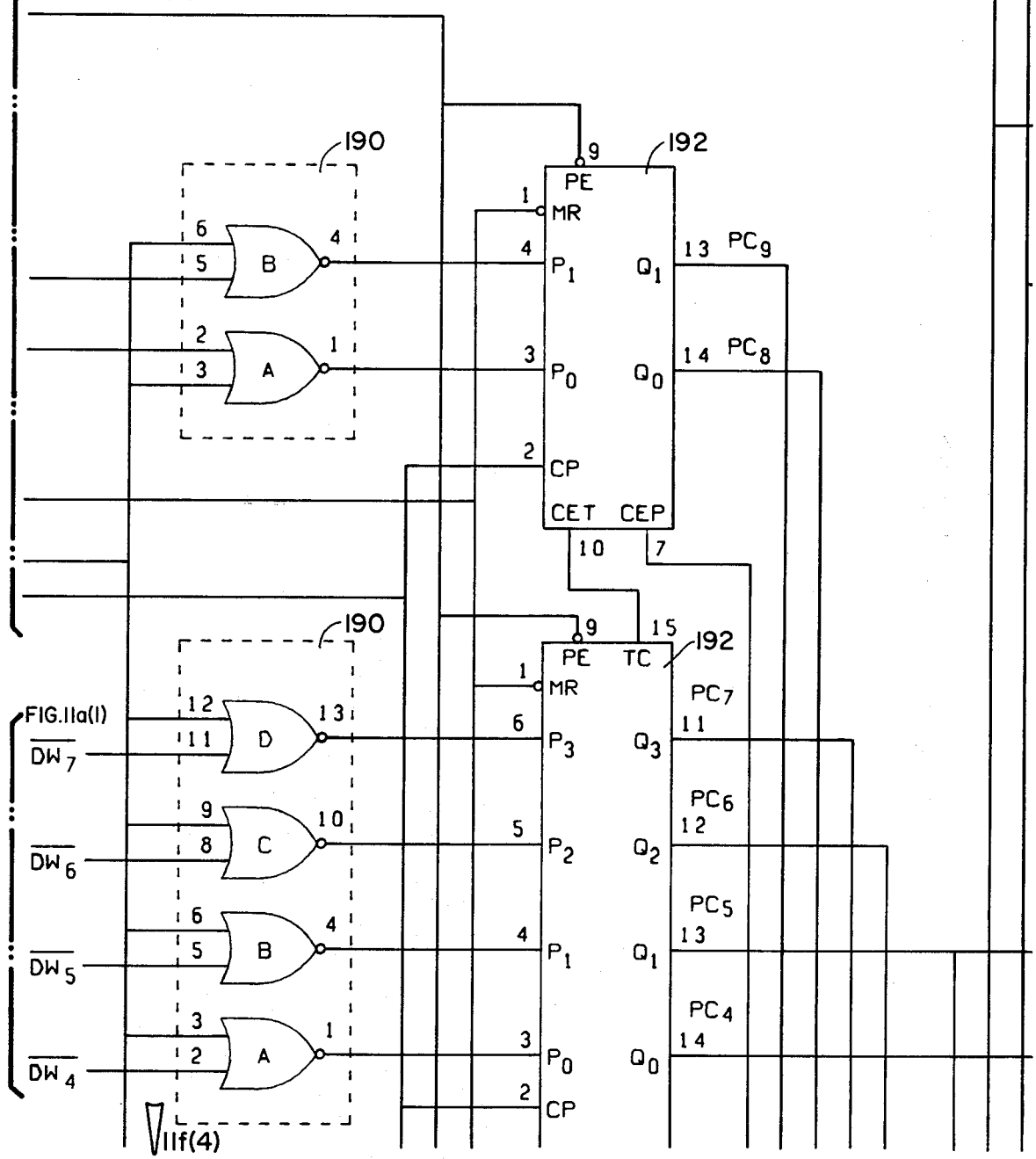
FIG.11f(1)

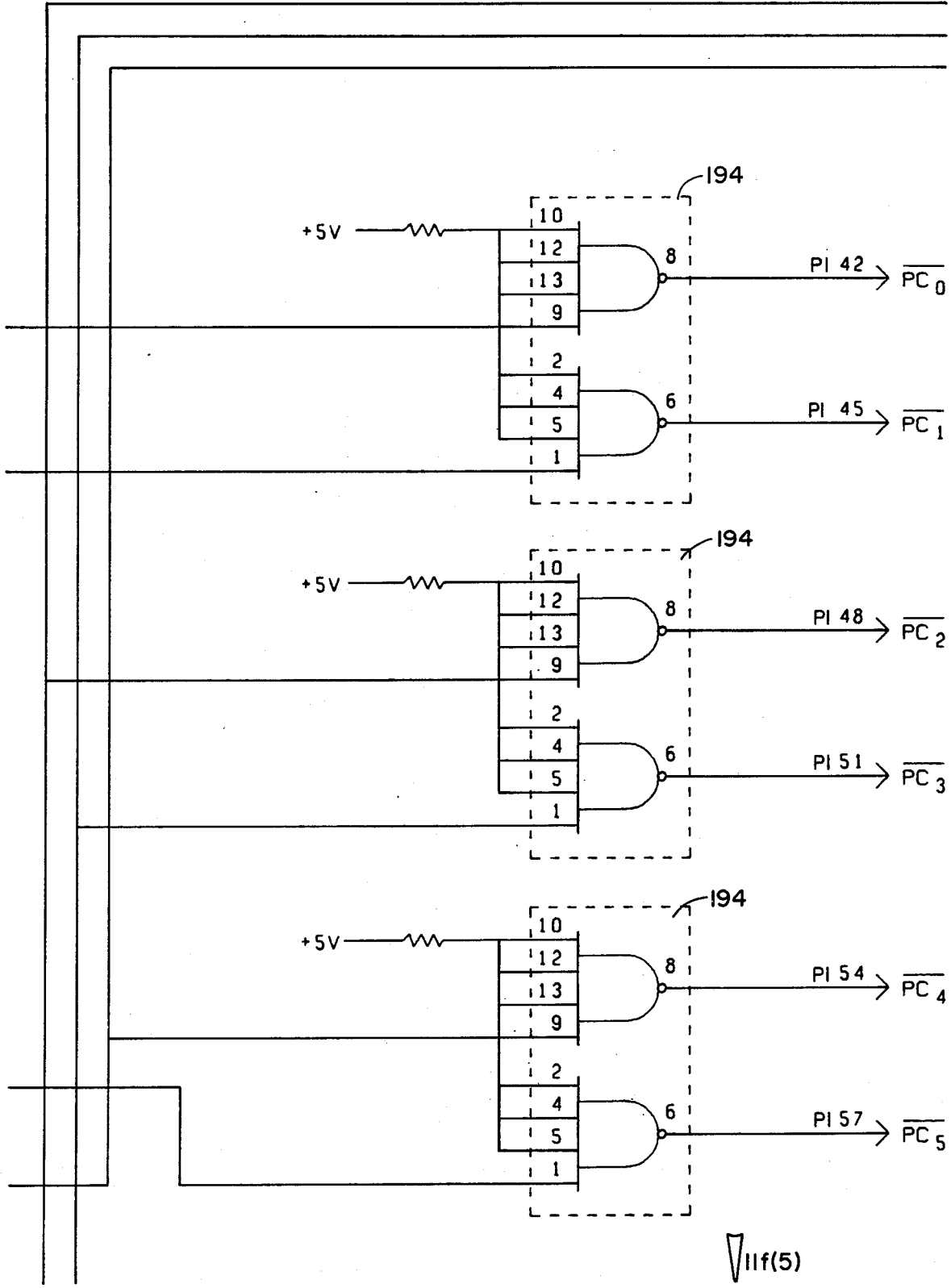
FIG.11f(2)

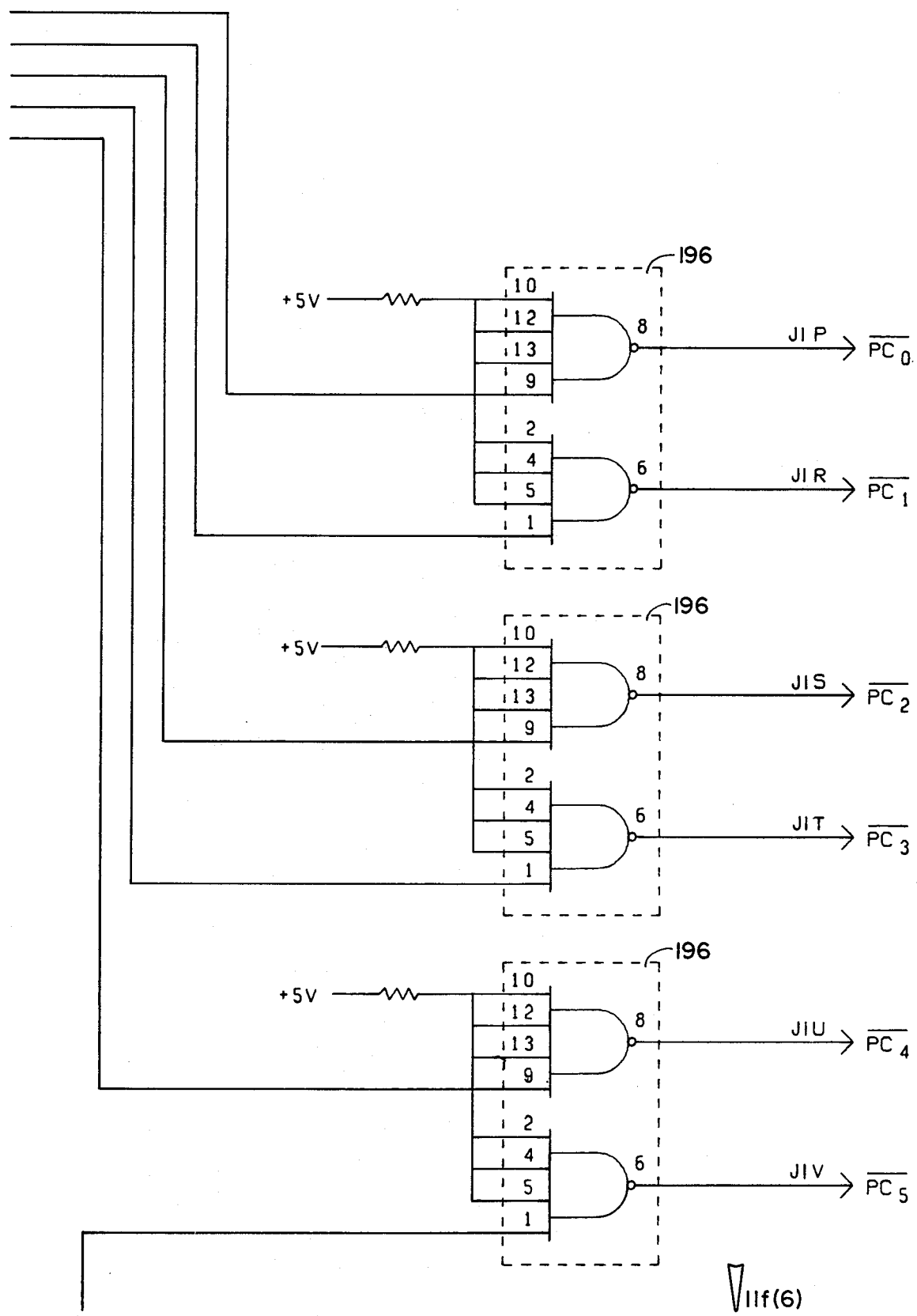
FIG.11f(3)

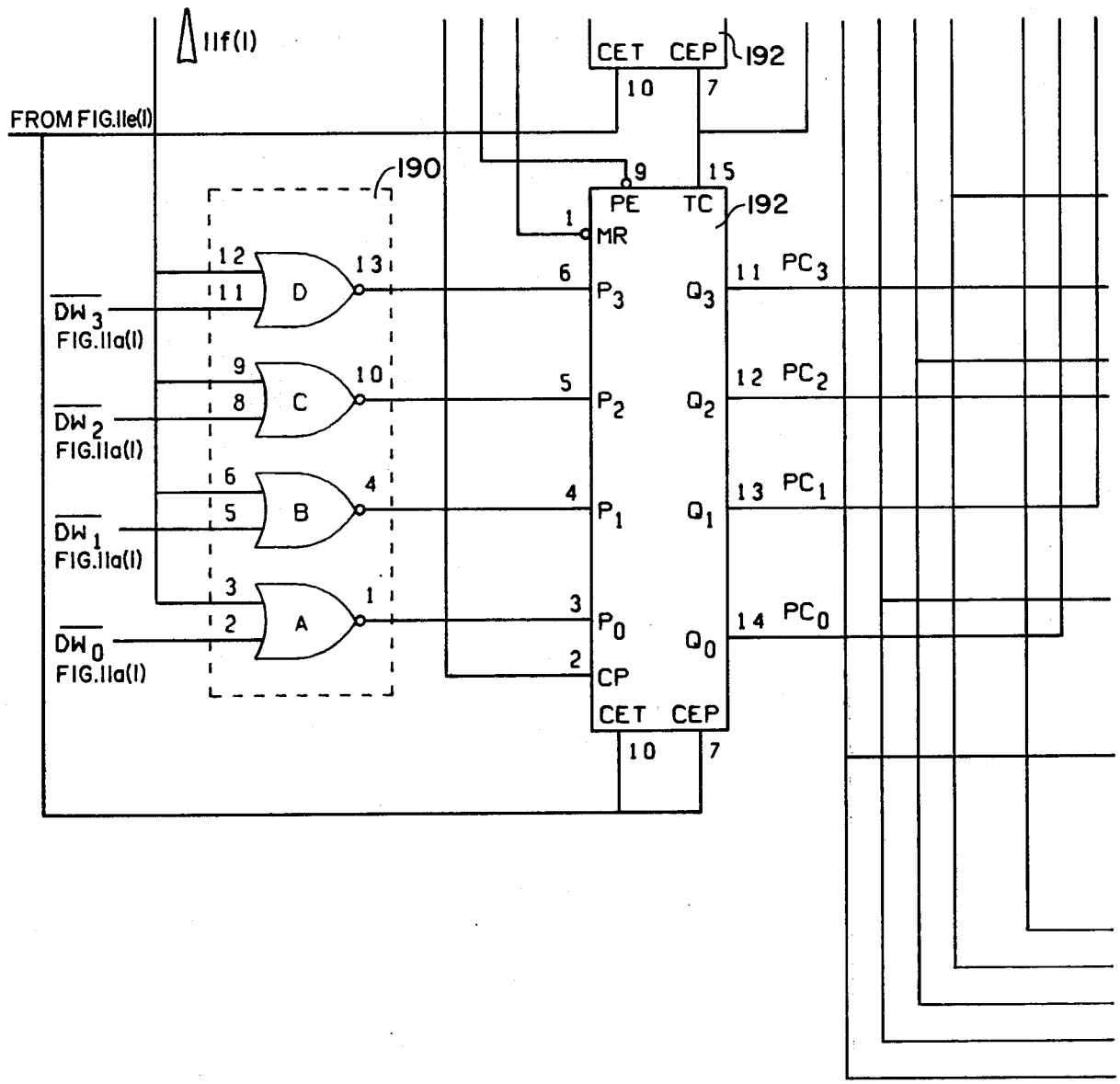
FIG.11f(4)

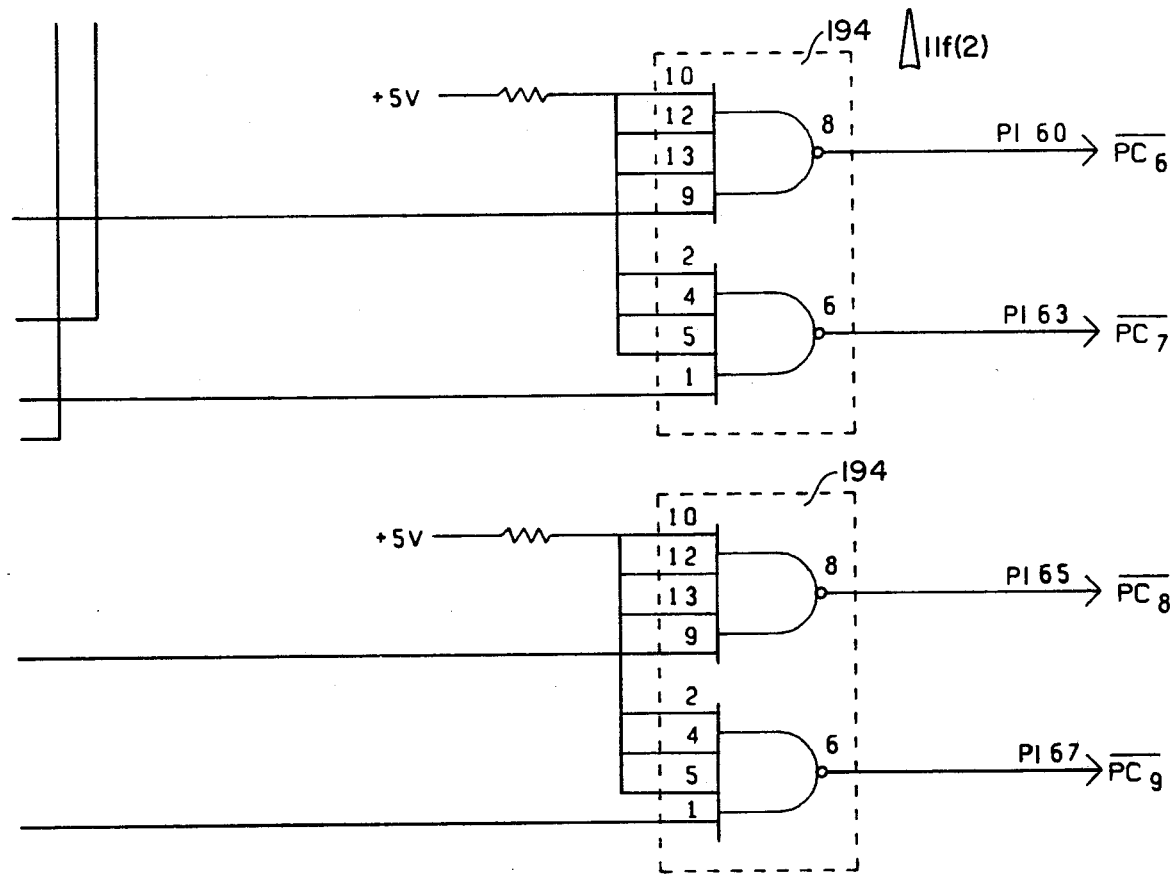
FIG.11f(5)

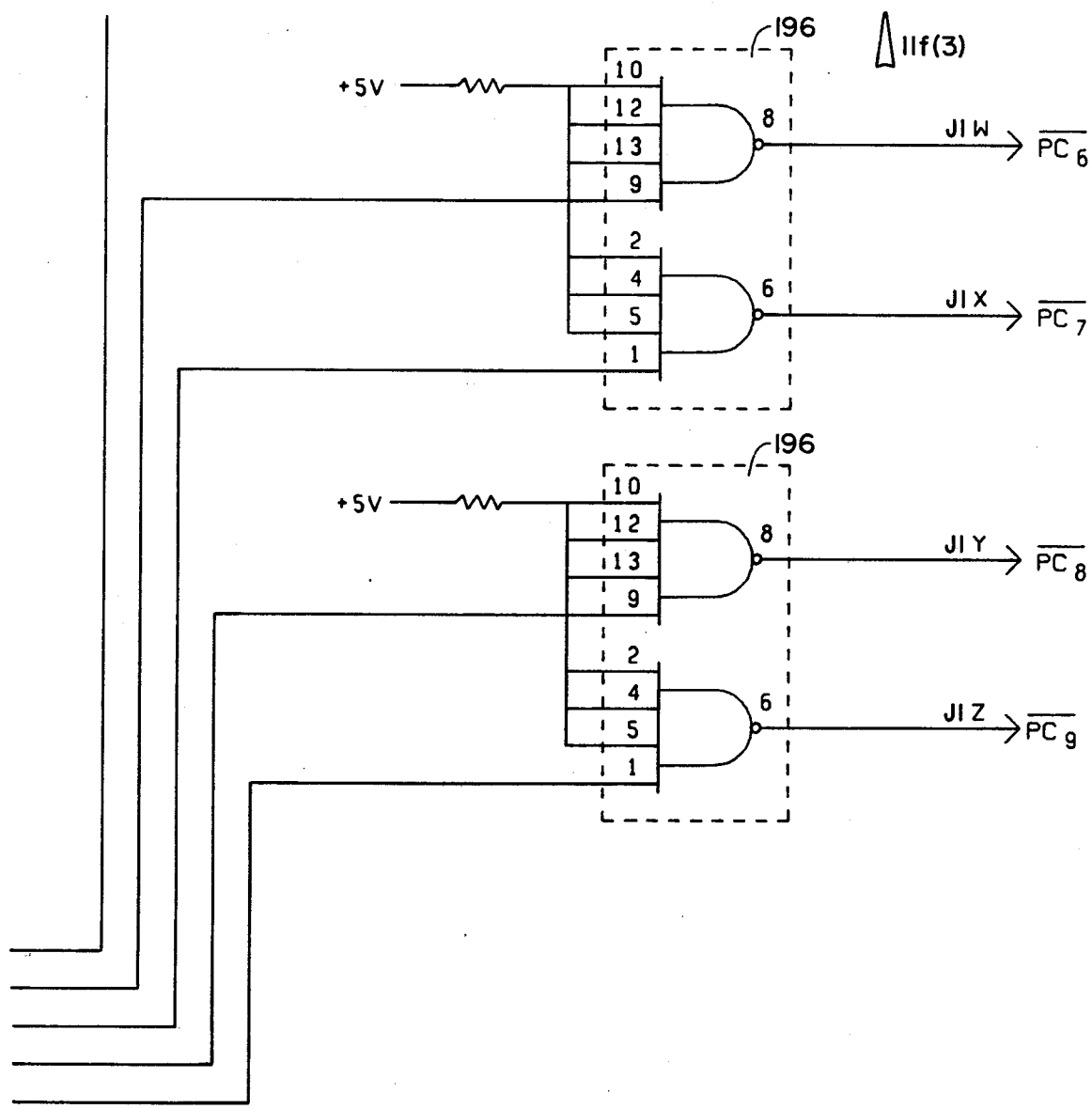
FIG.11f(6)

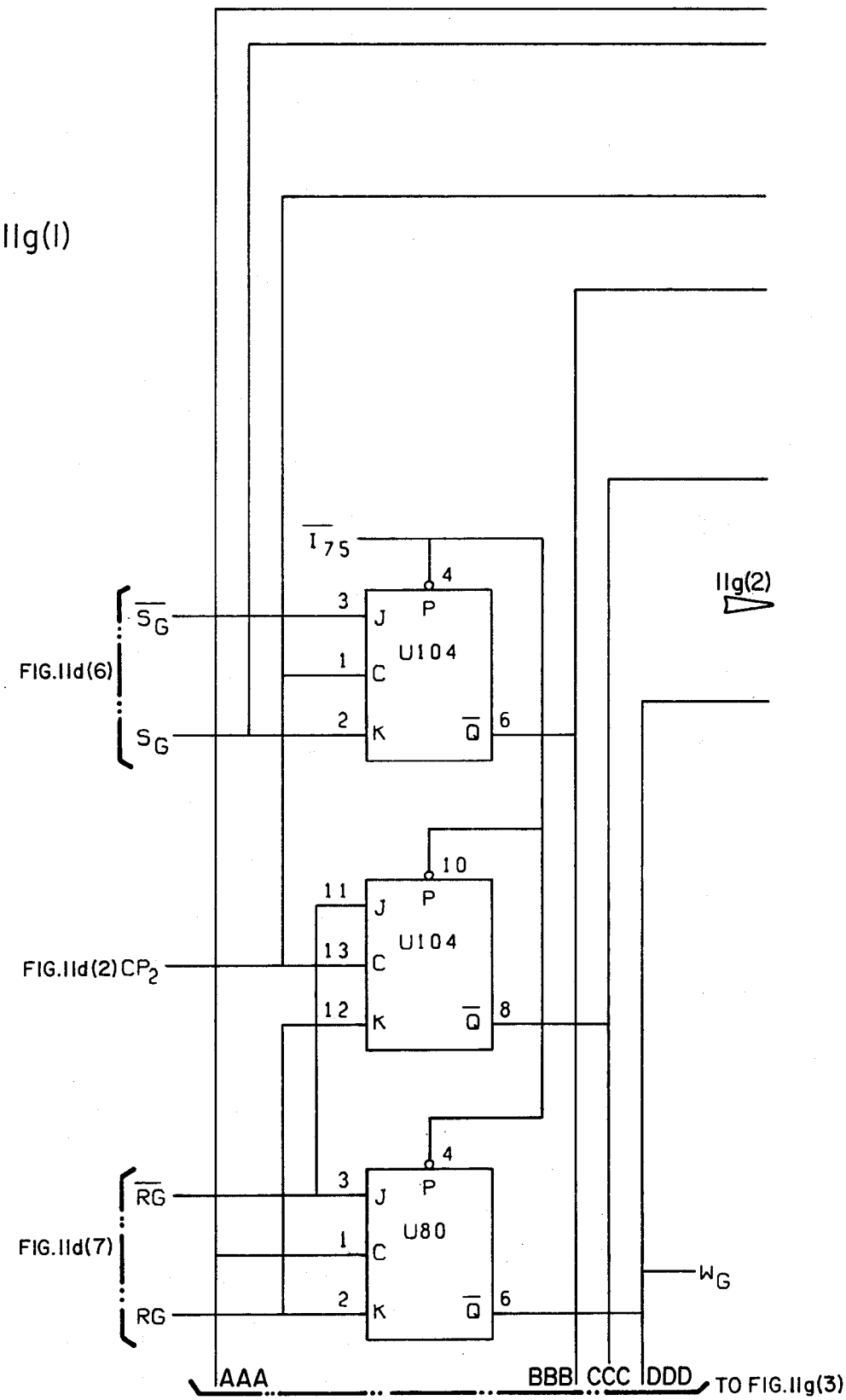

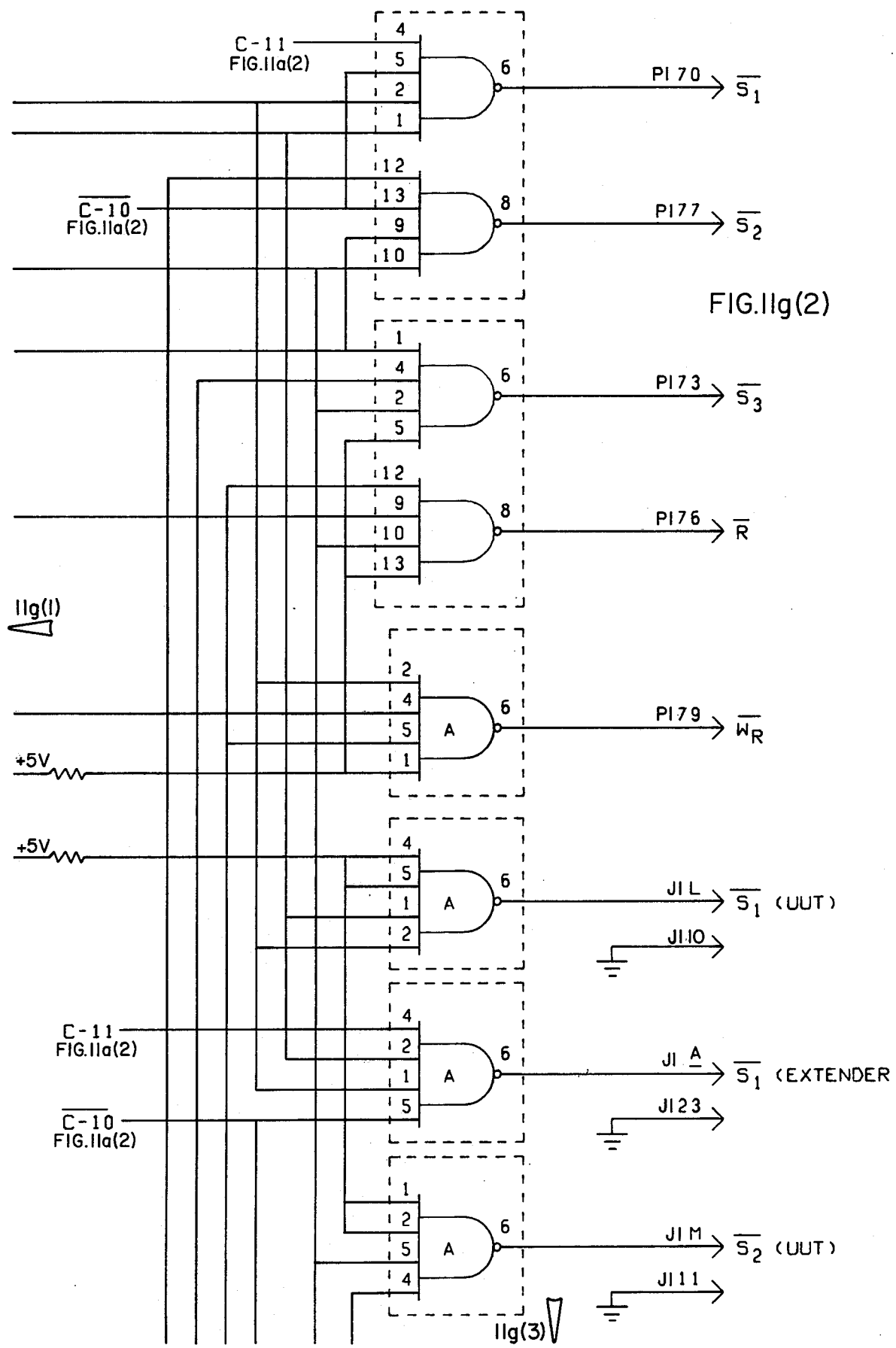

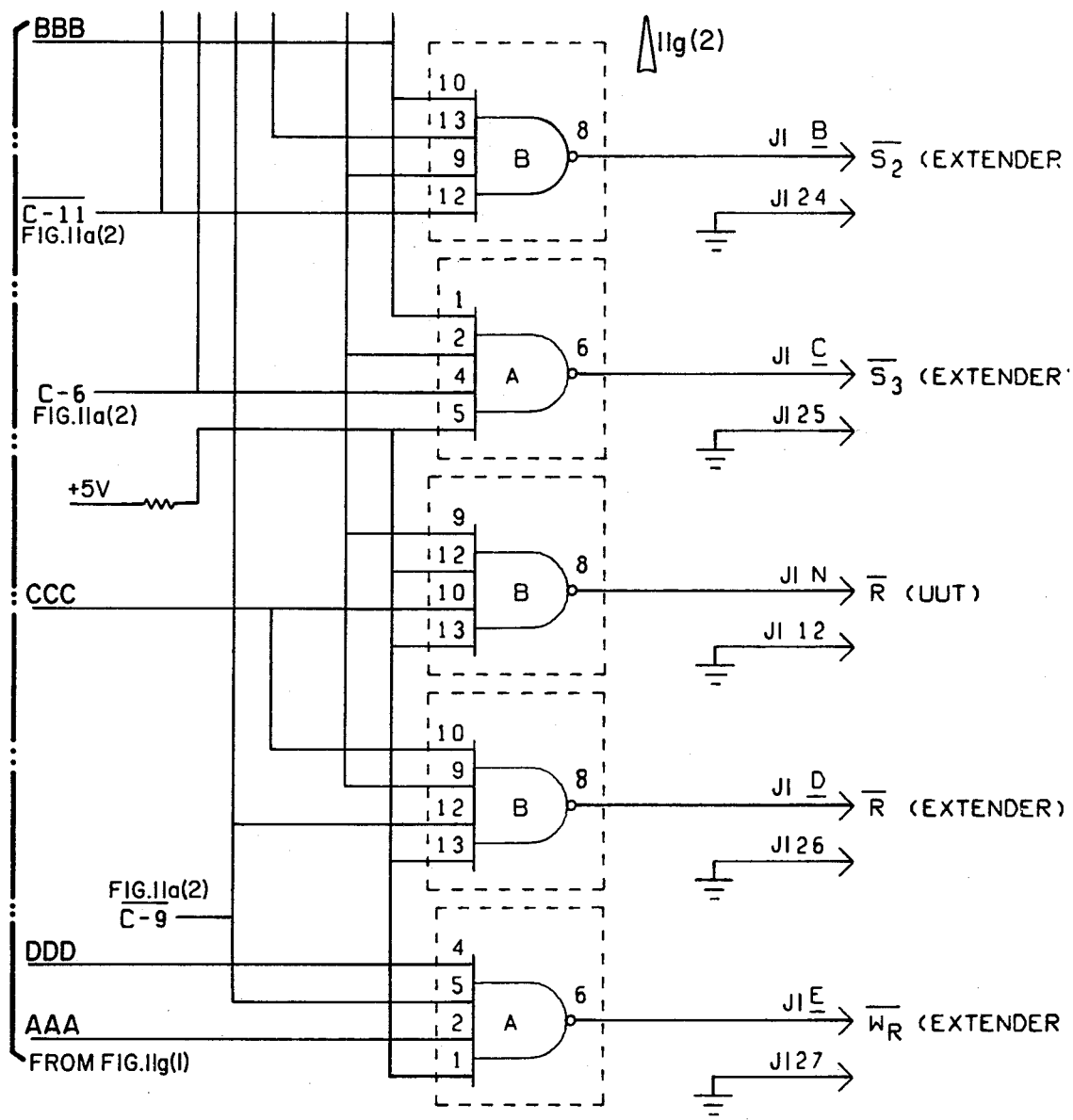
FIG.11g(3)

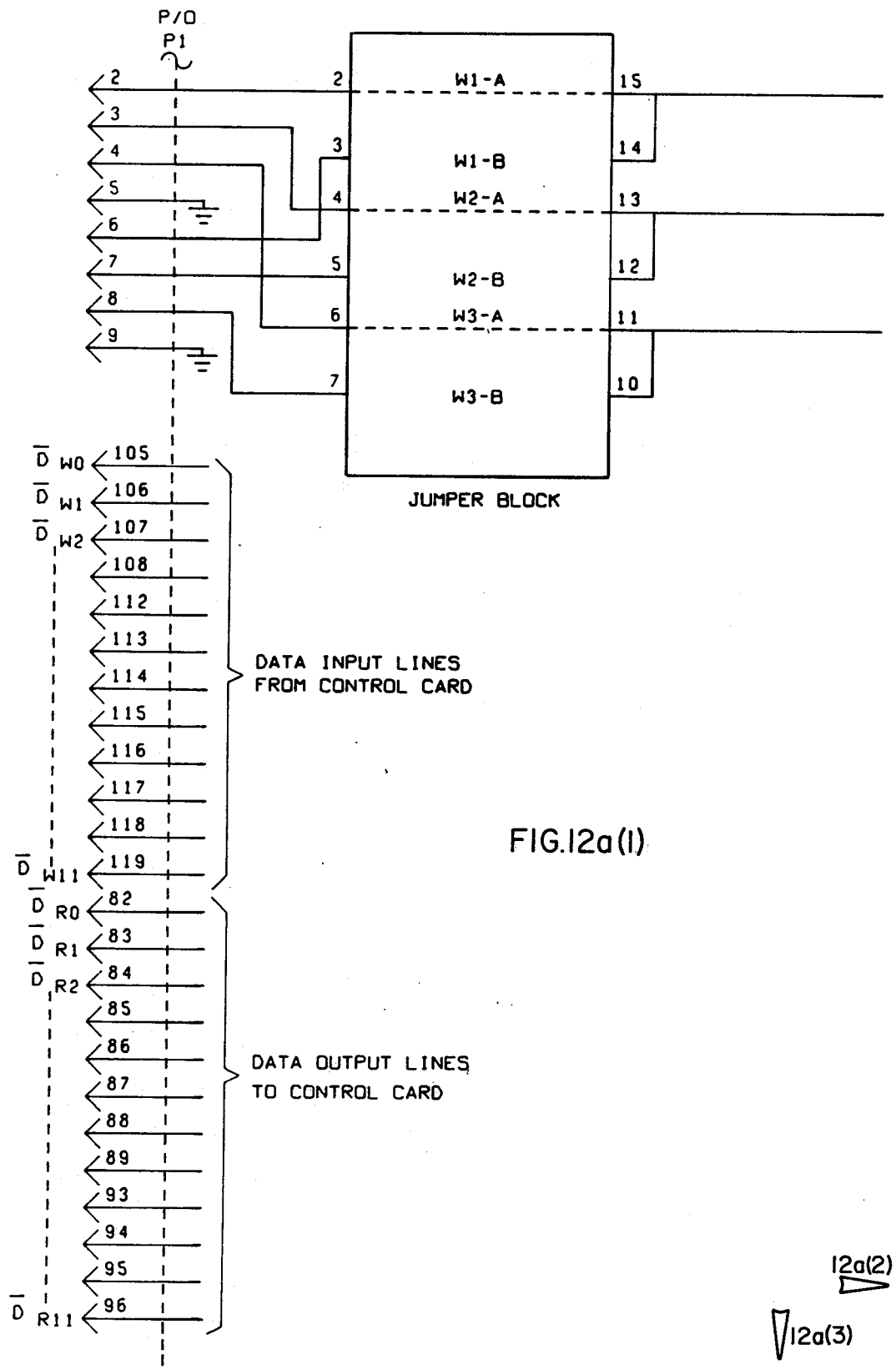
FIG.12a(1)

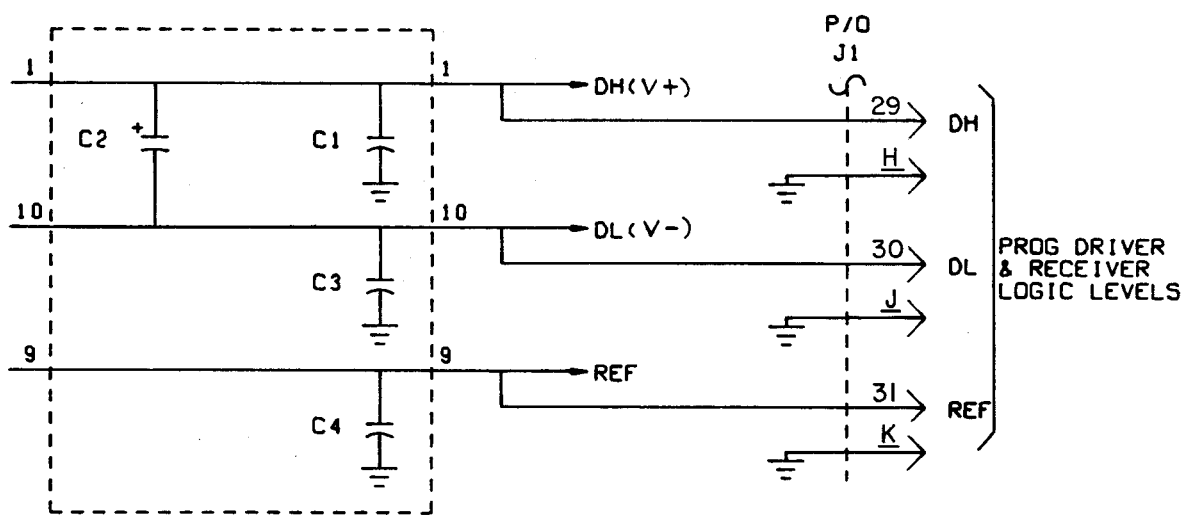
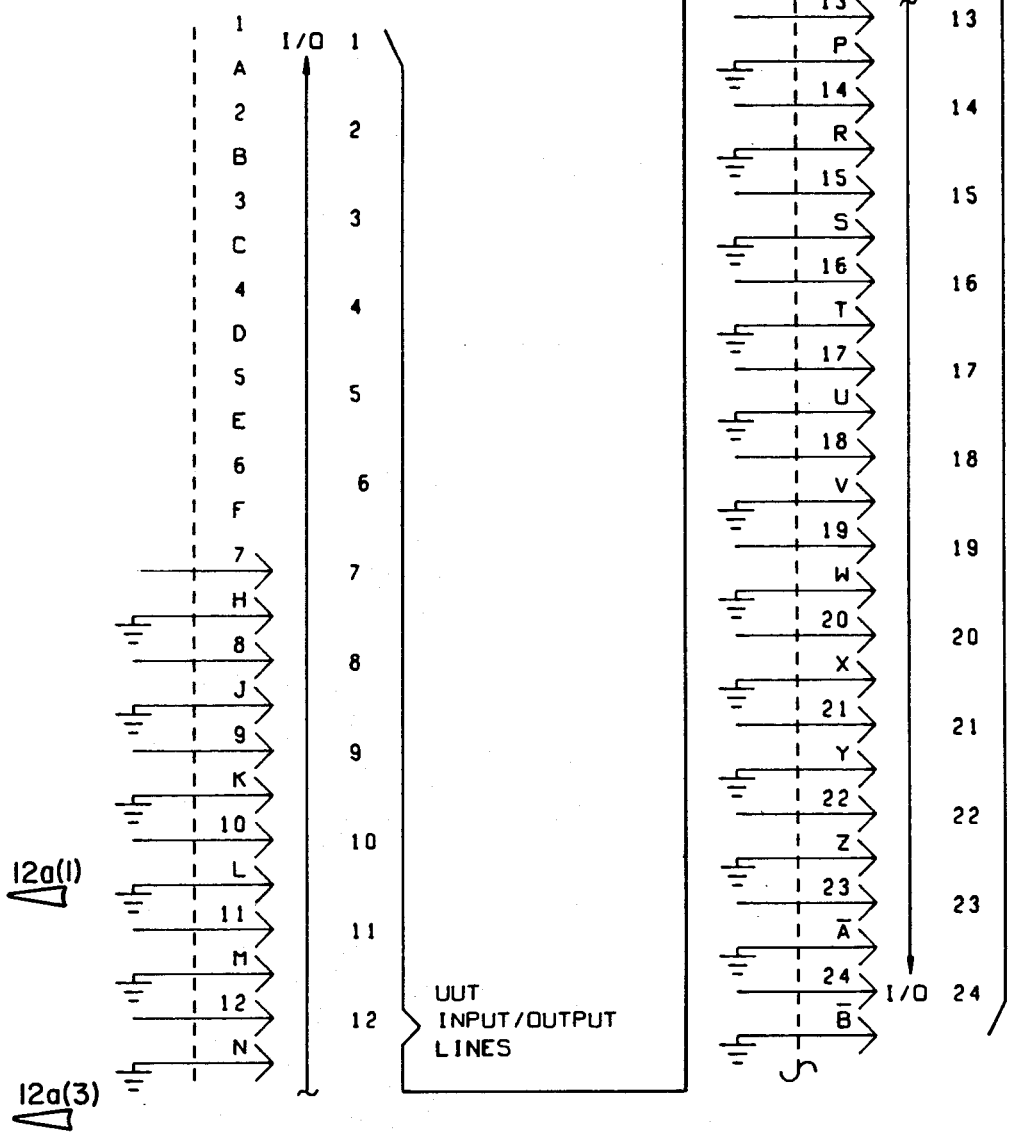
FIG.12a(2)

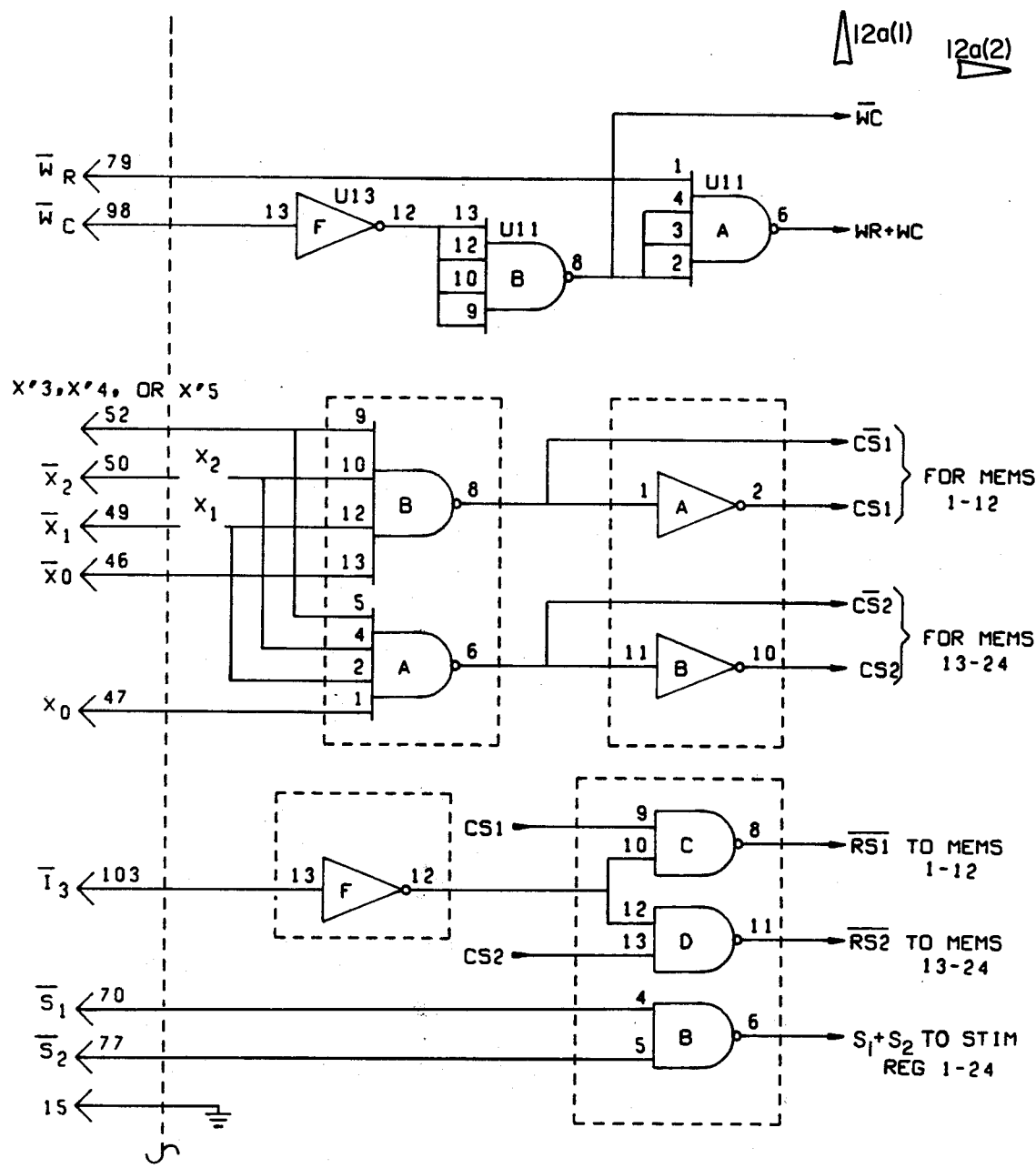
FIG.12a(3)

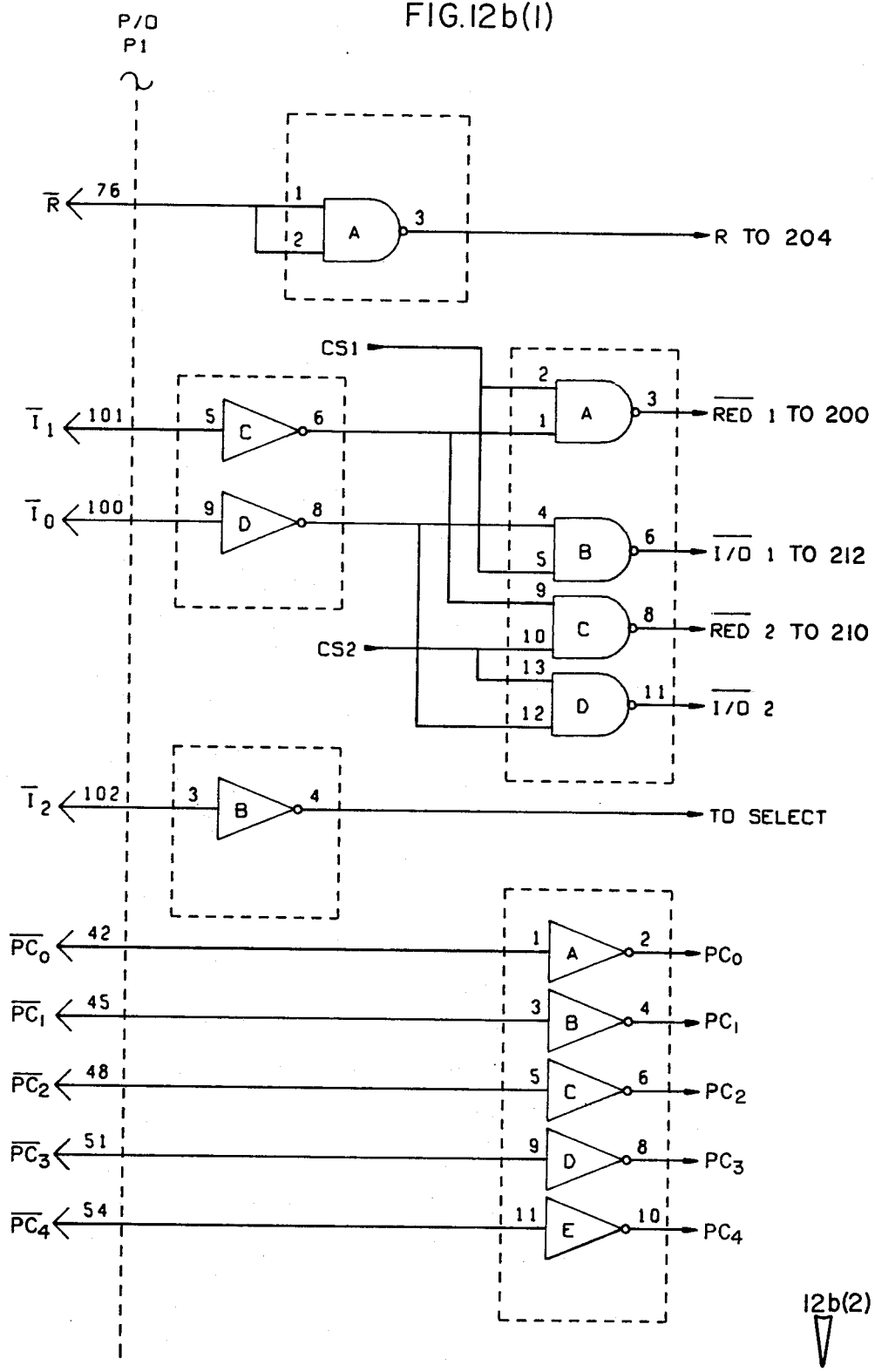
FIG.12b(1)

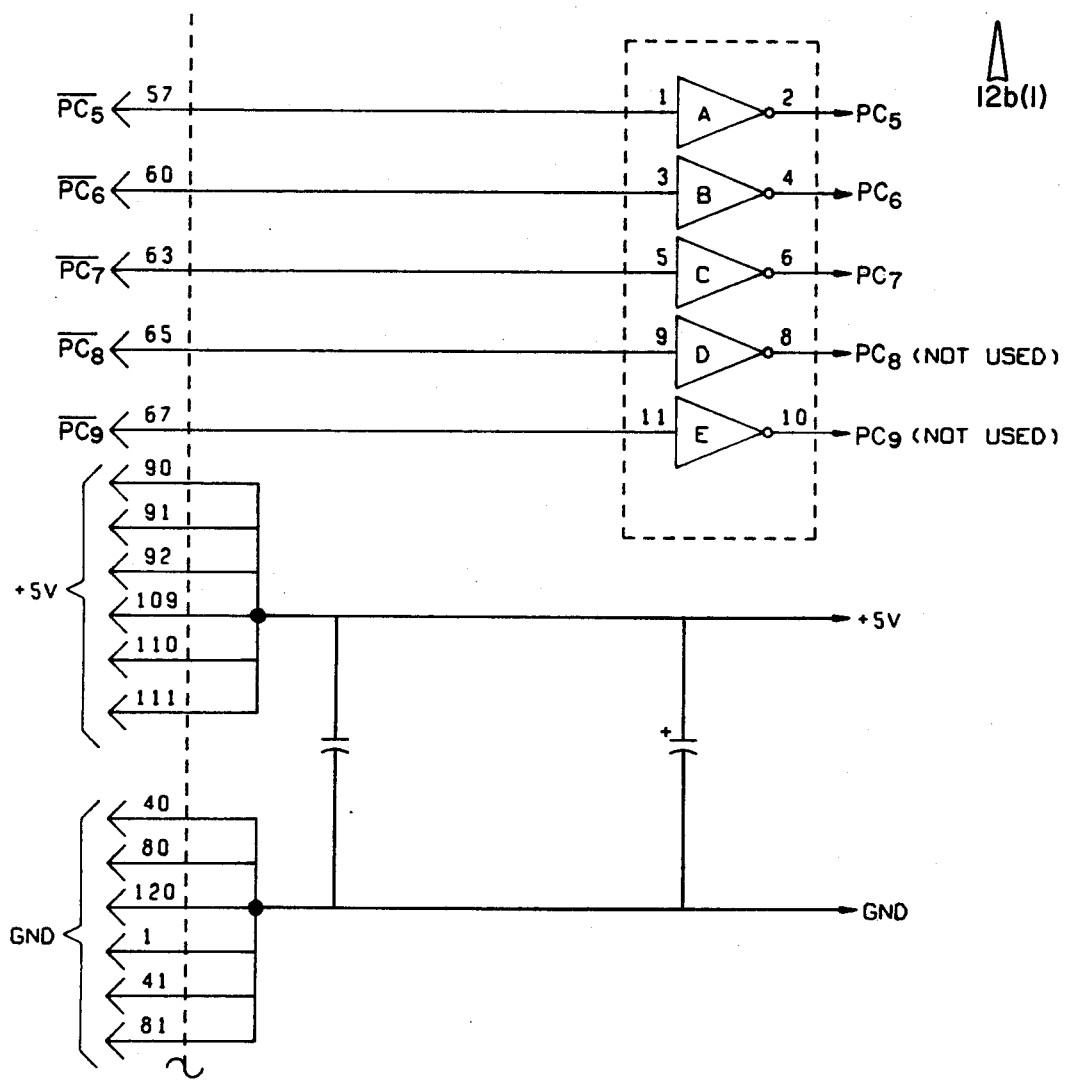
FIG.12b(2)

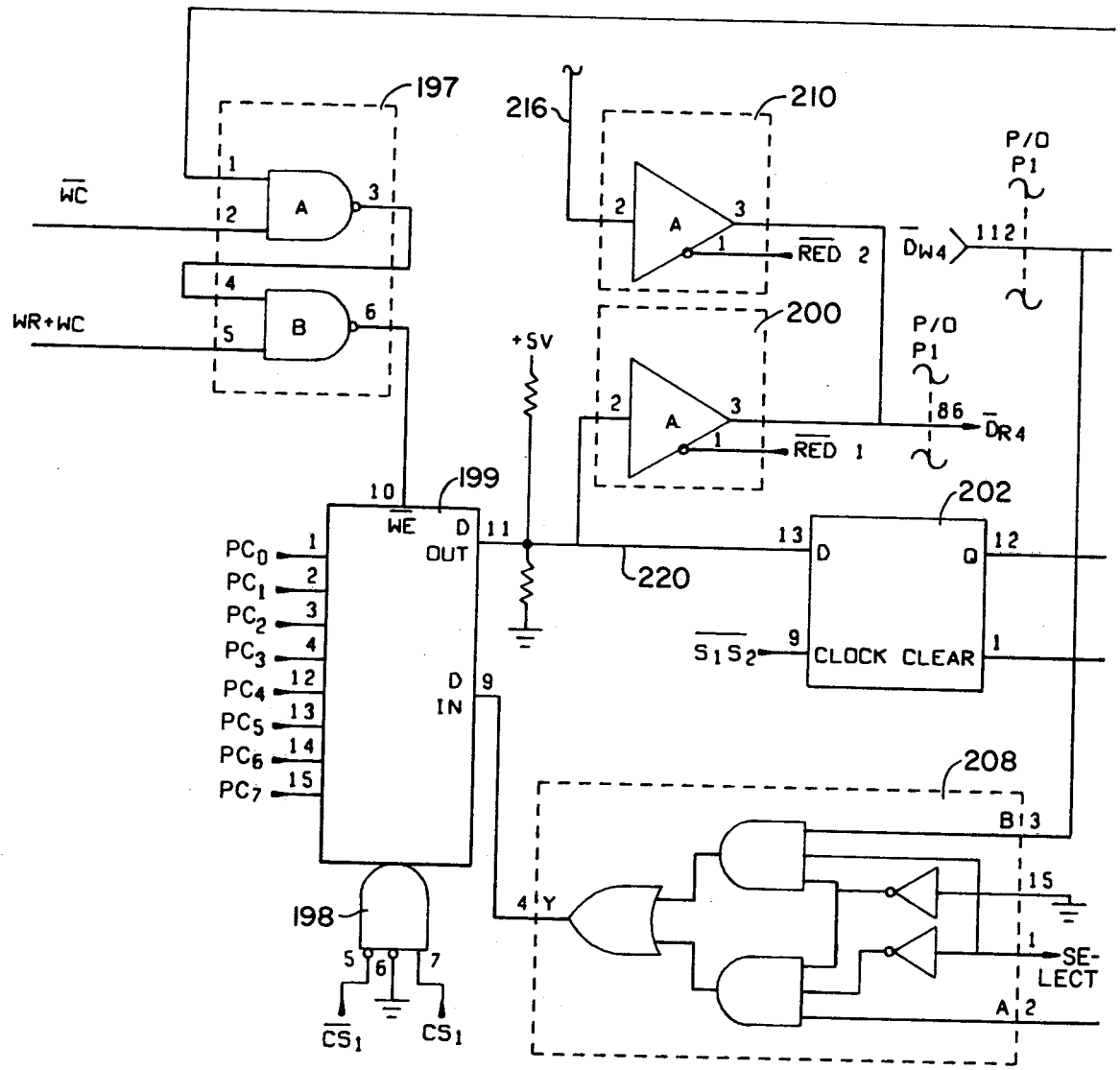
FIG.12c(1)                    12c(2)▷

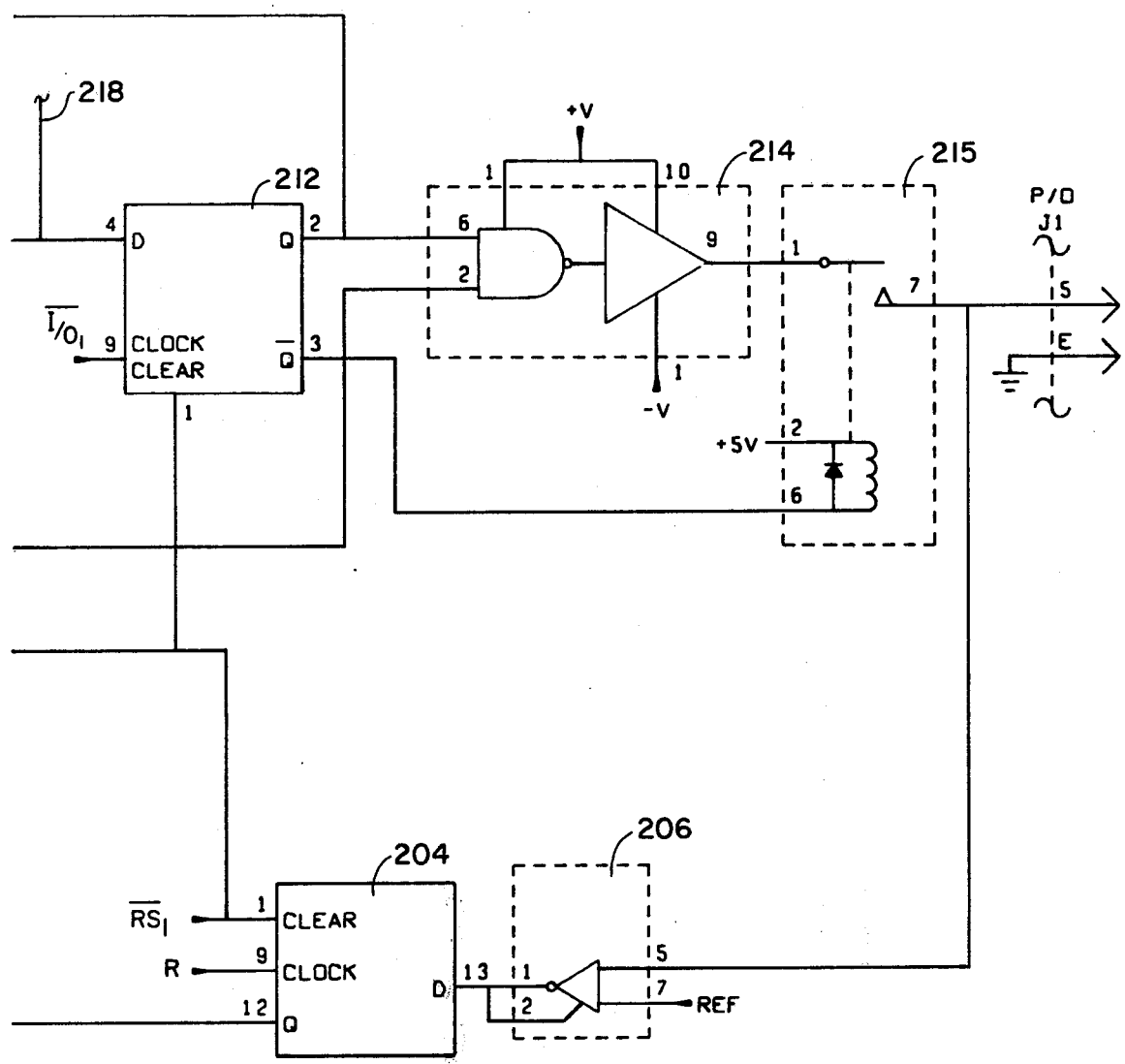

DIGITAL STIMULUS GENERATING AND RESPONSE MEASURING MEANS

BACKGROUND OF INVENTION

1. Field of Invention

This invention pertains to automatic test equipment which will allow the execution of digital test programs for testing complex modules or black boxes and provide an output of unit under test faults and fault diagnosis.

2. Prior Art

Generally speaking the prior art suggests means for digitally testing elementary types of electronic products by means of applying static logical input combinations to the item being tested, or by means of a number of pseudorandom data words being circulated through the item being tested and then being checked periodically for coincidence against a known truth table of data words, or by means of coupling stimuli signals from shift registers to a unit under test.

SUMMARY OF INVENTION

In reference first to the prior art this invention relates to apparatus other than that using punch card instructions that are incapable of providing high speed memories whereby dynamic testing as well as computer control for dynamic testing of complex devices is not possible.

Further this invention relates to a highly sophisticated automatic computer controlled digital test device which can test the most complex digital black boxes by other than the use of elementary random test techniques so that one may rely on precise software test generation techniques and test programs written in high level computer test language to dynamically test virtually any digital product (from components up to digital computers).

This invention relates to such a highly sophisticated test apparatus empolying precise software test generation techniques and test programs written in high level computer test language and stored by a magnetic disc cartridge so as to enable synchronous and asynchronous tests.

The more specific object of this invention is to provide a digital word generator (DWG) for stimulating a unit under test and provide response measurements therefrom such that:

1. Digital devices with multi inputs and outputs can have each line alternately programmed as input and output.
2. Each unit under test input and output can be stimulated with programmable logic levels over a wide voltage range. (−20V to +20V)
3. A frequency range from 0 to 10MHz can be programmed under internal or external control.
4. It is possible to store over 1000 bits of stimulus or response data for each and every input and output with a device having in excess of 491,500 bits of high speed memory capacity.
5. Minimum crosstalk and transmission line characteristics permit high frequency testing.
6. Testing is computer controlled and operable in conjunction with magnetic disc systems which are used for mass storage.
7. Burst test lengths can be programmed from 1 to 4095.
8. Continuous and gated modes of operation are incorporated into its design.
9. Timing control can be turned over to the unit being tested.
10. Testing determines if unit under test is operational or faulty with isolation of malfunction as is found.
11. The test apparatus has an ability to program in 50 nsec increments from 100 nsec to 409.5 msec the time delay from when stimuli are applied to when responses are sampled.
12. Tests are programmable from a high level test oriented computer language.

Another way of stating the object of this invention is that it is intended to be disclosed hereby a component for use in computer controlled test systems so as to permit testing of circuitry at the normal clock rate with anywhere from several hundred to over a thousand test patterns per burst using a parallel test point interface of several hundred individually programmable test points.

A more particular expression of the object of this invention aforesaid is in the use of the device to be disclosed in computer controlled digital test systems for testing digital circuitry with up to 256/1024 test patterns for up to 480 digital Input-Output (I/O).

Other objects and advantages will appear to those skilled in the art from the following:

DRAWING DESCRIPTION

FIGS. 9 and 9A are key sheets showing the relative position of multiple sheet FIGS. 10, 11 and 12;

FIG. 10 is inclusive of eight sections, a, b, c, d, e, f, g, and h that combined are representative of a logic diagram of control card module of FIG. 5, with each section being characterized as follows:

FIGS. 10 a (1), (2), (3) and (4) are logic diagrams of the input output interface and processing logic;

FIGS. 10 b (1), (2), (3), (4), (6), (7), and (8) and (9) are logic diagrams of a decoding means and instruction processing logic;

FIGS. 10 c (1), (2), (3), (4), (5), (6), (7), and (8) are logic diagrams of a read-write control as to (1) through (4) and a timing sequencer as to (5) through (8);

FIGS. 10 d (1), (2), (3), (4), (5) and (6) are logic diagrams for a counter and control;

FIGS. 10 e (1) and (2) are logic diagrams of the input data buffer from a computer to memory cards of FIG. 12;

FIG. 10 f (1) is a schematic of a timing pulse matching network between the timing generator module of FIG. 11 and the output logic of FIG. 10 h; and FIG. 10 *h* (1), (2), (3) and (4) are logic diagrams of a data output portion of the control card;

FIG. 11 is inclusive of seven sections, *a, b, c, d, e, f,* and *g* that combined are representative of a logic diagram of timing generator module of FIG. 6 with each section being characterized as follows:

FIGS. 11 *a* (1), (2), (3) and (4) are schematics of an input stage with configuration and response logic sequencing;

FIGS. 11 *b* (1), (2) and (3) are logic diagrams of a clock generator;

FIGS. 11 *c* (1) and (2) are logic diagrams of a test length counter;

FIGS. 11 *d* (1), (2) and (3) are logic diagrams of an apparatus to sequence the timing for and integration of the DWG and computer;

FIGS. 11 *d* (4), (5), (6) and (7) are logic diagrams for the response gate execution signals;

FIGS. 11 *e* (1) and (2) are logic diagrams that with FIG. 11 *f* (1) outline in the timing counter signals of increment pattern, load pattern and a pattern count;

FIGS. 11 *f* (1), (2), (3), (4), (5), and (6) are logic diagrams of gates for the counters of FIG. 11 *e;*

FIGS. 11 *g* (1), (2), and (3) are logic diagrams of the timing generator's strobe generator; and FIG. 12 is inclusive of three sections *a, b* and *c* that combined are representative of a memory module of typical logic with each section more particularly characterized as follows:

FIGS. 12 *a* (1), (2) and (3) are schematic diagrams and logic of the input-output stages of the memory module;

FIGS. 12 *b* (1) and (2) are schematic diagrams of the instructional interface of the memory module; and FIGS. 12 *c* (1) and (2) are logic diagrams of a typical memory circuit duplicated as many times in the memory module as is feasible for the desired program.

DETAILED DESCRIPTION

Figure 1:
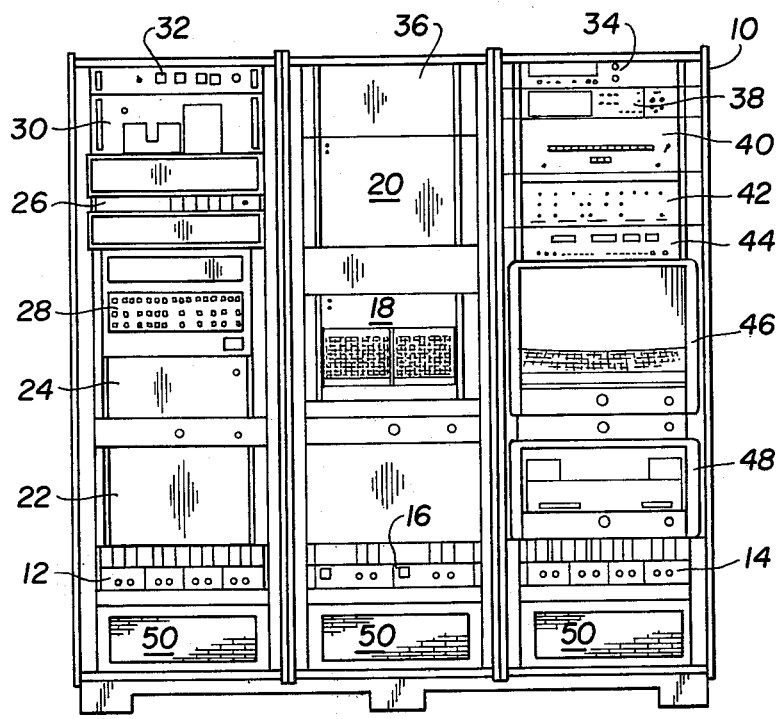
FIG. 1 is a frontal view of an equipment bay showing the environment of apparatus of this invention.

With more particular reference to FIG. 1, there is shown thereby a housing 10 having three bays for integrating a high quality test system configured of primarily off-the-shelf commercial components Hewlitt-Packard, etc. Actually there is shown by this figure a test system having eight programmable power supplies rated 0 to 55 VDC as at 12 and 14 and two power supplies (rated 5 VDC) at 16 for, respectively, powering the unit under test while furnishing programmable logic test levels and supplying operating power for a digital word generator (DWG) 18 and an extender (E) 20 therefor.

With reference more particularly to the remaining composition of the off-the-shelf apparatus of the bays in housing 10 there is a means to switch inputs to high frequency instruments in the form of a modular switch and coax relay control 22.

Above this there is a power supply 24 for driving a dual disc drive 26 of a mass memory storage for cataloged programs. Between these components is a digital computer 28 with this bay being completed by a tape reader 30 and a power control unit 32.

As stated previously the center bay includes its power supply 16, a DWG 18 with an extender (E) 20 therefor. It is completed by a crossbar switch 36 to switch inputs to a multifunction meter 38 in the third bay beneath a counter 34.

This third bay is completed by the installation of a multiprogrammer 40 to control a pulse generator 42 and the power supplies 12 and 14. Beneath the pulse generator 42 is a function generator 44, a keyboard display terminal 46 and a line printer 48. In all three bays there are blowers 50 to keep the components at the proper operating temperature.

Figure 2:
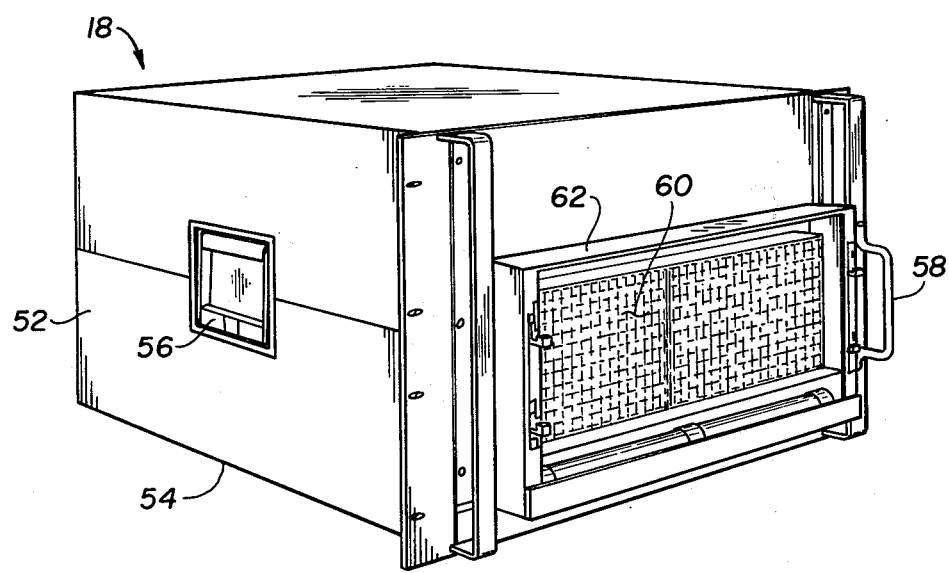
FIG. 2 is a perspective view of the housing for apparatus in accordance with this invention.
Figure 3:
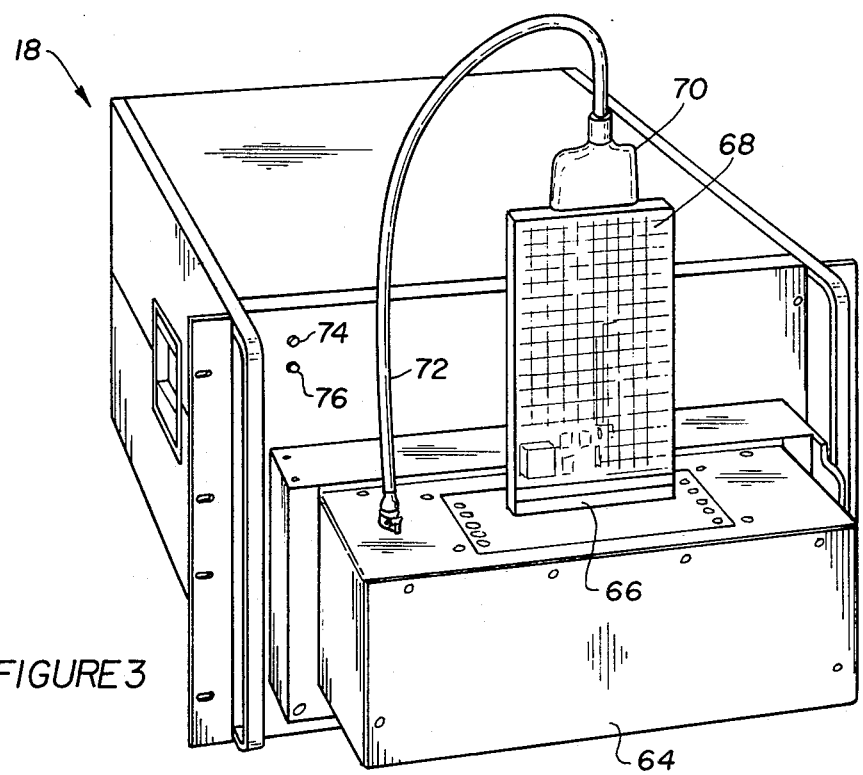
FIG. 3 is a perspective view of the aforesaid housing to which is mounted an interface device for plug in circuit card testing.

With reference now to FIGS. 2 and 3 the object of this invention is shown in larger detail to comprise a housing 52 having runners 54 to permit sliding installation aided by handles 56 and 58. The unit under test interface panel 60 is shown best by FIG. 2 to have a mounting collar 62 for an interface device 64 (See FIG. 3) having circuit card connection 66 to accommodate cards 68 between a test plug 70 connected by cable 72 to the device 64. Note is also made of indicators 74 and 76 that show the adaptability of the DWG to AC and DC testing.

Between the showings of FIGS. 2 and 3 one skilled in the art will readily appreciate that the DWG is able to facilitate simple programming and operation with most modern mini-computers, and it can interface with a unit under test through the panel device directly or through optional interface cables to mate other devices thereto. As shown the interface panel has hundreds of pins each of which can be for driver or comparator signals. In one embodiment constructed a 528 pin patch panel 78 was utilized.

Figure 4:
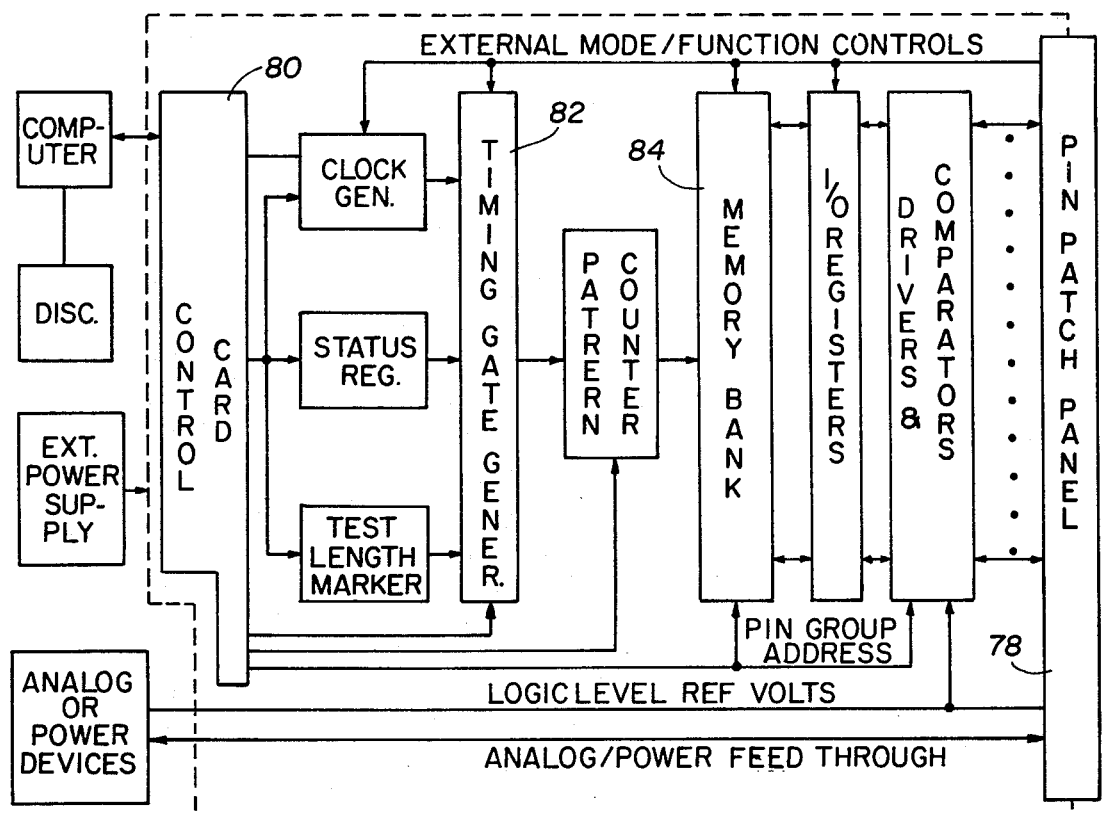
FIG. 4 is a block diagram of the logic of the apparatus of this invention.

FIG. 4 is a block diagram of an entire system using the aforesaid pin patch panel that provides, as shown, external mode/function control of the DWG's clock generator, timing gate generator, memory and the input-output (I/O) registers and signals for the analog or power devices in operation of the drivers and comparators as well as feedback. The internal power (5V DC at 45 amp) required for the DWG 18 is provided via another connection therewith and the aforesaid computer means is linked also separately via a control card. It may thus be realized how the various elements internal and external to the DWG are related so as to stimulate a Unit Under Test (UUT) and obtain responses per a predetermined sequence. As seen the main elements are the control card 80, the timing generator 82 and memory bank 84 with the card 80 and generator 82 being for setting the activation period, delivery of the stimulus and response from memory 84.

Figure 5:
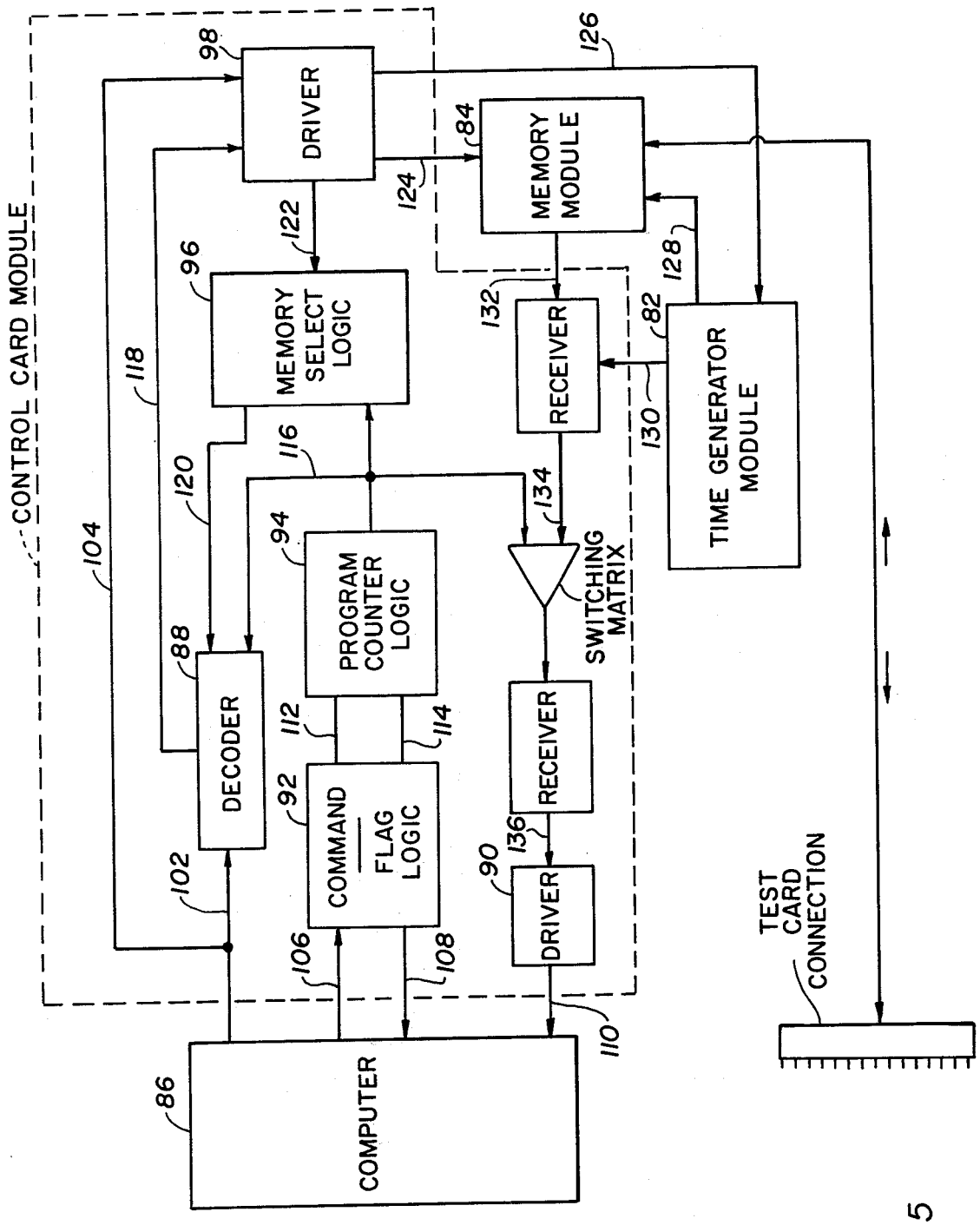
FIG. 5 is a block diagram of the control card module according to this invention.

With reference now to FIG. 5, there it is illustrated that the control card module is comprised of several logic means. Specifically, this module is connected to the computer 86 so as to have data therefrom supplied via lines 102 to a decoder 88. Data is also supplied via the line 104 to a driver 98. The computer also supplies instructions via a line 106 to command the operation of the control and receives instructions via line 108 that the control function has been completed. The remaining connection between computer and control is line 110 which is to return test data to the computer.

The control functions by reason of the command flag logic means 92 activating the program counter logic means 94 via line 112 to run through a predetermined sequence until completed as indicated by a signal via line 114. Program counter logic signals via line 116 commands the decoder 88 to pass data at preselected pulses via line 118 from the memory select logic means 96 connected to the decoder via line 120 for correlation with the data on line 104 by the driver means 98 to sequence outputs via lines 122, 124 and 126 to the memory select logic, the memory circuit 84 and the timing generator 82, respectively, the last two being separate modules.

With this connection the time generator module 82 will take the data and instructions via line 126 and thereby set-up the memory module via line 128 and a receiver via line 130, the receiver being a part of the control card module, to permit passage of instructions from the memory to the test card connection and the receipt therefrom of data. This will also instruct the receiver to pass data from the memory, received from line 132, along to a switching matrix by line 134.

The switching matrix then passes true and false logic to a receiver thence via line 136 in operation of driver 90 to provide delivery of test data via line 110 to the computer for display and/or print-out.

Figure 6:
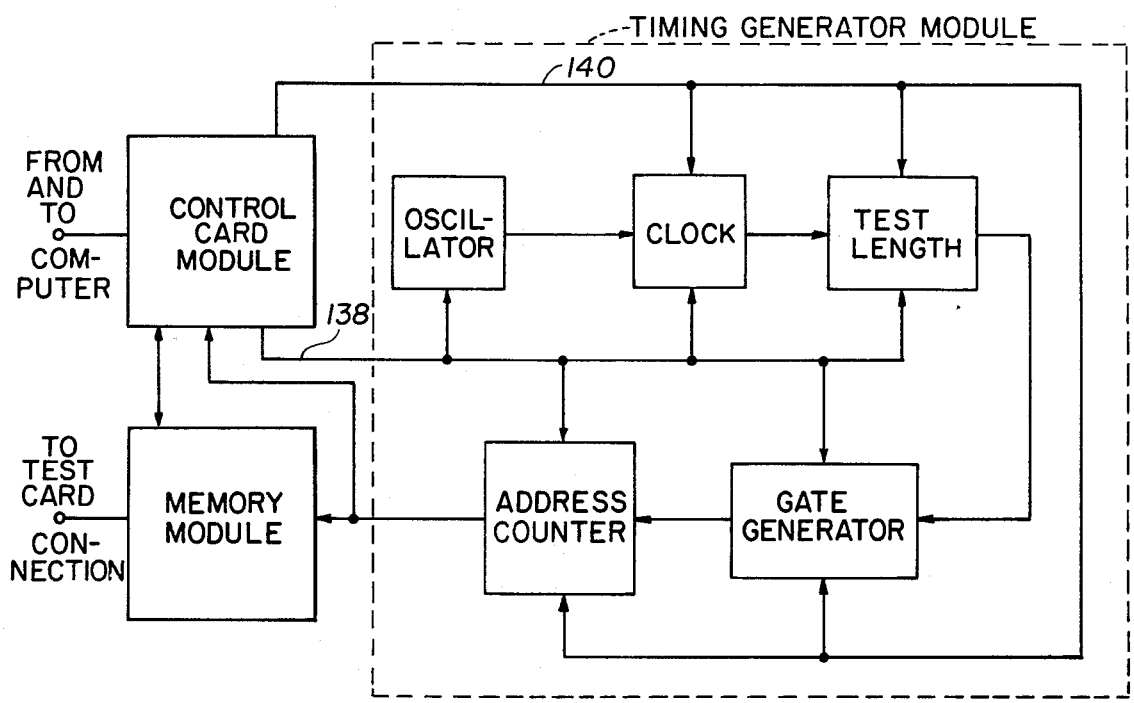
FIG. 6 is a block diagram of a timing generator module in accordance with this invention.

With regard now to FIG. 6, there is shown a block form schematic of the timing generator module having control instructions passed to each of its elements via line 138 and data for passage thereby via line 140 to certain of the elements thereof.

Figure 7:
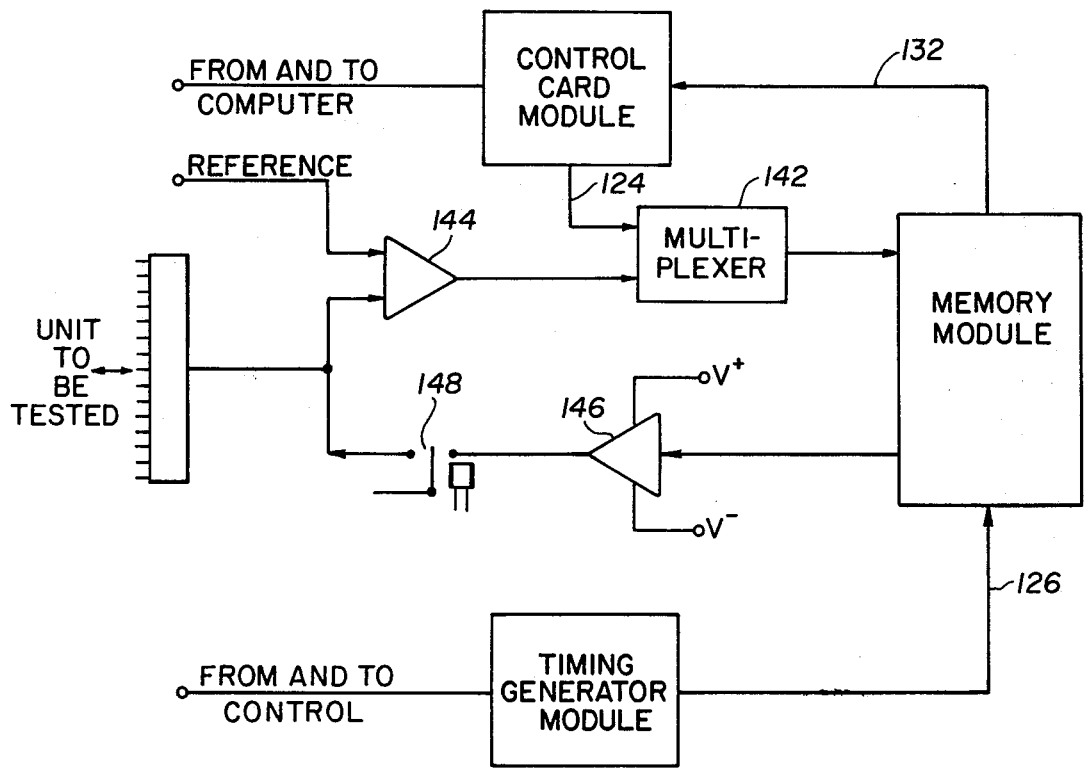
FIG. 7 is a block diagram of the integration with the switching means of the stimulus-response capability of this invention.

As for FIG. 7 the circuit connection between the control card module and the memory module is shown. More particularly, the line 124 from the control driver (See FIG. 5) is connected via a multiplexer 142 whose logic state is controlled by an amplifier 144 in relation to the control's logic to receive data from the test card connection. Instructions to this test card connection pass via amplifier 146 and a relay 148.

Figure 8:
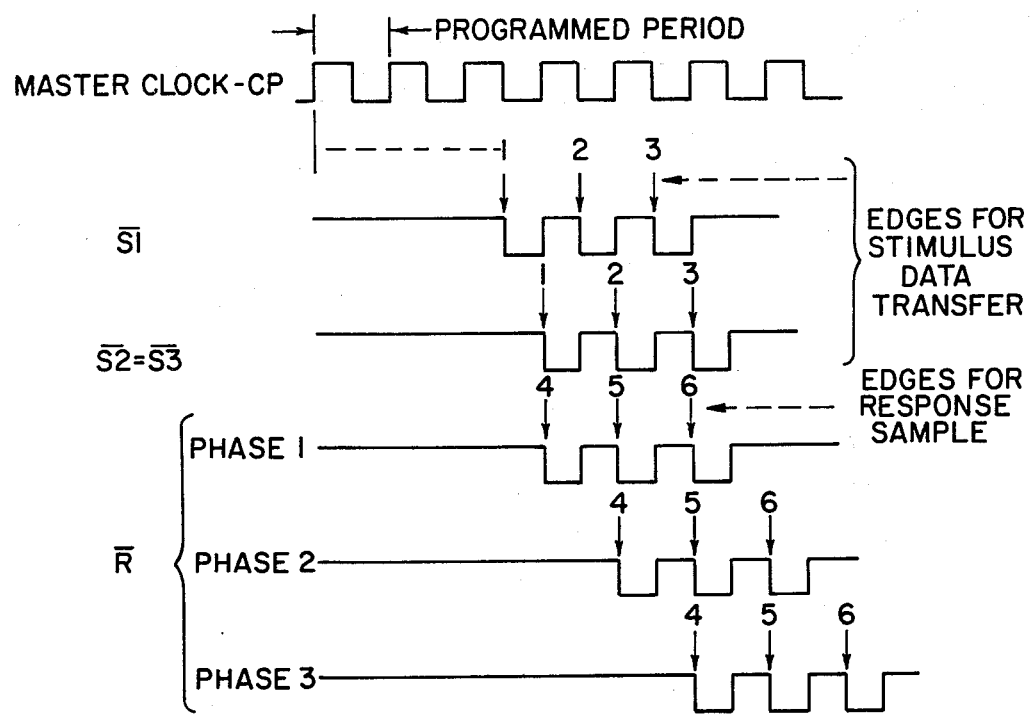
FIGS. 8 and 8A are graphical illustrations of the signal waveforms with stimulus and response strobes.

The timing and synchronization of the DWG is controlled by a master oscillator. From it a number of timing strobes are developed (See FIG. 8). There are three stimulus strobes ($\overline{S1}$, $\overline{S2}$ and $\overline{S3}$) that establish the timing for pattern data generated by the DWG. There is also developed as illustrated by FIG. 8 one response strobe $\overline{R}$ (See FIG. 11 g (2)). The frequency of these strobes is equal to the programmed DWG frequency. These strobes are active during actual test execution. Each DWG input/output line is synchronized to these strobes. Normally, INPUT's are controlled by $\overline{S1}$ and $\overline{S2}$ and OUTPUT's by $\overline{R}$. $\overline{S3}$ is an independently controlled strobe which requires the DWG hardware to be optionally configured. This option applies only to the TTL drivers/receivers and not the programmable drivers/receivers. The TTL driver/receiver card (for 24 lines) has a jumper which can be installed so that its lines operate from the $\overline{S1}/\overline{S2}$ combination or from $\overline{S3}$. Strobe $\overline{S3}$ is exactly equal to $\overline{S2}$ except that it is independently controlled.

The programmed period determines the frequency at which data is transmitted from DWG memory. Stimulus data is transmitted on the leading negative edges (See arrows 1, 2, and 3) of either $\overline{S1}$ or $\overline{S2}$, $\overline{S3}$ depending upon which is selected in the programming. Response data is captured on the leading negative edges (See arrows 4, 5, and 6) of $\overline{R}$. Strobe $\overline{R}$ can be programmed for one of three phases as shown. In selecting combinations of $\overline{S1}$, $\overline{S2}$, and $\overline{R}$, the time interval between stimulus transmittal response sample can be controlled as a multiple of the master frequency. For example, if $\overline{S1}$ and $\overline{R}$-phase were selected, the time interval would be equal to one-half the period. Likewise other combinations are possible from 1/2 to 2 periods. The period is also programmable from 0.1 nsec to 409.5 msec, so that the time interval can be controlled with 50 nsec resolution.

Actually programmable memory cards are dedicated to S1 and S2. However, TTL memory cards can, optionally, use either the combination of S1 and S2 or S3. Jumper means may be used to make the selection between these strobes.

Going back now for the moment to FIG. 4, there is shown thereby that which is described in reference to FIGS. 6, 7, and 8. Namely, the three basic elements of the DWG are the control card module 80, the timing generator module 82 and the memory module 84.

These elements comprise each a circuit board with connections P1 and J1 as appear on drawings 10, 11 and 12. These boards have a glass epoxy base which are adapted as card-ejector mechanisms (not shown) to lock and permit release of the card to a motherboard for assembly in the DWG.

Actually the control card by being the signal interface between computer and the DWG functions to decode computer instructions, generate timing pulses for control of a test, regulate loading of test patterns stored in DWG memory cards, generate instructions for test sequence, furnish termination loads for high frequency control signals from the timing generator card, output to the computer test status data stored in DWG memory and provide control for E 20 when used.

As seen by FIG. 6 the control card module comprises on its card various elements to accomplish the aforesaid. These are better shown by the logic diagrams of FIGS. 10 a, b, c, d, e, f, g, and h.

With reference to FIG. 10 a (1) there is shown means to receive COM and $\overline{DI}_0$ - $\overline{DI}_{15}$ instructions and data bits from a computer via connections P1 - 23 through P1 - 39 as aforesaid. Such means comprise terminators 11 and 13, such as Allan Bradley resistor chips whose output signals are provided to a network of inverters such as a Texas Instrument (TI) 7404-J 15, 17, 19, and 21 to invert the signals to TRUE, and by splitting off portions of inverters 15 and 17 back to FALSE logic for use in the control card. The command pulse from the computer is also processed by similar logic. Thereafter the command in the form of the FALSE Signal from the foregoing input buffer network, particularly inverter chip 21, is used to trigger a TI-74111-J flip-flop 23 (See FIG. 10 a (3)) and as a comparison for a NAND gate "A" of 25 of the TI-7437-J chip shown in three parts for clarity of logic tracing (25, 25' and 25"). Also the COMMAND lead is connected by a branch lead to a NAND gate of a similar chip, "C" of 27 (See FIG. 10 a (4)), so as to provide one of the four inputs to the NAND gates of the TI-7420-J chip shown split into portions 29 & 29' again for schematic clarity (See FIG. 10 a (4)).

The FALSE logic from portion 29' will be inverted for control of NOR Gate 31 in its delivery of TRUE logic to FLAG the operation. NOR gate 31 is also controllably linked to NOR gate 33, actually part of the same TI-7402-J I. C. NOR gate 33 is operable with comparable FALSE logic from NAND gate of chip portion 25' and Flip-Flop 23. This logic circuit is completed by a four input strobe type NOR gate shown as a portion 35 of a TI-7425-J I. C., and by the leads as shown to provide FALSE data thereto. Also a plurality of outputs to other portions of the circuit are shown and a timing sequence control signal is provided to Flip-Flop 23 from another portion of the control card (See FIG. 10 c (6)).

The Decoder Logic of the control card is shown by the several drawings of FIG. 10 b. Such logic includes five TI-74155 decoder IC's 37, 39, 41, 43 and 45. Decoder 37 (FIG. 10 b (1)) has its enabling strobe controlled by logic of the NAND gate 47, i.e., Fairchild 9007. This decoder will, with a comparable command strobe logic, enable decoder 39 (FIG. 10 b (2)) via its strobe inputs to provide enabling logic to strobe terminals of decoder 43 (FIG. 10 b (3)) that will in turn be similarly connected to decoder 45 (FIG. 10 b (3)) to complete a cascading arrangement. The remaining decoder 41 (FIG. 10 b (2)) being connected so as to be operable with logic of the write control shown in FIG. 10 c (1).

As shown the outputs of the decoders are variously transmitted to portion 49 of the TI-7404-J Hex Inverter, a NAND gate 51 forming part of a TI 7437-J I.C. NAND buffer, another NAND buffer 53, quadruple NOR Gate 55 (a TI7402-J I.C.) and NOR Gates 57, 59, 61 and 63 of similar I.C. packages. This decoder circuit is completed by interposing a quadruple, 2- input positive NAND buffer 65 (TI7437-J) in the circuit and using TI's 74128-J 50 OHM Line Drivers 67, 69, 71 and 73 for delivering the output logic shown therefrom by FIG. 10 b (8) and (9) to the timing card portion of the DWG (See FIG. 11 a (3)).

With reference to FIG. 10 c (1) there are shown terminals "A", "B", "D", and "E" corresponding to the same terminals shown by FIGS. 10 b (2) and 10 a (4). Referring to "A", "B", "D" and "E", "A" is to transmit output of decoder 37, "B" is to transmit logic to decoder 41, and "D" and "E" transmit logic from decoder 39. More specifically the sequentially selected output of decoder 37 is provided to an inverter 75, FIG. 10 c (1), and thence to a data input of a flip-flop 77 whose output is inverted by I.C. 79 to provide False, True logic for I.C. 47 and portion 63 of the TI 7425-J I.C. of FIG. 10 b (6) as well as the enable logic for decoder 41.

As for terminals "D" and "E" common to FIGS. 10 c (1) and 10 b (2) they connect the sequentially different outputs of decoder 39 to Read Control Logic and Write Control Logic so as to obtain LOW write and read logic in sequence by means of Flip-Flops, as shown by FIGS. 10 c (2), (3) and (4), for control of I. C. 47 and various other logic of the decoder means (See FIG. 10 b (6)).

With reference to the logic of FIGS. 10 c (5), (6), (7), and (8), a means to obtain a timing sequence is shown to include an oscillator 81 which with a power supply at pad 2 of the "P" connector of the circuit board will control NAND gate 83. This will provide a timed logic sequence that will, when of equal sign to that of pad 3 of the P-1 connector, provide, via NAND gate 85, a clock pulse for Flip-Flop 87. This will permit instructions from NAND gate 89 to be delivered whenever a busy signal is not operative on the "k" input of the flip-flop 87 from FIG. 10 g (1). A clear signal, as with the other flip-flops 97 of FIGS. 10 c (6), (7) and (8) is provided by the command/flag logic of FIG. 10 a (4). The output of flip-flop 87 is provided to NAND gate 91 which when comparable with the clock pulse will provide a logic signal to NAND gates 93 and 95 that will provide a clock pulse to I.C. 25 of FIG. 10 a (3) and the flip-flops 97 arranged in series. The preset inputs, are connected to a source via resistor means 99. This arrangement is common to all power supply connections in the drawings. Therefore the power supply level is a logic signal used by NAND gates 93 and 95 to provide pulse "CP" when comparable with the output of NAND gate 91. Quadruple 2-input NAND buffers 101 and 103 similar to buffer 65 complete the timing sequence circuitry that is to deliver clock logic to various elements of the control card as shown by following the legend on FIG. 10 c (8).

Next for discussion is the portion of the control card which has the responsibility to provide card select logic to the system. Actually this circuitry may be characterized as that providing "X" counter and control logic. Using similar, if not portions of the same logic means in other figures, data from the hex inverters 15, 17, 19 and 21 is introduced to parallel load registers 105 and 107 such as TI's 74174-J hex D-type flip flops. A binary counter means takes the output of the registers 105 & 107. This means is formed as two related 4 bit binary counters 109 and 111 such as Fairchild Semiconductor's 9316 shown by FIGS. 10 d (4) and (5). The output of register 105 is also directed to a digital comparator means to which is also provided outputs from the binary couter means, the comparator means being provided by two related Fairchild Semiconductor's 93L24 low power 5-bit comparators 113 and 115.

From the digital comparator portion 115 the A<B output is provided to the decoder 41 for enabling same upon the proper TRUE-FALSE Logic therefrom.

The "X" logic output (FIGS. 10 d (3)) and (6) from this counter and control is, as the legend indicates, provided to the data output section of the control card, see FIG. 10 h (l), and the circuit board connector pads P1 and J1 at the indicated numerical locations.

FIGS. 10 e (1) and (2), 10 f (1) and 10 g (1) show buffer logic and matching network logic that is needed between various circuits, i.e., to get data to the DWG memory, see FIG'S. 10 e (1) and (2) showing a plurality of TI's 74128J line drivers; from the memory, see FIG. 10 f (1) showing an Allan Bradley resistor IC 314E-331681; and, address logic from the DWG timing generator to the output stage and the timing sequence means, see FIG. 10 g (1) where similar IC's as aforedescribed will be readily recognized by one skilled in the art.

With reference to the 10 h series of figures there is shown the logic necessary to provide data back to the computer. At the risk of oversimplification this logic involves TI's 7400-J Quadruple 2-input NAND gates to process comparable logic (See I.C.'s 117, 119, 121, 123, 125 and 127) for registers that will hold data for call by the computer. When it is stated to process comparable logic this is in reference to TRUE-FALSE logic from timing generator matching network and the counter and control as related to logic of the inverter 21' being an unused part of Hex Inverter 21 aforedescribed. Finally data from the memory is compared with the aforesaid by a network of 4 input NAND gates and processed by two networks, see FIGS. 10 h (2) and (4) of six flip-flops having each a common clock and clear functioning as twelve-bit registers so as to provide logic for the delivery of output data $\overline{DO}_0$ - $\overline{DO}_{11}$ via a NOR gate circuit of FIG. 10 h (3).

Having now completed a description of the control card for the DWG that one skilled in the art can readily construct from the logic diagrams and explanation, brief as it might be, it is desired to similarly described a preferred construction for a timing generator card to take data and instruction and "X" memory address logic and generate "y" address logic within a sequence while providing for terminating loads for critical high speed functions as may originate from the foregoing control card or a memory card as will be described hereinafter.

As seen in FIGS. 11 a (1), (2), (3) and (4) data is received from the control card via resistor chip 129 (FIG. 11 a (1)) and instructions via similar chip 131

(FIG. 11 a(3)) and counter and control address via chip 133, the latter being shown so as to detail the circuitry of these chips in FIG. 11 a (3). The data logic is then processed by configuration registers 135, 137 and 139 clocked by load pattern counter logic and cleared by logic from inverter 141, as shown. The TI 74174-J hex D-type flip flop with clear serves as the configuration register. Completing the circuit of these figures is the TI 7402-J Quadruple 2-inputNOR gate143providing resonse gate select logic for NAND gate 145, see FIG. 11 d (7).

Turning next to FIGS. 11 b (1), (2) and (3) the timing generator module is thereby shown to have its own clock generator. Specifically, an internal oscillator 147 is in parallel with an external oscillator terminal 149 in providing logic to a NAND gate operable with comparable logic from register 139 (FIGS. 11 a (1) and (2). This provides operating logic to a 4-input NAND buffer from whence it may be used as a reference for the binary chain 150. These parts may be provided by a TI 74SOO-J NAND buffer and a combination of Fairchild Semiconductor's 93S16 4-bit binary counter and TI's 74S175-J Quadruple D-type flip flop, as shown, with a 4-input NAND gate such as TI's. 74S20-J in completing the clock generator circuitry as arranged by FIGS. 11 (b) (1), (2) and (3). The output from the NAND buffer is also provided to a HANDSHAKE circuitry, see FIGS. 11 d (1), (2) and (3).

With reference to FIG. 11 c (1), (2) there is shown a similar binary means 152 taking instruction $\overline{I}_{10}$ from register 131 and an external power supply via a resistance in deriving test length ($T_L$) logic for signalling a circuit shown by FIGS. 11 d (4), (5), (6) and (7) which, as shown, is operably related to that of FIGS. 11 d (1), (2) and (3).

More particularly, these circuits of FIGS. 11 d (1) thru (7) will receive the logic of both the clock generator and test length counter and develop therefrom the logic for the timing and integration of the DWG and computer. Specifically, the oscillator logic in combination with that from the binary counter means 150 will provide logic from NAND chip 154 (TI74SOO-J) to flip-flop 156 for operating the circuitry. This circuitry is of especial note for its ability to operate with logic from the register 139 and the test length counter to place the DWG in a "wait" condition. Actually the circuit has NAND gates 158 and 160 receiving logic from flip flop 156 to produce a high CP signal for external use. Similarly TRUE logic is developed at one of the four inputs at NAND gate 162 and delivered to clock input of flip-flop 164. Flip-flop 164 receives data from NOR gate 166 for delivering logic to NAND gates 167, and 162. Gate 167 is used to provide clock control to the second portion, 164', of the flip-flop 164. NAND gate 162 provides TRUE-FALSE logic for NAND buffer 168 that is compared with a power supply by NAND buffer 170 in arriving at a $\overline{CP}_2$ output therefrom.

With reference to FIGS. 11 d (4&5) the test length counter with the indicated outputs of registers 135 and 137 (FIGS. 11 a (1) and (2)) will toggle flip-flops 172 and 174 interconnected by NOR gate 176 to provide a change of state for logic to NAND gate 178 and NOR gate 166. Similarly TRUE, (GATE) and FALSE (GATE) logic will be provided for the gate means 180, 180'; 182, 182' providing data to portion 184 of flip-flop means having a dual element 184'. The outputs of flip-flops 184, 184' are compared with certain of the logic from FIG. 11a (2) by I.C.'s 145 and 186, a construction of NAND gates. NAND buffer 188 is operatively connected to I.C.'s 145 and 186 to develop response gate TRUE-FALSE logic RG and $\overline{RG}$. This logic will be used in a strobe generator, see FIG. 11 g (1),(2)&(3). The timing generator is completed by the self explanatory increment pattern counter logic diagrams, FIGS. 11 e (1) and (2) that operates via NOR gate means 190 and binary counters 192 (FIGS. 11 f (1) and (4)) line drivers 194 and 196 (FIGS. 11 f (2), (5) and (3), (6), respectively) in generating TRUE-FALSE logic $PC_{0-9}$, $\overline{PC}_{0-9}$.

The logic of the DWG is complete with references to FIGS. 12 a (1), (2) and (3); 12 b (1) and (2); and 12 c (1) and (2) showing input means and output means and a representative memory circuit for the DWG memory card. Actually there are four types of memory cards available and each has 24 identical memory chips (12 pairs). The type of card selected depends upon the required test memory depth and test logic level requirements, i.e., fixed TTL or programmable ±20V. With specific reference to these figures there is shown by FIGS. 12 a (1), (2) and (3) means to bring card select address (x), data (DW), instruction (I) and computer (w) logic to the memory card and, with simple logic circuitry, selectively relate it for use. FIG. 12 b (1) and (2) show how instructions and timing addresses and a power supply connection are related with the logic necessary to use same in the memory card.

The heart of the logic of the memory card is shown in FIGS. 12 c (1) and (2). There the computer writes signals from the control card (WC) and the timing generator (WR) that will, with the I. C. 197, provide logic to enable the Fairchild Semiconductor 93410-DC 256-bit or 93415 1024 bit fully decoded random access memory (RAM) 199. Thus, the address inputs $PC_{0-9}$ with data input $D_{IN}$ and chip select logic means 198 upon comparable chip selector inputs $\overline{CS}$, or CS will provide a data output D out to amplifier 200 and flip-flop 202.

The $D_{IN}$ is derived by logic from flip-flop 204 in response to data from a dual differential line receiver 206 (Fairchild's A 9615). Flip-flop 204 processes logic to a data selector/multiplexer 208 such as TI's 74157-J whose output is connected to the $D_{IN}$ input of RAM 199. With such a memory portion the buffer gates (TI 74125-J) 200 and 210 are interconnected. Also flip-flop 212 with the out-put of flip-flop 202 controls NAND gate driver 214. The output of driver 214 is controlled by a SIGMA 19 ITE-1A-2-5$ control means 215 for providing a signal at J1.5 and for receiver 206. These drivers and receivers are of two basic types; standard and optional so as to, respectively, have programmable or fixed TTL logic levels. As seen in FIG. 12 c (2) a programmable type is shown where three external voltages are used. Two voltages are for the driver (one high, one low logic level), and a third voltage is used for the receiver to establish a logic level threshold for incoming data.

Lines 216 and 218 connect the memory unit of FIGS. 12 c (1) and (2) to a similar circuit, more specifically in the other circuit to a line similar to line 220 and to the B3 input for a multiplexer, such as 208. Such additional circuit also has separate WR + WC and $\overline{WC}$ connections. This completes one memory circuit such as is processing the $D_{WO}$ data. These circuits are duplicated for all differing data shown to be of similar order and being processed by the apparatus of this specification and drawings.

The DWG is intended to form a part of an automatic, computer controlled test system such as the HP 9500D. It can provide in one form constructed to date 480 bidirectional input/output lines, as depicted in FIG. 4, for sending or receiving digital pattern data. As such, each input/output line on the DWG's constructed had a dedicated high speed memory of 256 bits and 1024 bits depending upon whether an extender 20 was employed with the specific DWG configuration visualized so far. The drivers and receivers on each input/output line are of two basic types. The standard type has programmable logic levels while the optional type has fixed TTL logic levels. The programmable type must be supplied with 3 external voltages. Two voltages are used for the driver (one is for the driver high logic level and one is for the driver low logic level), and a third voltage is used for the receiver to establish a logic level threshold for incoming data. Any value above the reference is interpreted as a logic "1" (TRUE) while any value below the reference is interpreted as a logic "0" (FALSE). In a typical test mode, the DWG memory is loaded with stimulus pattern data (up to the limit of memory size). The patterns are then sent to the Unit Under Test (UUT) in sequence and UUT output data is captured by the DWG and stored for evaluation. In using the DWG for UUT testing, many programmable modes are available.

Memory-card modules provide the digital test signal interface with the Unit Under Test (UUT) in modular increments. Each test pin is programmable as either a driver "I" (FIG. 10 a (1) (for inputting test logic stimuli to the UUT) or receiver "O" (FIG. 10 h (3), accepting test logic response from the UUT). Several memory-card modules can be installed into the DWG to provide a digital test interface with the UUT as a multiple thereof. The interface can be expanded by adding an extender 20 to the test system. The DWG provides for full control for the extender 20.

The quantity of memory-card modules used in a given test system, depends upon the application and is determined by the test system designer.

In an embodiment constructed 24 I/O test pins on the memory card connects to front panel DWG-UUT interface patch panel via an I/O cable 72 associated with each card. The cable plugs into the topside connector of the memory-card and terminates (opposite end) in a group of dedicated pin locations determined by the slot position of the memory-card, in the card cage.

A single 5 VDC at 55 amp regulated power supply is regulated for internal operation. Power is applied to the DWG through a connector (not shown).

All logic level reference voltages applied to the programmable drivers/receivers (memory-card) are supplied from external power supplies. Since the requirement for references varies according to the user's test application, the power supplies may be in accordance with the requirements of the user.

This reference is used primarily for testing UUT's that employ full TTL logic. The reference is obtained from the DWG's 5V operating power supply, with + (high) and − (ground).

When testing UUT's that are configured with different types of logic elements (e.g. MOS, DTL, RTL, TTL, etc.), at least two groups "A" and "B" of programmable (±20v) logic level references are needed. Each group requires 3 voltages to establish the analog threshold levels for Driver-Hi, Driver-Lo and Reference. Therefore, the 6 reference voltages used for groups "A" and "B", are obtained from 6 programmable power supplies external to the DWG.

Each of the 6 power supply outputs, with remote sensing, terminates on dedicated pin locations of the DWG-UUT interface connector via a feed thru connector.

Reference groups "A" and "B" are patched to input terminals through an adapter and applied to the memory card(s) via the motherboard connector. The same references are also branched by hardwire for routing to extender 20, when used. This could also serve as an alternate method for applying the references when the DWG is used alone.

Although both "A" and "B" references enter the memory card, only one of the references can be used for that card. The choice is made by adding three jumpers to a jumper block on the memory card.

Situations may arise where more than two logic level reference groups are needed for testing. The additional reference groups are applied to the memory card via its topside I/O test connector and interconnecting cable. By using this method, it is possible to add as many as ten different logic level references to a DWG. However, the reference for a particular card applies only for that card and limits the test interface to the twenty-four I/O pins associated with that card for the twenty four memory circuits, one of which has been described above.

There are several basic concepts concerning DWG operation to be understood. The first is the fact that the DWG supplies hundred of bidirectional input/output lines for sending and receiving digital pattern data. A single pattern is defined as the I/O sequence which appears on these lines simultaneously. A stimulus pattern to the UUT is defined in the programming as an INPUT pattern. The first step in using the DWG is to establish which of the lines are to be used as INPUT's and which are to be used as OUTPUT's. The next step would be to program the desired driver and receiver logic levels. As states above and shown by FIG. 4, the levels are provided by power supplies external to the DWG.

Having defined INPUT's and OUTPUT's, it is now possible to perform tests. A test sequence would involve sending an INPUT pattern to a UUT and then sampling a resultant OUTPUT pattern and comparing it with predicted results to ascertain UUT GO/NO-GO status. The DWG hardware system sends and receives the pattern, while the software system does the comparison of actual UUT OUTPUT's with predicted or good machine response's stored in DWG memory. They are then transmitted simultaneously with the capture of the UUT response patterns. Actually the UUT response patterns are also stored in DWG memory and brought back to the computer for analysis.

During the actual transmission and receipt of patterns, the DWG timing generator controls timing functions. Both internal and external synchronization features are provided. The standard test mode would be to use the DWG on internal synchronization. In this mode, two fundamental parameters should be considered. The first of these is the desired time interval from INPUT pattern transmittal and to a resultant OUTPUT pattern sample. This time interval is programmable as a multiple of the main DWG frequency. The second is the main frequency at which successive patterns are to be transferred (i.e., time interval between two INPUT patterns). A sequence of patterns can be transferred to the UUT at some desired frequency up to the limit of memory capacity (i.e., 1024 patterns for 1024 memory). When memory is exhausted testing is halted while additional data is retrieved from the computer. The sample time between INPUT and OUTPUT, the main frequency, and the number of patterns to be bursted are all programmable.

Having set up the timing, several operational modes are programmable. They are:

Normal — processes patterns sequentially from DWG memory. The number of patterns is programmable (test length)

Continuous — Recycles continuously the programmed number of patterns.

Gated — Recycles every other time frame the same series of patterns.

Handshake — Explained below.

Of these four modes, the Handshake mode (See logic of FIGS. 11 d (1), (2) and (3) requires further explanation. It is a mode which, after a stimulus pattern is sent from the DWG, the DWG goes into a "work" condition before sampling the response. It will sample responses when directed to do so from one of two sources, and can be directed to do so either programmably or by the UUT. A command is available to do so in programming (single step). Upon execution of this command, the DWG will sample the response and then send the next stimulus up. It will then go to a "wait" condition. The UUT can command the DWG using an external control function (FLAG — line). For this function, a second DWG external line (COMMAND) line is also involved (See FIG. 8A).

The COMMAND line goes positive coincident with stimulus data transfer. The DWG waits until a FLAG pulse is returned from the UUT. On its positive going edge the DWG resumes operation. It samples the response and then sends the next pattern and COMMAND and again waits for the FLAG.

The remaining modes involve external DWG timing functions. For this purpose ten external lines are provided (in addition to the COMMAND and FLAG lines). They are:

| DWG Inputs |
| --- |
| External Oscillator (See Fig. 11 b (1)) |
| External CLOCK (See Fig. 11 d (1) & d (2) & d (3)) |
| External Stimulus Gate ⎱ (See Fig. 11 a (2)) |
| External Response Gate ⎰ |
| DWG Outputs |
| Clock CP$_1$ (See Fig. 11 d (2)) |
| Clock CP$_2$ (See Fig.'s 11 d (3)) |
| Strobe S1 (See Fig. 11 g (2)) |
| Strobe S2 (See Fig. 11 g (2)) |
| Strobe R (See Fig. 11 g (2)) |
| GATE (See Fig. 11 d (5)) |

The external oscillator permits the DWG to operate apart from its own internal oscillator which with the usual binary chain is counted down in the DWG to produce the master clock. The external clock also permits the DWG to operate directly off an externally provided clock. The external stimulus gate when true, directs the DWG to send stimulus patterns. The external response gate does the same for response patterns. The remaining external functions are all DWG signal outputs. Clocks CP$_1$ and CP$_2$ are the DWG's internal clocks. CP$_1$ and CP$_2$ are identical and are both free-running. The only difference is that CP$_2$ is not free-running in the HANDSHAKE Mode. Rather, it is synchronized in the external FLAG signal. Strobes S1, S2 and R are identical to the internal DWG stimulus and response strobes. The last output is the GATE which is TRUE during stimulus pattern transmission.

Although the DWG has many operational and synchronization modes, which are programmable, it will always default to a standard mode when parameters are unspecified in the test program.

Before passing on to a more specific discussion of the operation it should also be noted that the DWG is compatible with the HP 2100 series of computers known in the art. It is also compatible with a ground true microcircuit card. Such compatibility is illustrated by a spec sheet as follows:

INPUT/OUTPUT PINS
  o  DWG: to 240 (increments of 24)
  o  Extender: to 480
MEMORY
  o  Type: Random access, solid state
  o  Size: Optional at 256 or 1024 bits per pin
DRIVER-RECEIVER LOGIC LEVELS
  o  Programmable Levels
      $-20V$ to $+20V$
      Offset from driver references: Nominally 0.8V
      Current: Nominally 50 ma maximum
      Short Circuit Proof
      Driver Slew Rates: Nominally 300V per usec
  o  TTL Fixed Levels (Optional)
      Logic "1" 3.5V
      Logic "0": 0.0V
      Receiver Reference: 1.6V
      Short Circuit Proof
      Current: Nominally 40 ma maximum
      Driver Slew Rate: Nominally 300V per usec
INSTRUCTION EXECUTION TIME
  o  Nominally: 4 usec
ATS BASIC LANGUAGE ELEMENTS
  o  Test Oriented: Ten
  o  Special: Eighteen
TIMING AND SYNCHRONIZATION
  o  Frequency: Static to 10 MHz for 256 Memory
      Static to 7.5 MHz for 1024 Memory
  o  Frequency resolution: 100 nsec steps with
      internal ocillator.
      Unlimited with
      external oscillator
  o  Skew: 10 nsec maximum across 24 pins
  o  Stimulus to response delay time: 100 nsec to
      409.5 usec in 50 nsec steps
  o  Stimulus Pattern Clocks: Two independent sets
  o  Response Pattern Clocks: One Set
HP 2100S COMPUTER INTERFACE
  o  One I/O Channel: HP 12566B Microcircuit Interface Card
  o  Logic Levels: TTL ground true
EXTERNAL SYNCHRONIZATION
  o  DWG Outputs
      CLocks: Five
      Gate: One burst length gate
  o  DWG Input Provisions
      Oscillator: One
      Clock: One
      Gates: Separate stimulus
      and response gates
  o  Ready-Resume (handshake)
      One "Command" output
      One DWG "Flag" input
REFERENCE SUPPLY REQUIREMENTS
(per 24 pins)
  o  Driver High: 100 ma typical
  o  Driver Low: 250 ma typical
  o  Receiver: 132 ma Maximum
PHYSICAL (for one DWG or Extender)
  o  Width: 16¾ in. with adapters for rack mounting
  o  Height: 12¼ in. (rack mounted)
  o  Depth: 26 in. (23 in. behind rack mounted ears)
ENVIRONMENTAL
  o  Operating temperature 0° to 55° C
  o  Relative Humidity: to 95% at 40° C
  o  Ventilation
      Intake: Front of bottom panel
      Exhaust: Rear panel
ELECTRICAL
  o  AC Power Requirements (for fan)
      115V±10%
      60Hz±10%
      15 watts maximum
  o  DC Power Requirements
      5V±5%

-continued 55 amps maximum for 240 pins
UUT INTERFACE
o  528 pin coax panel on DWG front panel; includes analog/power feed-throughs from DWG rear panel connectors to 528 pin Interface Panel. Optionally, cables from DWG to separate user interface.

Hereagain the computer and DWG work in a handshake mode of operation. They require that the digital test system be programmed with 16-bit words plus a "command" and "flag" line (See also FIG. 10 a (1) and 10 a (3)). The test responses are 12-bit status words (See FIG. 10 h (3)) for processing by the computer under software control, not a part of this invention, for GO/-NO-GO test evaluation.

OPERATION

The DWG 18 is packaged in one drawer which accommodates up to 240 test pins as aforesaid. An extender unit 20 of identical size provides with similar construction another increment of 240 pins. Therefore, with such a combination any quantity of pins can be specified in increments of 24 up to 480 maximum to serve as bidirectional input/output lines for sending and receiving data, i.e., digital pattern data. Each of these lines have their own driver 214 and receiver 206. In addition, a single pattern is defined as the TRUE-FALSE sequence which appears on these lines simultaneously. A stimulus pattern to the UUT is defined in the programming as an INPUT (I) pattern while a response pattern from the UUT is defined as an OUTPUT (O) pattern. Therefore, the first step in the operation of the DWG is to establish which of the lines are to be used as INPUTS and which are to be OUTPUTS. Next one must with the external power supplies program the desired levels of driver 214 and receiver 206.

With these steps completed a test sequence is then possible with transmitted INPUT pattern and a resultant OUTPUT pattern being sent and received by the DWG hardware to, with a software system make comparisons with good machine responses, ascertain desired test information. Signal flow to and from the DWG are via the control card as illustrated by the 16 input lines $\overline{DI_0} - \overline{DI_{15}}$ of FIG. 10 a (1) and the 12 output lines $\overline{DO_0} - \overline{DO_{11}}$ of FIG. 10 h (3). Actually, operationally programmed data from the computer appears at the output register of the computer. With both command, line 106 FIG. 10 a (1), and flag, line 108, FIG. 10 a (3), sitting at logic HIGH (inactive state) the action is initiated by the command line going LOW. The DWG detects this negative transition and responds by setting flag line LOW. When the computer detects the LOW state of the flag line it resets command line HIGH. Upon completion of the processing cycle, the DWG returns flag line HIGH signalling that in the handshake mode the operation has been completed, DWG is ready and awaiting next instruction. The data is available to the computer when the flag line goes HIGH. The time for completing instruction test cycle is 4 msec nominal, with a range of from 1 msec to 1 minute.

The instructions for the DWG are basically of two types, single-word and multi-word.

In either case each word sent to the DWG must be accompanied by a command (COM) signal. Since the DWG is not, in the forms constructed, able to store incoming instructions, the data $\overline{DW}$ is held during an instruction cycle.

When data is on the lines from the computer it is passed by the input buffer network of terminators 11 and 13 and inverters 15, 17, 19 and 21 and decoded by decoders 37, 39, 41, 43 and 45. Action is initiated by the COMMAND signal that triggers the timing sequence means to deliver four timing pulses (See FIG. 10 c (8)), $T_0, T_1, T_2,$ and $T_3$, each of which is 1 m sec wide. Therefore, the complete instruction cycle is normally 4 microseconds. Each of the aforesaid timing pulses is used to control individual operations required to complete one cycle. There are two general cases where the cycle is not 4 m sec. The instruction to initiate from the oscillator 81 requires only one microsecond. Three other instructions $I_4$ (Increment Pattern Counter), $I_5$ (Load Pattern Counter) and $I_{11}$ (Test Execute) are variable time instructions. They are doing operations which are a function of the frequency of the timing generator, FIG. 10 g (1). The BUSY signal from the timing generator is used by the control card module to monitor timing generator status.

The logic is such that four instructions $I_0, I_1, I_2$ and $I_3$ are generated which are to go to all memory cards. $I_0$ defines INPUT/OUTPUT's; $I_1$ reads memory; $I_2$ writes into memory; and, $I_3$ resets memory card registers, see FIG.'S 12 a (3) and 12 b (1).

$I_0$ is a pulse which loads the INPUT/OUTPUT register, flip-flop 212 with the data $DW_4$ (See FIGS. 12 c (1) and (2)). $I_1$ gates output of memory chip 199, see amplifiers 200 and 210 FIG. 12 c (1), onto the read bus $(\overline{DR})$ P-1 86, $\overline{DR_4}$. $I_2$ gates the write bus $(\overline{DW})$ into memory, see FIG'S. 12 b (1) and 12 c (1), the multiplexer 208 of the latter. Finally, as seen by FIG. 12 a (3) instructions, such as $I_3$ provide for reset pulses for selected memory groups as indicated such as $RS_1$ to flip-flop 204 in the circuit of the memory group exemplified by FIG.'S 12 c (2) and 12 c (1), whereby such instructions to clear these registers. The addressing of individual memory locations involves controlling pin group by the control card module and pin pattern by the timing generator module. Actually the DWG memories constructed to date have been divided into 40 pin groups and the pin group counter and control logic of FIGS. 10 d (1), (2), (3), (4), (5) and (6) selects the pin group. The counter's output, see FIGS. 10 d (3) and 10 d (6), is decoded, as by decoder 41, to produce the nine signals, $X_0, \overline{X}_0, X_1, \overline{X}_1, X_2, \overline{X}_2, X'_3, X'_4$ and $X'_5$. See FIGS. 10d (3) and (6).

As may be realized by one skilled in the art each slot in the DWG is wired for a particular Pin Group Select Address:

| Socket Pin | Slot Position of Memory Card | | | | | | | | | |
|---|---|---|---|---|---|---|---|---|---|---|
|  | $XJ_2$ | $XJ_3$ | $XJ_4$ | $XJ_5$ | $XJ_6$ | $XJ_7$ | $X_8$ | $X_9$ | $X_{10}$ | $X_{11}$ |
| 52 | $X'_3$ | $X'_3$ | $X'_3$ | $X'_3$ | $X'_4$ | $X'_4$ | $X'_4$ | $X'_4$ | $X'_5$ | $X'_5$ |
| 50 | $\overline{X}_2$ | $\overline{X}_2$ | $\overline{X}_2$ | $\overline{X}_2$ | $\overline{X}_2$ | $X_2$ | $X_2$ | $\overline{X}_2$ | $\overline{X}_2$ |  |
| 49 | $\overline{X}_1$ | $X_1$ | $X_1$ | $X_1$ | $\overline{X}_1$ | $X_1$ | $\overline{X}_1$ | $X_1$ | $\overline{X}_1$ | $X_1$ |
| 47 | $X_0$ | $X_0$ | $X_0$ | $X_0$ | $X_0$ | $X_0$ | $X_0$ | $X_0$ | $X_0$ | $X_0$ |
| 46 | $\overline{X}_0$ | $\overline{X}_0$ | $\overline{X}_0$ | $\overline{X}_0$ | $\overline{X}_0$ | $\overline{X}_0$ | $\overline{X}_0$ | $\overline{X}_0$ | $\overline{X}_0$ | $\overline{X}_0$ |
| Group | 0/1 | 2/3 | 4/5 | 6/7 | 8/9 | 10/11 | 12/13 | 14/15 | 16/17 | 18/19 |

-continued

| Socket Pin | Slot Position of Memory Card | | | | | | | | |
|---|---|---|---|---|---|---|---|---|---|
| | $XJ_2$ | $XJ_3$ | $XJ_4$ | $XJ_5$ | $XJ_6$ | $XJ_7$ | $X_8$ | $X_9$ | $X_{10}$ $X_{11}$ |
| Select | | | | | | | | | |

Therefore any card can be inserted into any slot. Each memory card decodes the same five pins on every card. To address a particular pattern in the memory the pattern counter on the timing generator card (See FIGS. 11 e and 11f) is used. The control card loads this pattern counter (See FIGS. 11 a (1) and 11a (3)) which in turn addresses memory via buffers inverting signals $PC_0$, $PC_1$, $PC_2$, $PC_3$, $PC_4$ (FIG. 12 b (1)) and $PC_5$, $PC_6$, $PC_7$ (FIG. 12 b (2)) for RAM 199. The only other signal from the control card module used to control memory is the write signal $W_c$ (FIG. 10 b (8)) from which the write into memory instruction $I_2$ is decoded As stated above, in addition to the single-word instructions, there are three multi-word instructions for which the control card has logic depicted by FIGS. 10 c (1), (2), (3) and (4). This logic is such as to remember which instruction, in the sequence, is being executed. This logic by being applied to NAND gate 47 controls decoder 37 so that the DWG does not misinterpret subsequent words. This logic is in tandem with the counter and control of the FIGS. of the 10 d series aforementioned so as to count from the start to stop pin group then resetting and repeating the process.

As seen by FIGS. 10 b (8) and 10 b (9) the control card sends nine commands to the timing generator module via resistor chip 131 (FIG. 11 a (3)) to control of the timing generator module operation. The commands are as follows:

$I_4$ — Increment Pattern Counter by one.
$I_5$ — Load Pattern Counter (From $\overline{DW}$ BUS).
$I_6$ — Load Configuration Register (From $\overline{DW}$ BUS).
$I_7$ — Reset.
$I_8$ — Load Pattern Counter Quadrant (From $\overline{DW}$ BUS).
$I_9$ — Load Frequency Counter (From $\overline{DW\ BUS}$).
$I_{10}$ — Load Test Length Counter (From $\overline{DW}$ BUS).
$I_{11}$ — Test Execute.
$I_{12}$ — Single Step.

Finally the control card provides logic (See FIGS. 10 h (1), (2), (3) and (4)) where a 12 bit register is used to hold data requested by the computer. Actually data may be read from the memory module at the read ($\overline{DR}$) BUS, at the Pattern Counter (PC) BUS of the control card, and the pin group select output (x) internal to the control card shown by FIG. 12 a (1); FIGS. 11f(2), (3), (5), and (6); and, FIGS. 10 d (3) and (6); respectively.

As referenced the timing generator card accepts instructions and data from the control card to generate the timing required for the DWG memory access and UUT testing. Functionally the timing generator generates the programmable test clock, sets the test length, loads and increments the test pattern counter, generates the stimulus ($S_1$, $S_2$ and $S_3$), response (R), and the write (WR) strobes for the DWG, extender 20 if used, and UUT. It also, as stated above, provides for external timing and synchronization modes with the UUT.

As seen by FIG. 11 b (1) a 20 $MH_2$ oscillator 147 provides signals that can be divided down by binary chain 150 and processed by the logic shown in FIGS. 11 d (1), (2) and (3) to develop Ext. $CP_1$, $CP_2$ and $\overline{CP_2}$. This operation also is possible by an external clock connected at pad 149. In fact it is also possible to use an external clock. $CP_2$ is used to binary means 152 with $I_{10}$ and reset signal $I_{71}$ (See FIGS. 11 a (3) and (4)) to produce a test length signal $\overline{TL}$ having a period equal to the period of $CP_2$ multiplied by the programmed test length. As with the Ext. $CP_1$ and $CP_2$ the $\overline{TL}$ is free running so that when an execute command ($I_{11}$) is issued a test gate signal is initiated and active for the period of test length, see FIGS. 11 d (4) and (5).

The test gate signal is used by the logic of FIGS. 11 d (6) and (7) to generate stimulus/response gate signals (SG/RG) for pattern counter of FIGS. 11 e (1) and (2) and the strobe of FIGS. 11 g (1), (2) and (3). In the DWG fabricated the stimulus gate was equal to the test gate, whereas the response gate could be programmed equal to stimulus gate or delayed by one or more clocks therefrom.

Stimulus Strobes $S_1$, $S_2$ and $S_3$ (See FIGS. 8 and 11 g (1) and (2)) as mentioned are used to obtain stimulus data of the memory module and the response strobe provides data to the memory module. Also the write strobe $\overline{WR}$ from FIG. 11 g (2) writes the data, strobed into the memory response register 204 into a memory location of RAM 199 determined by the pattern counter signals $PC_0$ - $PC_7$. The write strobe (WR) preferably equals the response strobe (R) delayed by one clock period.

By using different combinations of stimulus (S) and response (R) the time delay from stimulus data can be programmed for ½, 1, 1½, or 2 clock periods, so that response data is stored in memory locations offset from the location from which the corresponding stimulus pattern came:

| Period Delay S to R | Stimulus Pattern Location | Response Pattern Memory Location |
|---|---|---|
| ½ | N | N + 1 |
| 1 | N | N + 2 |
| 1½ | N | N + 2 |
| 2 | N | N + 3 |

Information on these modes of operation of the timing generator module is stored by the twelve bit configuration register 135, 137, and 139 of FIG. 11 a (1). Therefore the timing generator is capable of four modes of operation. The first is to produce a test gate signal that is up for the programmed test length. The second is a continuous mode where the test gate is up constantly and the pattern counter resets to zero at the end of each test length cycle. The third is the gated mode where the test gate alternates on and off for the programmed time. Finally, the fourth is a handshake mode mentioned above that allows the control card module or the UUT to step through a test, one pattern at a time for the programmed test length. In the handshake mode, by way of further explanation, the test gate is TRUE and the first stimulus is sent when a signal of a test execute is received, as by NAND gate 178 of FIG. 11 d (4). Simultaneously the COMMAND (FIG. 10 a (1)) goes TRUE and the operation halted until either an external flag or single step instruction is received at NAND gate 167, (FIG. 11 d (2) in which case the process repeats until the last test is executed. During this fourth mode CP$_2$ is synchronized to S$_1$ and is not free-running. A graphic representation of this handshake mode is as follows:

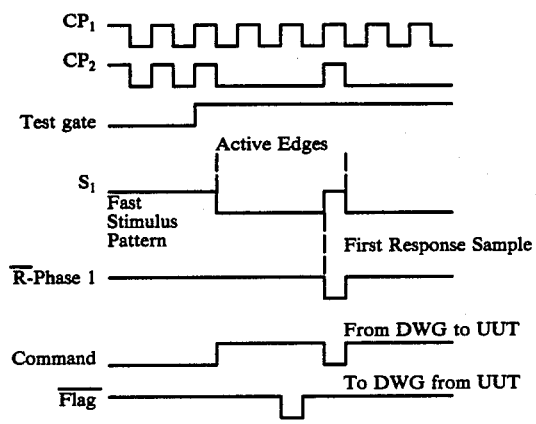

The external flag from the UUT or the single step command from the computer can be used to sample responses.

Passing now to a further explanation of the operation of the memory card module than that which has been incorporated in the operational description of the control card and timing generator modules it should be first recognized by those skilled in the art that each memory card contains twelve pairs, twenty-four input/output lines available to generate stimulus and sample responses. These twenty four lines (pins) are identical except that they can be controlled independently. Each pin has the memory 199 (presently thought of as one having either 256 or 1024 bits) the stimulus flip-flop 202, a response flip-flop 204, a driver 214, a receiver 206, a relay and control/gating networks 215. Each such pin operates in two modes. The first is the normal test mode where stimulus/response data is passed between memory module and UUT. The second is where the control card is setting up each pin and writing/reading into memory.

In the normal test mode the sending of stimulus to the UUT or the sampling of responses therefrom depends on the state of flip-flop 212 on each line. As can be seen from FIGS. 12 c (2) and 12 c (1) when 212 is reset, driver 214 is disabled relay 215 is opened and $\overline{WR}$ writes into memory 199 the information of response flip-flop 204 in that relay 215 being open allows data from the UUT to pass through receiver 206 to the response flip-flop 204 being strobed by response R. As previously stated the pattern counter signals PC$_0$ - PC$_7$ provide at memory 199 sequential memory locations. When on-the-other-hand flip-flop 212 is set as will be familiar to one skilled in the art from a review of the logic hereof, driver 214 is enabled, relay 215 is closed and the signal $\overline{WR}$ is prevented from strobing memory 199. Data from the memory 199 is passed to stimulus flip-flop 202, strobed by stimulus signals S$_1$ + S$_2$ and thence out driver 214 to the UUT.

Figure 8A:
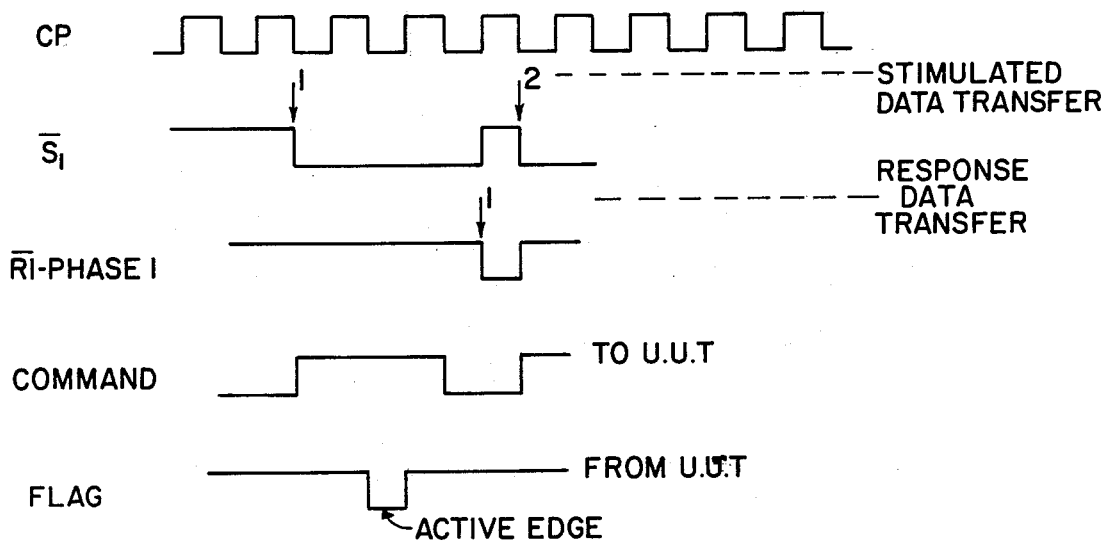
Figure 9:
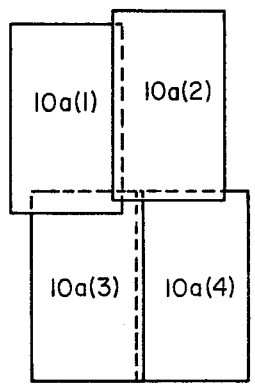
Figure 9:
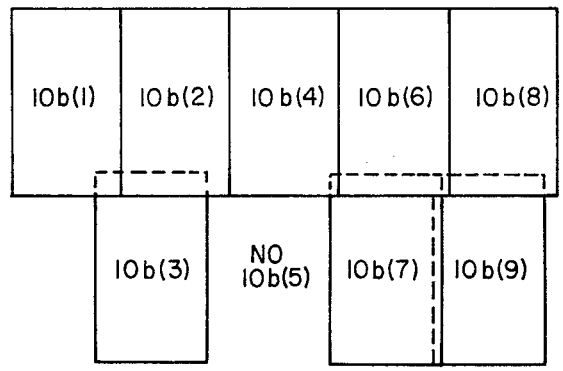
Figure 9:
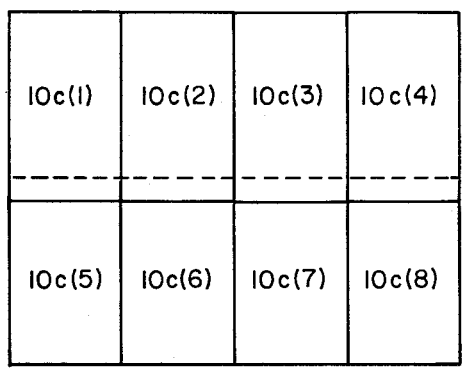
Figure 9:
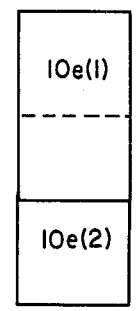
Figure 9:
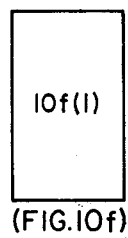
Figure 9:
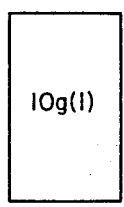
Figure 9:
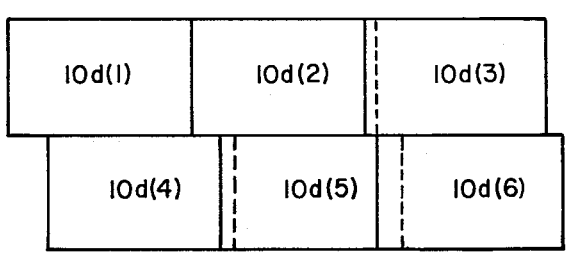
Figure 9:
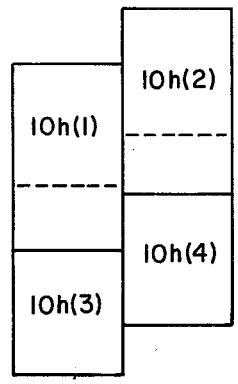

During the normal test mode stimulus S$_1$ and response R, phase 1, see FIG. 8A, are used. Also card select signals CS$_1$ and CS$_2$, FIG. 12 a (3), are developed from pin group select lines (x). However, before such a test can commence the control card module must program the memory card module. In doing this the control card module uses instructions: $\overline{I_0}$ to strobe the DW information into register 212, See FIGS. 12 b (1) c (2), to control input or output status of the line; I$_1$, FIG. 12 b (1), to allow memory to be read on the DR data lines via buffers 200 and 210, FIG. 12 c (1) by activating either $\overline{RED_1}$ or $\overline{RED_2}$ with the location read being a function of PC signals to memory 199; $\overline{I_2}$ to gate $\overline{DW}$ information to memory 199 by a select pulse, FIG. 12 b (1), to data selector/multiplexer 208, FIG. 12 c (1), rather than that from response flip-flop 204, FIG. 12 c (2), as strobed into memory by WC from the control card, FIG. 10 b (8), with location again a function of PC signal; I$_3$ to reset all memory card registers. The other signal that is important is pin group select lines (x), FIG. 12 a (3), which will control which particular 12 pin group (out of 480) is to be instructed to take an action.

The programmable driver 214 has the following characteristics:

Logic High (V+) Voltage: OV to +20V
Logic Low (V−) Voltage: OV to −20V
Max. Swing (V+ − V−): 20V
Max. Current Capability: 50 ma
Above 50 ma, the driver starts to current limit.

The worst case currents drawn by the driver reference voltages (V+ and V−) are:

$$I^+ = \frac{V^+}{R_{Load}} \text{ per driver in high state}$$

$$I^+ = \frac{V^+ - |V^-|}{1.6K} \text{ per driver in low state}$$

$$I^- = 2.3 \, mA + \frac{V^+}{1.6K} + \frac{|V^-|}{0.9K} + \frac{|V^-|}{Load}$$

$I^- \approx 0$ in high state

When a line is programmed as a UUT output, I+ = I− ≈ O.

The programmable receiver 206 operates from −20V to +20V with incoming signals whose swings do not exceed 20V. The reference threshold that distinguishes a Logic "1" from a Logic "0" is programmable from −20V to −20V. Its accuracy is as follows:

| Reference Voltage | Accuracy |
|---|---|
| −5V to +5V | ±500 mv |
| −15V to −5V and +5V to +15V | ±1V |
| −20V to −15V and +15V to +20V | ±2V |

Its propagation delay is a maximum of 80 nsec. The current drawn by the reference input is as follows:

$$I_{Ref} = \frac{V_{Ref} - 2V}{4K} \text{ per pin}$$

this equates to 132 mA max. for 24 pins when $V_{Ref}$ = −20V.

A TTL driver comprises a fixed logic level device. It has a matching network on its output and its characteristics are as follows:

| | |
|---|---|
| Logic "1" Voltage: | 3.5±0.5V |
| Logic "0" Voltage: | 0.0 to 0.5V |
| Driver Current: | 130 ohm load minimum (source in high state, sink in low state). |
| Propagation Current: | 40 nsec max. |

With a TTL driver there is a TTL receiver accepting standard TTL input signals. It has a fixed threshold voltage of 1.6 volts ±0.1 volts that distinguishes between a logic "1" and "0". Its input impedance is 500 ohms in series with 220 pf all in parallel with 50K ohms leakage impedance.

In summary the active logic state for the DWG is LOW, O or FALSE, i.e., the DWG recognizes the negative transition of the command line 106 by setting the flag line 108 to the computer FALSE (message received) at connection P-1-22 of FIG. 10 a (3). This in turn causes the computer to send a TRUE signal to command (encode reset). The command pulse so generated strobes the data from the computer into the DWG for decoding and action. When the action cycle is complete, the DWG sets the flag line 108 TRUE (operation complete) and awaits new instructions. The time for completing one instruction test cycle is nominally 4 usec with a possible range of 1 usec to 1 minute.

The instructions to be decoded are contained in 2 to 7 MSB's of a 16-bit program word with the 12 LSB providing the data. A listing of the control functions bits generated together with their reference symbols are shown below:

A. Timing Generator Module Control Function Bits

1. Single Step
2. Execute Test
3. Set Test Length
4. Set Frequency
5. Set $A_8 - A_9$
6. Reset
7. Configure Register
8. Load "A"
9. Increment "A"

B. Memory Control Function Bits

1. Reset
2. Block Write
3. Block Read
4. Write I/0
5. Write Pin Group
6. Read Pin Group
7. Write Response Register
8. Read "X"
9. Read "A"

Instructions to the Timing Generator Module are decoded, to generate control function bits that together with the 12 data bits, configures the test mode of the DWG. For dynamic testing, the UUT is tested at its normal clock rate. The DWG is designed to function with Internal and External oscillators and Clock Pulses.

The test logic level reference applied to the drivers establishes the analog threshold levels for inputting stimuli to the UUT. The response from the UUT is conditioning to a TTL logic "0" or "1", prior to storage. The memory cells are Non Destructive Read Out (NDRO) the response pattern unless power to the DWG is interrupted. The drivers and receivers on the memory card are basically high speed level converters. All data transfer within this DWG is at TTL levels.

Test logic level references can either be applied internally (5v fixed for TTL testing) or externally, from programmable (± 20v) power supplies. Normally, either one (for TTL) or two (for mixed logic elements) logic level reference groups are required for digital testing. The DWG, however, can be configured with 10 different logic level references, expandable to 20 when a DWG-Extender is also used in the test system. Each memory card can be configured with its own logic level reference for the 24 I/O test points, by bringing the reference into the card via it's I/O test connector.

The DWG does not make GO/NO-GO test decisions. Test decisions are made by the computer by comparing "actual test results" against "expected test results" stored in its' memory.

A typical test sequence may be as follows:
1. Master Reset DWG: resets control logic, timing and memory
2. Configure Timing Generator Module
   a. set test mode: continuous, gated, handshake
   b. set test length: set counter in test length register
   c. set Stimulus clock: INT, EXT, S1, S2, S3, or combination
   d. set Response clock: INT, EXT, delay the response clock trails the stimulus clock
   e. set DWG clock: INT, EXT, period between tests
3. Write Into Memory Module
   a. define I/O pins
   b. fix pin polarity (logic Hi, Lo)
   c. write in pin group address
   d. write in test pattern
4. Test Execute
5. Read memory pin groups
6. Read memory pattern groups Standard programming language for the DWG is ATS-BASIC, a simple, proven conversational language which permits test design and program editing on-line, through a keyboard/CRT terminal. Programs are compiled and executed directly, using an on-line interpretive compiler. As will be readily appreciated a software package, compatible with the series of minicomputers is available to the test system designer and programmer.

The memory card performs the following functions:
1. Sets test pin I/O interface.
2. Writes stimulus pattern into memory.
3. Reads test pattern into UUT.
4. Writes response pattern into DWG memory.
5. Reads memory into computers.

In reference to FIGS. 12 c (1) and (2) a reed-relay 215 driven by the $\overline{Q}$ output of D-type flip-flop 212 sets the test pin as "1" when energized (stimuli input to UUT) and "0" when de-energized (response output from UUT). A logic HIGH (3.4v typical) to the D-in side of 212 will be transferred to the Q-out side on the positive going transition of clock pulse $\overline{I/O}$. The $\overline{Q}$-out drops LOW (0.2v) resulting in a V of 4.8v, across the relay cord. The relay will energize, close the reed-relay contacts and connect line driver 214 to the test pin. The test pin interface is now configured as "1" (input to UUT). Conversely, programming the test pins as "0" requires a logic LOW to the D-in of 212. When the clock pulse appears, $\overline{Q}$ - out will go HIGH (3.4v). The resulting V (1.6v) will be insufficient to energize the relay, resulting in the contacts of reed-relay 215 remaining open. The test pin interface is now configured as "0".

There is a total of 240 Random Access Memory chips 199 in a DWG configured with 10 memory cards. For ease in programming, the 240 chips are divided into 20 groups (0 thru 19) of 2 groups per card. The first group consists of memory chips 1–12 and the second group, 13–24. Memory chips 1–12 are always considered as the lower group reference number. When a DWG-Extender is used in the digital test system, an additional 20 groups (20 through 39) must be considered when addressing a particular memory chip.

Two types of memory chips have been used in the DWG:
1. 256 — bit RAM
2. 1024 — bit RAM Each memory card has 24 identical chips and the type used for a specific card is a function of the test memory depth required. The 256 — bit memory chip is a fully decoded 256 bit Random Access Memory, organized 256 words x 1 bit. Bit selection is achieved by an 8 bit address ($PC_0$ - $PC_7$). With reference to FIGS. 12 c (1) and (2) and when the Write-computer ($\overline{WC}$) command is issued, the Write-enable ($\overline{WE}$) line to the memory chip drops LOW and strobes the data bit into the memory location specified.

If the 1024 memory is used the bit selection is achieved by using all the 10 bit addresses $PC_0$ - $PC_9$ rather than the eight aforementioned.

To read memory into UUT requires that $\overline{WE}$ be HIGH. This occurs when $\overline{WC}$ is HIGH. The data from the location address appears at the D-in Terminal of the stimulus register (D-type flip-flop 212). The data is transferred to the $\overline{Q}$-out, on the positive transition of clock pulse $\overline{S_1}/\overline{S_2}$ and into the line driver 214. The output signal is inverted and applied to the test pin interface via the I/O set relay (energies) in control means 215.

Since signal inversion occurs in the line driver 214, a logic HIGH to the UUT is stored as logic LOW, in memory.

For write response ($\overline{WR}$) a logic LOW applied to the D-in terminal of the P-register will result in $\overline{Q}$-out going HIGH during the positive transition of its clock pulse ($\overline{I/O_1}$). The I/O relay of control means is disengaged in this mode (relay 215 open) disconnecting the line driver from the test pin.

If the differential voltage between UUT response and the reference is positive, the line receiver output will be TTL LOW ( 0 ). Conversely if negative, output will be TTL HIGH (3.4v). The operating sequence is $\overline{R}$ transfers D in to Q out $\overline{I/O}$ selects in PC channel $\overline{WE}$ strobes dats into reserved location in memory. A logic HIGH response from the UUT is stored in memory as logic LOW.

The data for the 12 read lines to the computer ($\overline{DR0}$ - $\overline{DR11}$) is controlled by 24 buffer gates with 3-state outputs. A simplified schematic and truth table is shown below.

| | TRUTH TABLE 3-State Buffer | |
|---|---|---|
| A | C | Y |
| H | L | H |
| L | L | L |
| H | H | NO OUTPUT |
| L | H | NO OUTPUT |

Finally to recap there are four basic modes of operation of the DWG:
1. Normal
In the normal mode the DWG is loaded with pattern data. This data is bursted out to the UUT at a programmed frequency for the programmed test length. Response data is captured and stored in DWG memory and made available for subsequent computer analysis as called for.
2. Continuous
Same as normal mode except that the same pattern data is continuously recycled out to the UUT.
3. Gated
Same as the continuous mode except that each burst of patterns is followed by an equal time of pausing before transmitting the patterns again.
4. Handshake
Same as the normal mode except that after each stimulus pattern is transmitted the DWG waits for either an external flag from the UUT or a single step command from the computer before sampling response and transmitting the next pattern.

Having described an operative construction and logic for this digital word generator (DWG) it is now desired to set forth the intended protection for these Letters Patent by the appended claims:

I claim:

1. In a digital word generator, a control card module comprising:
   first means to receive input instructions and data bits from a source thereof, said means including a device to receive commands for a logic network to transmit command and flag signals to initiate and terminate a sequence of an operation scheduled by the source;
   second means connected to said first means and having decoder means for decoding computer instructions;
   read-write control means utilizing a plurality of serially related flip-flops, said read-write control means being operably connected and operatively connected to said decoder means;
   timing means operably connected to said first means, said timing means including an oscillator means driving a binary chain providing clock and timing sequence pulses and signals, respectively;
   a counter and control means for generating card select signals in accordance with signals from the read-write control means and timing means to which said counter and control means is connected;
   third means to be a buffer for data from the source and the decoder to deliver signals to an output connection;
   a fourth means to receive external signals and data processed by reason of the signals from the third means to interface externally generated signals and data with the control card module; and
   a data output means connected to said fourth means comprising a plurality of common clocked flip-flops that can be simultaneously loaded via a switching matrix to deliver data back to the source.

2. In a digital word generator according to claim 1 and further comprising a timing generator card module having:
   an oscillator circuit for synchronizing the timing of input to output pattern sampling with configuration and response logic;
   clock means connected to said internal/external oscillator circuit to generate clock pulses:
   a binary chain operably associated to take instructions and deliver signals of test length; and
   means to receive said clock pulses and signals of test length and provide output signals to said fourth means for the timing and integration of the digital word generator and computer.

3. The structure of claim 2 and further comprising a strobe generator to develop stimulus and response strobes.

4. In a digital word generator according to claim 2 and further comprising means connected to receive said output signals, data and instructions and provide pattern counter signals.

5. The structure of claim 4 and further comprising a strobe generator to develop stimulus and response strobes.

6. In a digital word generator according to claim 2 and further comprising a memory card module operable with control card module instructions and data in accordance with timing generator card module signals, said memory card module including:
  a dual differential line receiver for receiving data;
  a data selector/multiplexor connected so as to be operable with the logic of the dual differential line receiver;
  a random access memory means connected to receive the output of said data selector/multiplexor;
  a buffer gate for receiving the output of said random access memory means; flip-flop means connected to said random access memory means; and a gate driver connected to said flip-flop means.

7. The structure of claim 1 wherein said timing means is connected to said network to transmit command and flag signals so as to have its binary chain responsive thereto.

8. The structure of claim 1 wherein said network to transmit command and flag signals is connected to said second means to initiate decoding and instruction transmission from the second means.

9. The structure of claim 2 and further comprising means connecting to said oscillator circuit to develop free running clock pulses.

10. The structure of claim 9 including means to control said clock pulses to be functional in a handshake mode.

11. The structure of claim 10 wherein the means to develop free running clock pulses has connections for receipt of external clock pulses and flag control signals.

12. For a digital word generator having a means to sequence its functioning with a known frequency of operation and a plurality of memories for comparison of input to and output from a unit under test, a control means comprising:
  an input buffer means to accept data and instructions to programmably test a device;
  a timing means to generate a sequence of timing pulses, said timing means being operable by a command signal from said input buffer controlling a flag signal in terminating the sequence of timing pulses;
  instruction logic and decoder means connected to said input buffer and said timing means so as to provide a sequence of instructions during the sequence of timing pulses, said instructions being single word type;
  means to provide multi-word instructions, said means being operably and operatively related to said decoder means so as to provide write control, block-write control and block-read control instructions to control the memories;
  means to select specific memories operatively associated with said means to provide multi-word instructions; and
  means for storing data output from the memories.

13. The digital word generator of claim 12 and further characterized by a network of logic to take command signals and provide them and flag signals for termination of test procedures to the control means.

14. The digital word generator of claim 13 and further characterized by an oscillator being connected to the timing means to create clock signals and timing pulses with a counter means operatively related to the means to sequence its functioning.

15. The structure of claim 12 and further including gate means in said control means to operatively relate the means to sequence the digital word generator to the memories.

16. The digital word generator of claim 12 where the instruction logic and decoder means is inclusive of a plurality of decoders so as to process sixteen data bits into four instructions to address the memories and nine instructions for control of the means to sequence the functioning of the digital word generator.

17. For a digital word generator having a control card module and a memory card module, a timing generator module comprising:
  an input for data and instructions from the control card module; an oscillator circuit;
  a frequency counter operatively connected to the input and to the oscillator circuit;
  gate means connected to said frequency counter and the input, said gate means delivering clock pulses;
  pattern counter means connected to said input and said gate means;
  test length counter logic operatively connected to said gate means and said input to prescribe test length signals;
  a gate signal generator operatively connected to the input and the aforesaid test length counter logic to provide test gate signals on test execute instructions;
  a stimulus gate signal generator responsive to said gate signal generator, said stimulus gate signal generator being operably connected to said pattern counter means;
  a response gate signal generator operatively connected to the stimulus generator and operably connected to said pattern counter means;
  a strobe signal generator operatively connected to both said stimulus gate signal generator and said response gate signal generator; and
  output connections for said strobe signal generator and said pattern counter means for connection with the memory card module to control operation of same.

18. The digital word generator of claim 17 and further comprising a configuration register means operatively connected to said input and operably connected to said gate means and said gate signal generator to configure said timing generator module for normal, continuous, gated or handshake modes of operation.

19. The structure of claim 17 and further comprising external connections for said gate means to permit external clocking, commanding and terminating control of the timing generator.

20. The structure of claim 19 and further characterized by gate logic as part of said oscillator circuit for providing pulses to said frequency counter, said gate logic having provision for control by an external oscillator.

21. The structure of claim 17 and further comprising external connections for said gate means to permit external clocking, commanding and terminating control of the timing generator and further characterized by means in said stimulus generator to accept signals of an external stimulus gate.

22. The structure of claim 21 and further characterized by means in said response signal generator to accept signals of an external response gate.

23. The timing generator module of claim 17 wherein the output has means to provide to an extender unit the signals of the pattern counter means, and the strobe signal generator.

24. The digital word generator of claim 17 and further comprising external connections for said gate means to permit external clocking, commanding and flag control of the timing generator that is still further characterized by an external response gate means for said response gate signal generator.

25. The digital word generator of claim 17 wherein the control card module provides the data and instruction conduit for the timing generator module and said control card module comprises:
command-flag logic means for start and stop of the digital word generator;
a control timing sequencer means to provide clock pulses and timing signals, said control timing sequencer means having an oscillator and counter means;
an input buffer for data bits and instructions; and
an instruction and decoder logic means responsive to said control timing sequencer means for delivering single word instructions to the timing generator and memory card and multi-word instructions to the memory card.

26. The digital word generator of claim 17 wherein the memory card module comprises:
means to accept signals from said pattern counter means at a memory means to prescribe memory location desired;
a means to connect stimulus strobes to a stimulus flip-flop to strobe the output of the memory means;
a driver connected to said stimulus flip-flop to receive the output of the stimulus flip-flop;
a response flip-flop connected to the output of said timing generator module; and
a gate operatively connected to said response flip-flop and said control card module and operable by a single word instruction from said control card module to write into memory responses for delivery on call therefrom.

27. The digital word generator of claim 25 wherein the memory card module comprises;
means to accept signals from said pattern counter means at a memory means to prescribe memory location desired;
a means to connect stimulus strobes by a stimulus flip-flop to strobe the output of the memory means;
a driver connected to said stimulus flip-flop to receive the output of the stimulus flip-flop;
a response flip-flop operatively connected to the response strobe of the timing generator module's strobe generator; and
a gate operatively connected to said response flip-flop and said control card module instruction logic and decoder means to be operable by an instruction therefrom to write responses into memory means, said memory means being operatively connected to gating for memory commands of said control card module by logic means to provide write pulses for strobing of the memory means.

28. The structure of claim 26 and further characterized by a receiver means in said memory card module for providing data to said response flip-flop.

29. The structure of claim 27 and further comprising a receiver means in said memory card module for providing data to said response flip-flop.

30. The structure of claim 28 and further comprising a relay controlled output from and input to said memory card module which is operably connected to said driver, said output having a relay switch whose relay is controlled by input/output signals from said control card module.

31. For use with a control card module and a timing generator card module in a digital word generator, a memory card module comprising:
input means for data and instructions from said control card module as well as pattern counter, stimulus and response signals from said timing generator card module;
memory means receiving said pattern counter signals and instructions;
logic means responsive to said stimulus and response signals to strobe data to and from output drivers which are operative to deliver data to a unit under test and to a source for data and instructions via said control card;
and
means to control which of the memory means is to be operative, said means being operatively related to the logic means responsive to the response signals from the unit under test and inclusive of logic means to be operable per instructions from the control card module to gate data from the control card module via the memory means or data from the response means via the memory means.

32. The memory means of claim 31 and further comprising relay and control gating networks for the output drivers.

33. A digital word generator for use with apparatus to digitally test electronic units, said digital word generator comprising:
unit input and unit output means for connection with a unit under test, said means supplying data and instructions;
control logic for decoding said input means data and instructions and providing data words, instructions, clock and time pulses, particular pin addresses at specific pin locations on individual slots and data output signals;
a timing generator module connected to be commanded by said instructions of said control logic to strobe out said data of said control logic on precise pattern counts, stimulus signals, response signals and write signals; and
a network of memory logic supplying the control logic data words to a unit under test and subsequently circulating data words from a unit under test to provide the data output signals for the control logic, said network including logic responsive to the timing generator module to strobe appropriate stimulus and responses of a unit under test with portions of memory devices as determined by pin location logic under precise pattern counts.

34. The digital word generator of claim 33 characterized further in that the network of memory logic includes memory cards each wired to decode the same pin locations and inserted in slots for particular pin addresses.

35. The digital word generator of claim 33 wherein the network of memory logic is inclusive of storage means for response data for delivery as data output signals in accordance with programmed periods.

36. The digital word generator of claim 33 and further characterized such that it is capable of four particular modes of functioning — normal, continuous, gated and handshake — in that said timing generator module includes logic to provide a test gate signal that is up for another logic defined test length, said logic being capable of being up continously without regard to logic established test length with pattern count logic connected to be reset to zero at the end of each test length cycle, said test gate logic being also inclusive of means to permit alternating on and off over a programmed time, and said test gate logic being connected to execution logic, command logic and flag logic, and controllable by clock pulses synchronized with stimulus signals so as to step through a test one pattern at a time with logic that waits a programmed time to sample response signals.

* * * * *